US012573967B2

(12) United States Patent
Hayashiguchi

(10) Patent No.: US 12,573,967 B2
(45) Date of Patent: Mar. 10, 2026

(54) POWER CONVERSION DEVICE

(71) Applicant: ROHM CO., LTD., Kyoto (JP)

(72) Inventor: Masashi Hayashiguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 204 days.

(21) Appl. No.: 18/588,578

(22) Filed: Feb. 27, 2024

(65) Prior Publication Data

US 2024/0204685 A1    Jun. 20, 2024

Related U.S. Application Data

(63) Continuation of application No. PCT/JP2022/037822, filed on Oct. 11, 2022.

(30) Foreign Application Priority Data

Oct. 26, 2021    (JP) ................................. 2021-174748

(51) Int. Cl.
$H02M$ 7/537       (2006.01)
$H01L$ 23/495      (2006.01)
$H02M$ 7/00        (2006.01)

(52) U.S. Cl.
CPC ...... *H02M 7/537* (2013.01); *H01L 23/49541* (2013.01); *H02M 7/003* (2013.01)

(58) Field of Classification Search
CPC .. H02M 7/003; H02M 7/537; H01L 23/49541
See application file for complete search history.

(56) References Cited

U.S. PATENT DOCUMENTS

| | | | | |
|---|---|---|---|---|
| 8,422,244 B2 * | 4/2013 | Azuma | .................... | B60L 50/61 |
| | | | | 361/752 |
| 10,600,764 B2 * | 3/2020 | Hayashi | ................. | H01L 25/07 |
| 2014/0118909 A1 * | 5/2014 | Matsuno | ............... | H02M 7/003 |
| | | | | 361/679.01 |
| 2021/0126546 A1 | 4/2021 | Sperber et al. | | |
| 2023/0245960 A1 * | 8/2023 | Hayashi | ............ | H01L 23/49575 |

FOREIGN PATENT DOCUMENTS

| | | | |
|---|---|---|---|
| JP | 2010-104204 A | 5/2010 |
| JP | 2012-507979 A | 3/2012 |
| JP | 2015-220382 A | 12/2015 |
| JP | 2016-163498 A | 9/2016 |

OTHER PUBLICATIONS

International Search Report issued in International Application No. PCT/JP2022/037822, Dec. 27, 2022 (2 pages).
Written Opinion issued in International Application No. PCT/JP2022/037822, Dec. 27, 2022 (3 pages).

* cited by examiner

*Primary Examiner* — Adolf D Berhane
(74) *Attorney, Agent, or Firm* — HSML P.C.

(57)    ABSTRACT
The power conversion device includes a first semiconductor module, a second semiconductor module, a third semiconductor module, and a capacitor module. As viewed in a z direction, the first center line of the first semiconductor module, the second center line of the second semiconductor module, and the third center line of the third semiconductor module intersect the capacitor body. The first angle formed by the first center line and the second center line and the second angle formed by the second center line and the third center line are equal to each other. The lengths of the first busbar, the second busbar and the third busbar are equal to each other.

17 Claims, 26 Drawing Sheets

POWER CONVERSION DEVICE

TECHNICAL FIELD

The present disclosure relates to a power conversion device.

BACKGROUND ART

Semiconductor modules with power switching elements such as MOSFETs (Metal Oxide Semiconductor Field Effect Transistors) and IGBTs (Insulated Gate Bipolar Transistors) are conventionally known. Such semiconductor modules are mounted in a variety of electronic devices including industrial equipment, home appliances, information terminals, and automobile equipment. JP-A-2015-220382 discloses a conventional semiconductor module (power module).

DETAILED DESCRIPTION OF EMBODIMENTS

The following describes preferred embodiments of a semiconductor module according to the present disclosure with reference to the drawings. In the description given below, the same or similar elements are denoted by the same reference signs, and the descriptions thereof will be omitted.

First Embodiment

Figure 1:
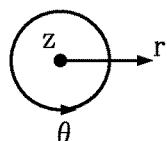
FIG. 1 is a plan view of a power conversion device according to a first embodiment.
Figure 2:
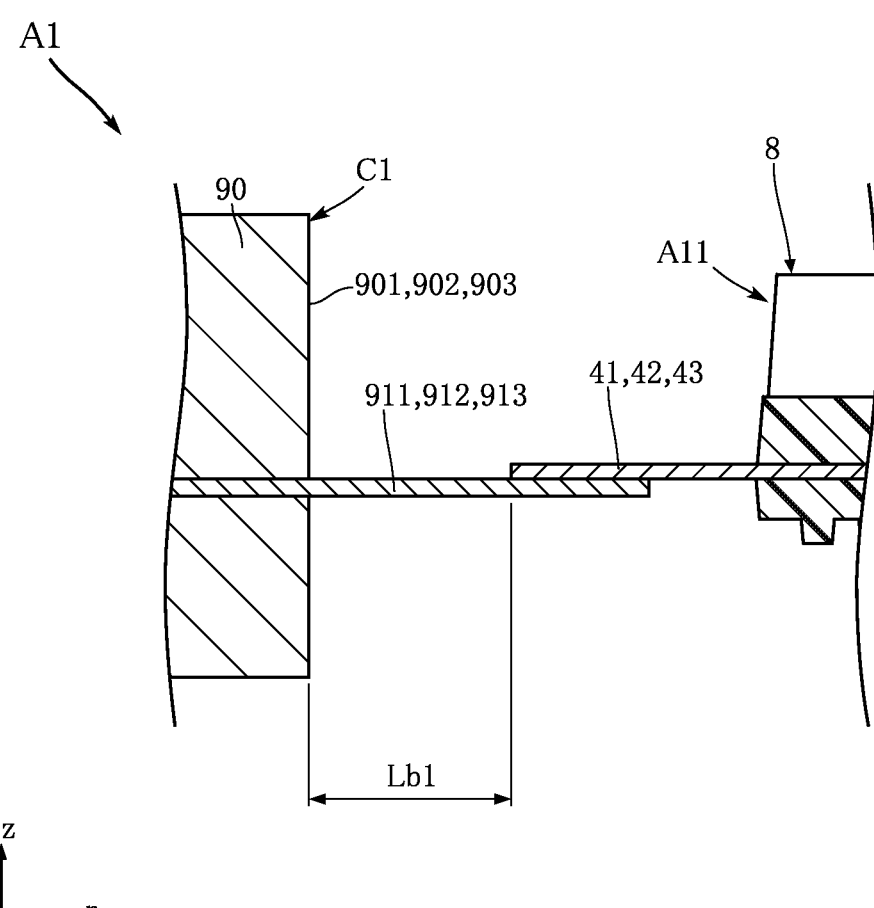
FIG. 2 is a schematic enlarged sectional view taken along line II-II in FIG. 1.

FIGS. 1 and 2 show a power conversion device according to a first embodiment of the present disclosure. The power conversion device B1 according to the present embodiment includes a first semiconductor module A11, a second semiconductor module A12, a third semiconductor module A13, and a capacitor module C1. The functions and applications of the power conversion device of present disclosure are not limited in any way. The power conversion device B1 of the present embodiment is configured as a so-called inverter.

In the figures, the z direction is an example of the "axial direction", the x direction is an example of the "radial direction", and the θ direction is an example of the "circumferential direction".

Capacitor Module C1:

The capacitor module C1 functions as, for example, a smoothing capacitor provided in a power supply circuit for the first semiconductor module A11, the second semiconductor module A12, and the third semiconductor module A13. The capacitor module C1 according to the present embodiment has a capacitor body 90, a plurality of first busbars 911, 912 and 913, a plurality of second busbars 921, 922 and 923, and a plurality of third busbars 931, 932, and 933.

The capacitor body is a part that performs the function as a capacitor of the capacitor module C1. The specific configuration of the capacitor body 90 is not limited in any way. The capacitor body 90 includes, for example, a capacitor element (not shown) and a wiring conductor (not shown) as appropriate. The type and structure of the capacitor element are not limited in any way, and various known capacitor elements can be used. The center point Oz in the figure is the center of the capacitor body 90 as viewed in the z direction. The center point Oz may be the geometric center of the capacitor body 90 as viewed in the z direction, or may be the center of gravity.

The capacitor body 90 of the present embodiment includes a first surface 901, a second surface 902, and a third surface 903. The first surface 901 is a surface orthogonal to a center line OL1, described later. The second surface 902 is a surface orthogonal to a center line OL2, described later. The third surface 903 is a surface orthogonal to a center line OL3, described later. The angles formed by the first surface 901, the second surface 902 and the third surface 903 are not limited. In the illustrated example, the angle formed by the first surface 901 and the second surface 902 is 45°. Also, the angle formed by the second surface 902 and the third surface 903 is 45°. In the illustrated example, the first surface 901, the second surface 902 and the third surface 903 are orthogonal to a radial line passing through the center point Oz and extending in an r direction. The first surface 901, the second surface 902, and the third surface 903 are located next to each other.

The first busbars 911, 912 and 913, the second busbars 921, 922 and 923, and the third busbars 931, 932 and 933 are for connection to the first semiconductor module A11, the second semiconductor module A12, and the third semiconductor module A13, respectively, and electrically connected to the capacitor element.

The first busbars 911, 912 and 913 protrude from the first surface 901 in an r direction as viewed in the z direction. As viewed in the z direction, the first busbar 912 and the first busbar 913 are located apart from each other with the first busbar 911 interposed therebetween in the θ direction.

The second busbars 921, 922 and 923 protrude from the second surface 902 in an r direction as viewed in the z direction. As viewed in the z direction, the second busbar 922 and the second busbar 923 are located apart from each other with the second busbar 921 interposed therebetween in the θ direction.

The third busbars 931, 932 and 933 protrude from the third surface 903 in an r direction as viewed in the z direction. As viewed in the z direction, the third busbar 932 and the third busbar 933 are located apart from each other with the third busbar 931 interposed therebetween in the θ direction.

Each of the first semiconductor module A11, the second semiconductor module A12 and the third semiconductor module A13 includes a plurality of input terminals 41, 42 and 43, a plurality of output terminals 44, a plurality of control terminals 45, and a sealing resin 8. Examples of specific configurations of the input terminals 41, 42 and 43, the output terminals 44, the control terminals 45, and the sealing resin 8 will be described later. The input terminals 41, 42 and 43 protrude from the sealing resin 8 toward one side in an r direction. The output terminals 44 protrude from the sealing resin 8 toward the other side in the r direction. The control terminals 45 protrude from the sealing resin 8 in the z direction.

The input terminal 41 of the first semiconductor module A11 is connected to the first busbar 911, the input terminal 42 to the first busbar 912, and the input terminal 43 to the first busbar 913. The input terminal 41 of the second semiconductor module A12 is connected to the second busbar 921, the input terminal 42 to the second busbar 922, and the input terminal 43 to the second busbar 923. The input terminal 41 of the third semiconductor module A13 is connected to the third busbar 931, the input terminal 42 to the third busbar 932, and the input terminal 43 to the third busbar 933. The method for connecting these input terminals and the busbars is not limited in any way, and various known methods may be used, including fastening using a bolt or the like, bonding using bonding material or through welding, engagement, and fitting, for example.

The center line OL1 is the center line of the first semiconductor module A11 as viewed in the z direction. The center line OL1 may pass through the geometric center or center of gravity of the sealing resin 8 of the first semiconductor module A11 and extend in the direction in which the input terminals 41, 42 and 43 protrude. The center line OL2 is the center line of the second semiconductor module A12 as viewed in the z direction. The center line OL2 may pass through the geometric center or center of gravity of the sealing resin 8 of the second semiconductor module A12 and extend in the direction in which the input terminals 41, 42 and 43 protrude. The center line OL3 is the center line of the third semiconductor module A13 as viewed in the z direction. The center line OL3 may pass through the geometric center or center of gravity of the sealing resin 8 of the third semiconductor module A13 and extend in the direction in which the input terminals 41, 43 and 43 protrude.

The first angle $\alpha 1$ in the figures is the angle formed by the center line OL1 and the center line OL2 as viewed in the z direction. The second angle $\alpha 2$ is the angle formed by the center line OL2 and the center line OL3 as viewed in the z direction. The first angle $\alpha 1$ and the second angle $\alpha 2$ are equal to each other. In the illustrated example, the first angle $\alpha 1$ and the second angle $\alpha 2$ are 45°. In this case, the first semiconductor module A11, the second semiconductor module A12 and the third semiconductor module A13 are arranged in a biased manner (arrangement that is not line symmetrical or point symmetrical as viewed in the z direction) with respect to the capacitor body 90.

The center line OL1, the center line OL2 and the center line OL3 are parallel to an r direction as viewed in the z direction and contained in a plane orthogonal to the z direction. The center line OL1, the center line OL2 and the center line OL3 may be inclined with respect to a plane orthogonal to the z direction.

The center line OL1, the center line OL2 and the center line OL3 intersect the capacitor body 90. In the illustrated example, the center line OL1, the center line OL2 and the center line OL3 intersect with each other at an intersection Cp. The intersection Cp is inside the capacitor body 90 as viewed in the z direction. In the illustrated example, the intersection Cp coincides with the center point Oz.

The length Lb1 of the first busbars 911, 912 and 913, the length Lb2 of the second busbars 921, 922 and 923, and the length Lb3 of the third busbars 931, 932 and 933 are equal to each other. Herein, as shown in FIG. 2, the length Lb1 is defined as the length in an r direction of the portion of each first busbar 911, 912 and 913 that protrudes from the capacitor body 90 and does not overlap with the input terminal 41, 42 or 43. However, the length Lb1 may be defined as the length of the portion of each first busbar 911, 912 and 913 that protrudes from the capacitor body 90. Alternatively, the length Lb1 may be defined as the length in an r direction of a combined body made up of the portion of each first busbar 911, 912 and 913 that protrudes from the capacitor body 90 and the portion of each input terminals 41, 42 and 43 that protrudes from the sealing resin 8 (i.e., the distance between the capacitor body 90 and the sealing resin 8 in the r direction). These definitions hold for the length Lb2 and the length Lb3 as well.

Semiconductor Module A1:

FIGS. 3 to 22 show an example of a configuration of a semiconductor module A1 used for the power conversion device B1. The semiconductor module A1 corresponds to each of the first semiconductor module A11, the second semiconductor module A12, and the third semiconductor module A13. In the present embodiment, each of the first semiconductor module A11, the second semiconductor module A12 and the third semiconductor module A13 has the same configuration as that of the semiconductor module A1 described below. However, the configurations of the first semiconductor module A11, the second semiconductor module A12 and the third semiconductor module A13 may differ from each other. Also, the specific configurations of the first semiconductor module A11, the second semiconductor module A12 and the third semiconductor module A13 are not limited in any way, and the configuration described below is merely an example.

The semiconductor module A1 includes a plurality of semiconductor elements 10, a conductive substrate 2, a support substrate 3, a plurality of input terminals 41 to 43, a plurality of output terminals 44, a plurality of control terminals 45, a control terminal support 5, a conductive member 6, first conductive bonding materials 71, second conductive bonding materials 72, a plurality of wires 731 to 735, a sealing resin 8, resin parts 87, and a resin fill portion 88.

Figure 3:
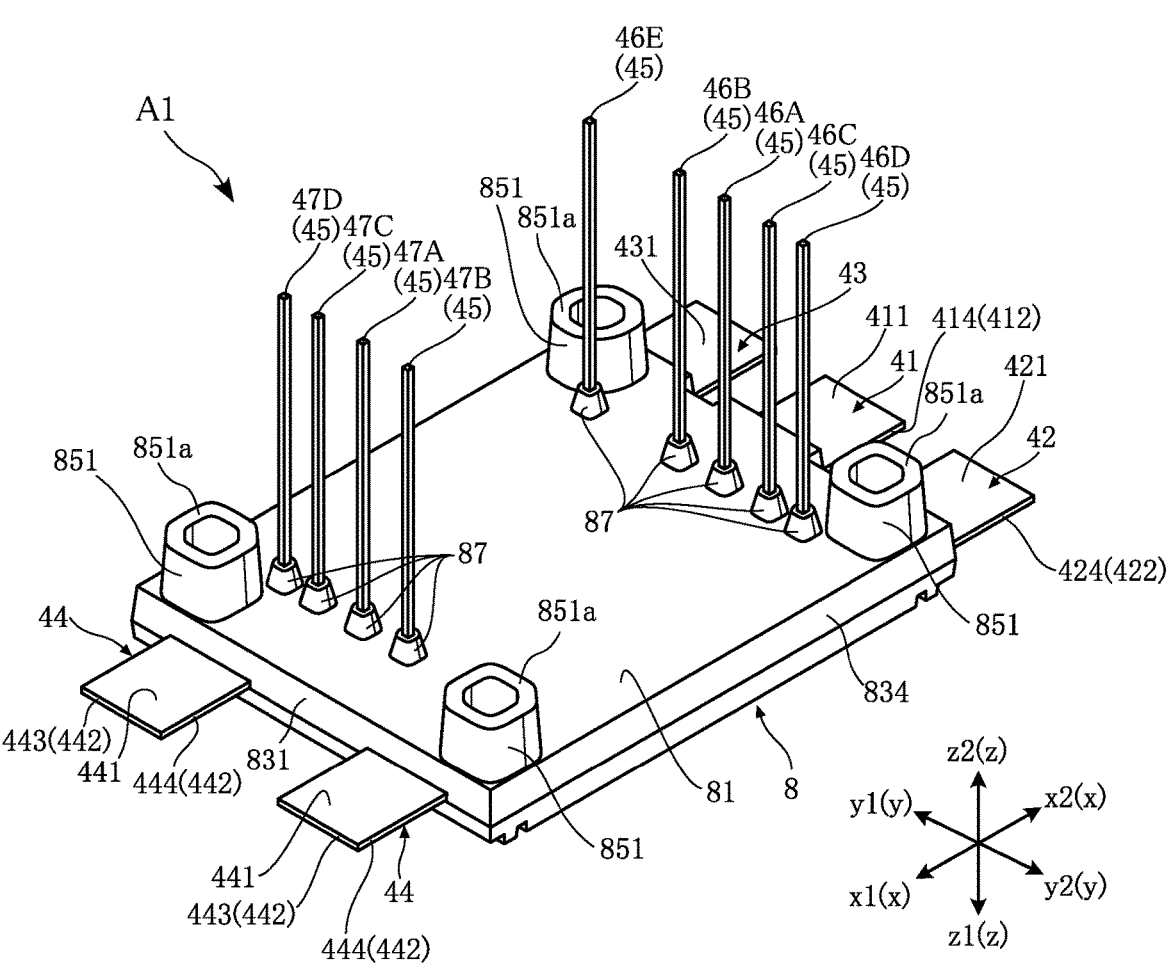
FIG. 3 is a perspective view of a semiconductor module according to the first embodiment.
Figure 4:
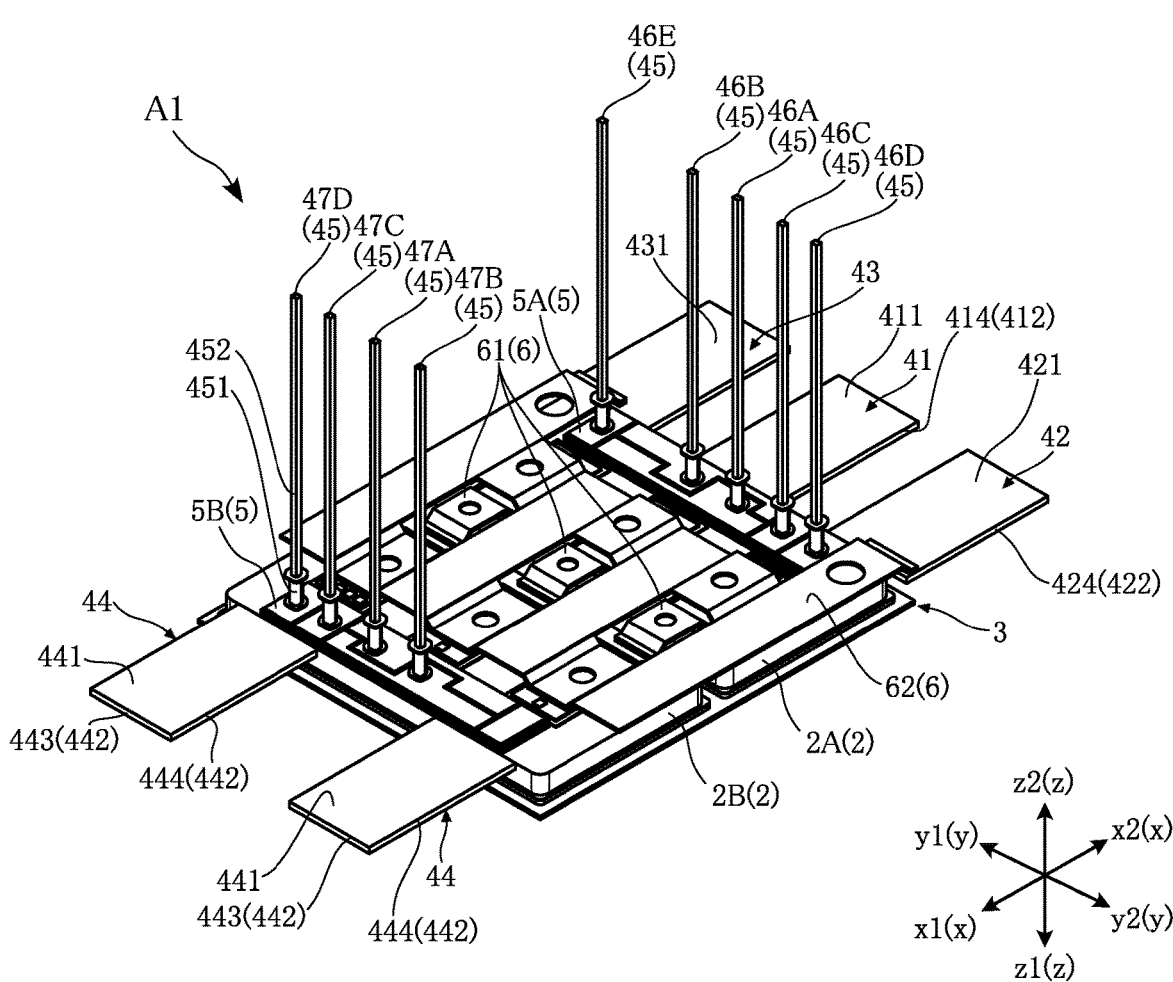
FIG. 4 is a perspective view corresponding to FIG. 3, from which a sealing resin, resin parts, and a resin fill portion are omitted.
Figure 5:
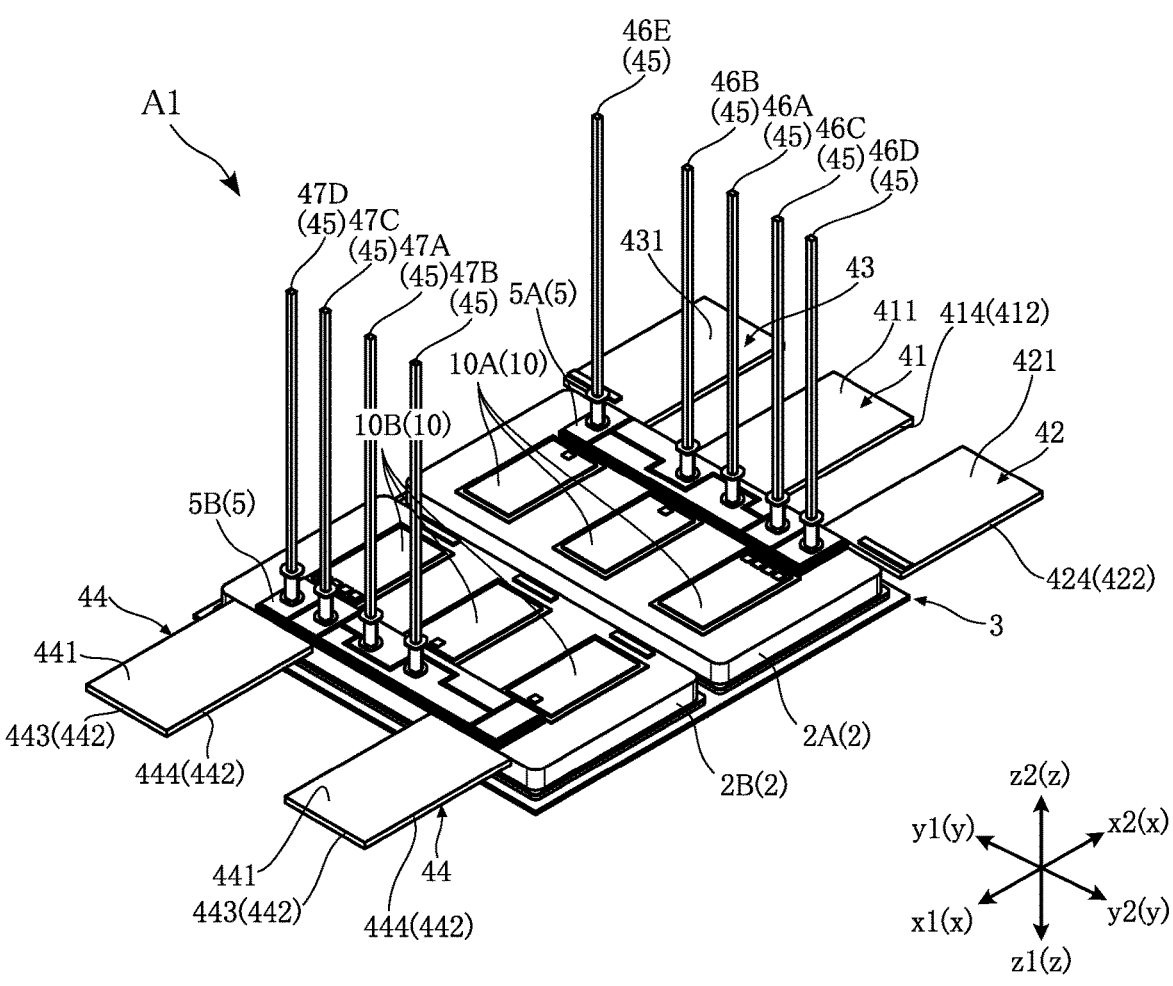
FIG. 5 is a perspective view corresponding to FIG. 4, from which a conductive member is omitted.
Figure 6:
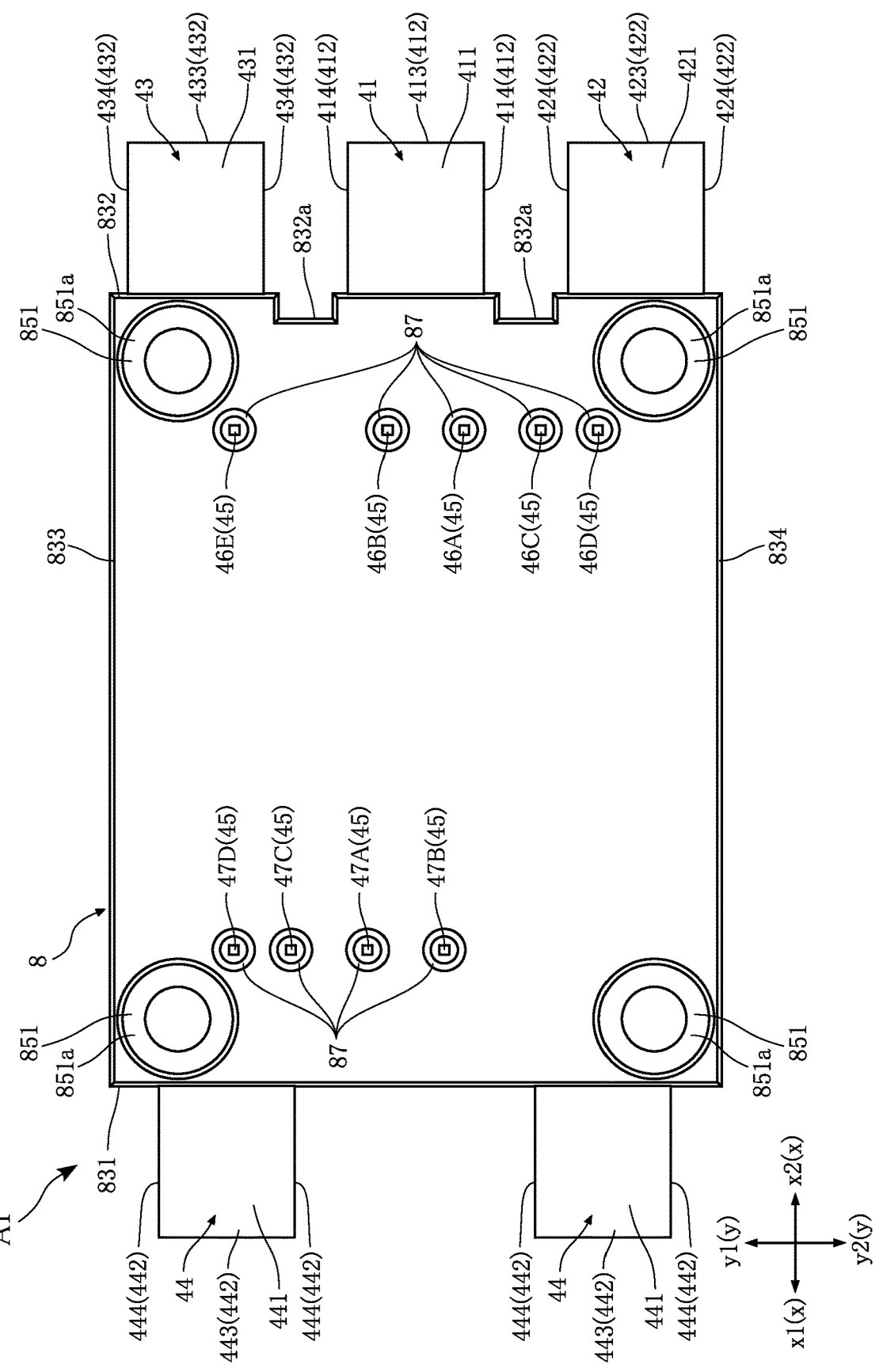
FIG. 6 is a plan view of a semiconductor module according to the first embodiment.
Figure 7:
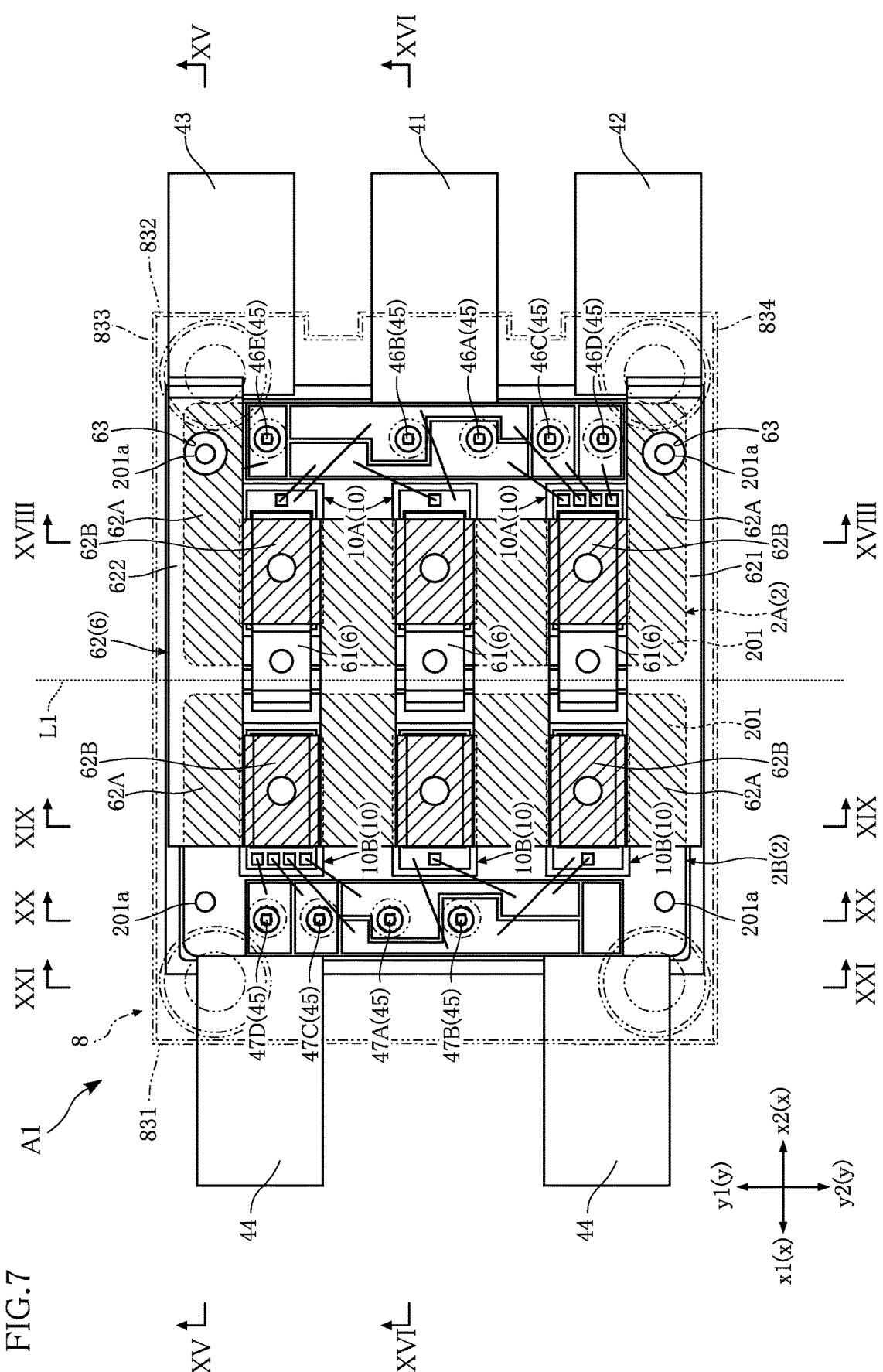
FIG. 7 is a plan view corresponding to FIG. 6, in which the sealing resin, the resin parts, and the resin fill portion are indicated by imaginary lines.
Figure 8:
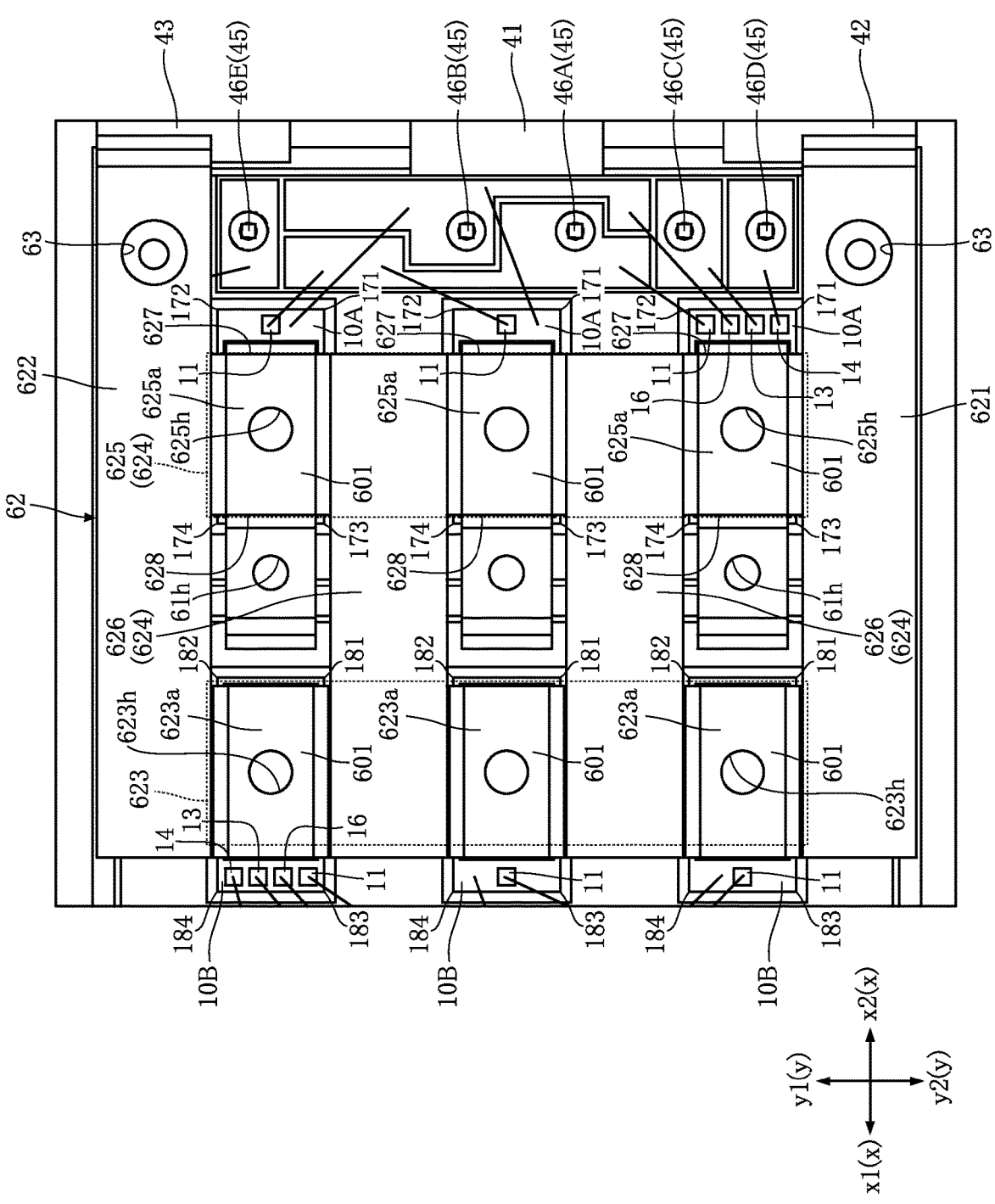
FIG. 8 is an enlarged view of a part of FIG. 7, from which imaginary lines of the sealing resin, the resin parts, and the resin fill portion are omitted.
Figure 9:
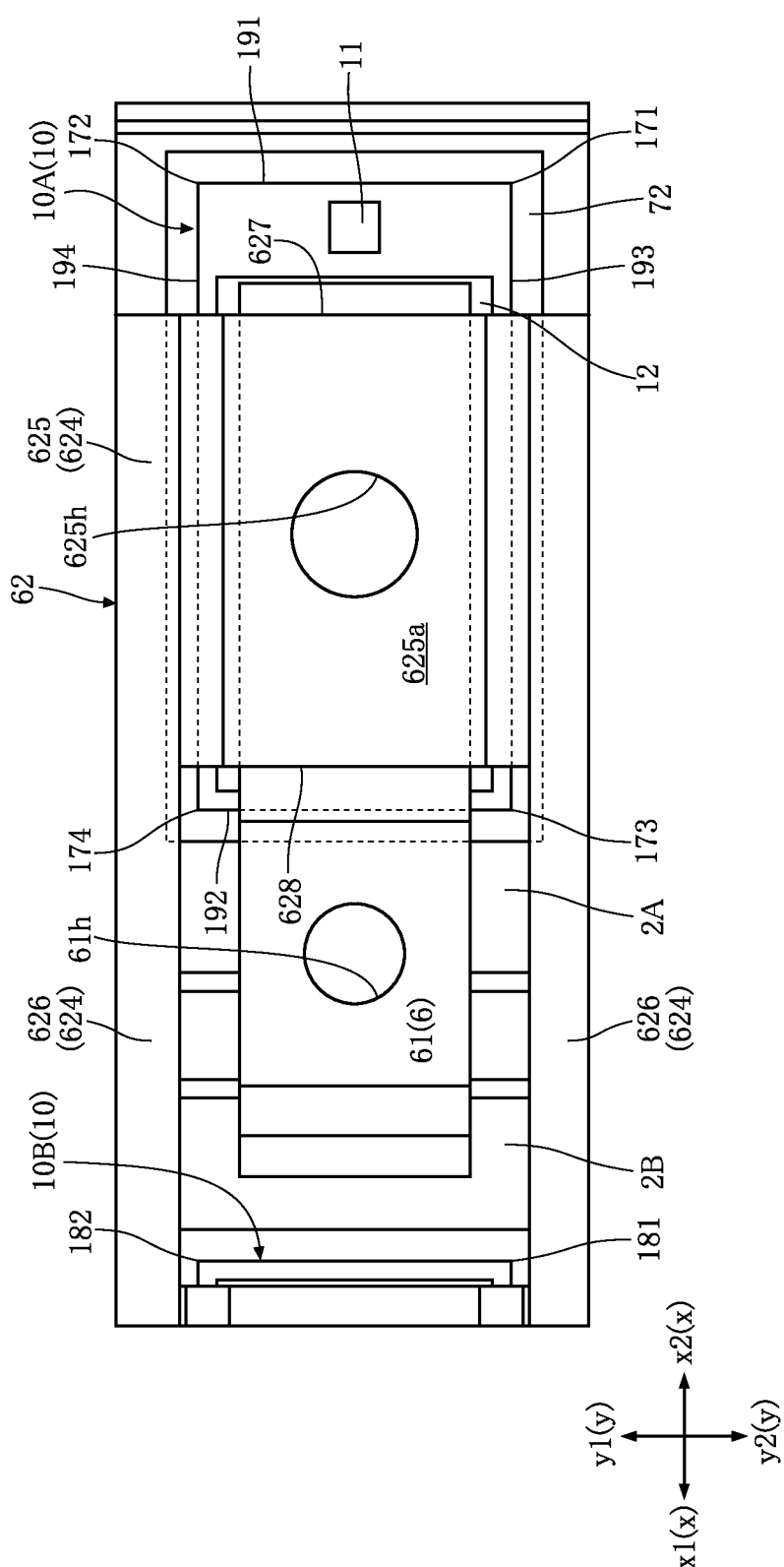
FIG. 9 is an enlarged view of a part of FIG. 8.
Figure 10:
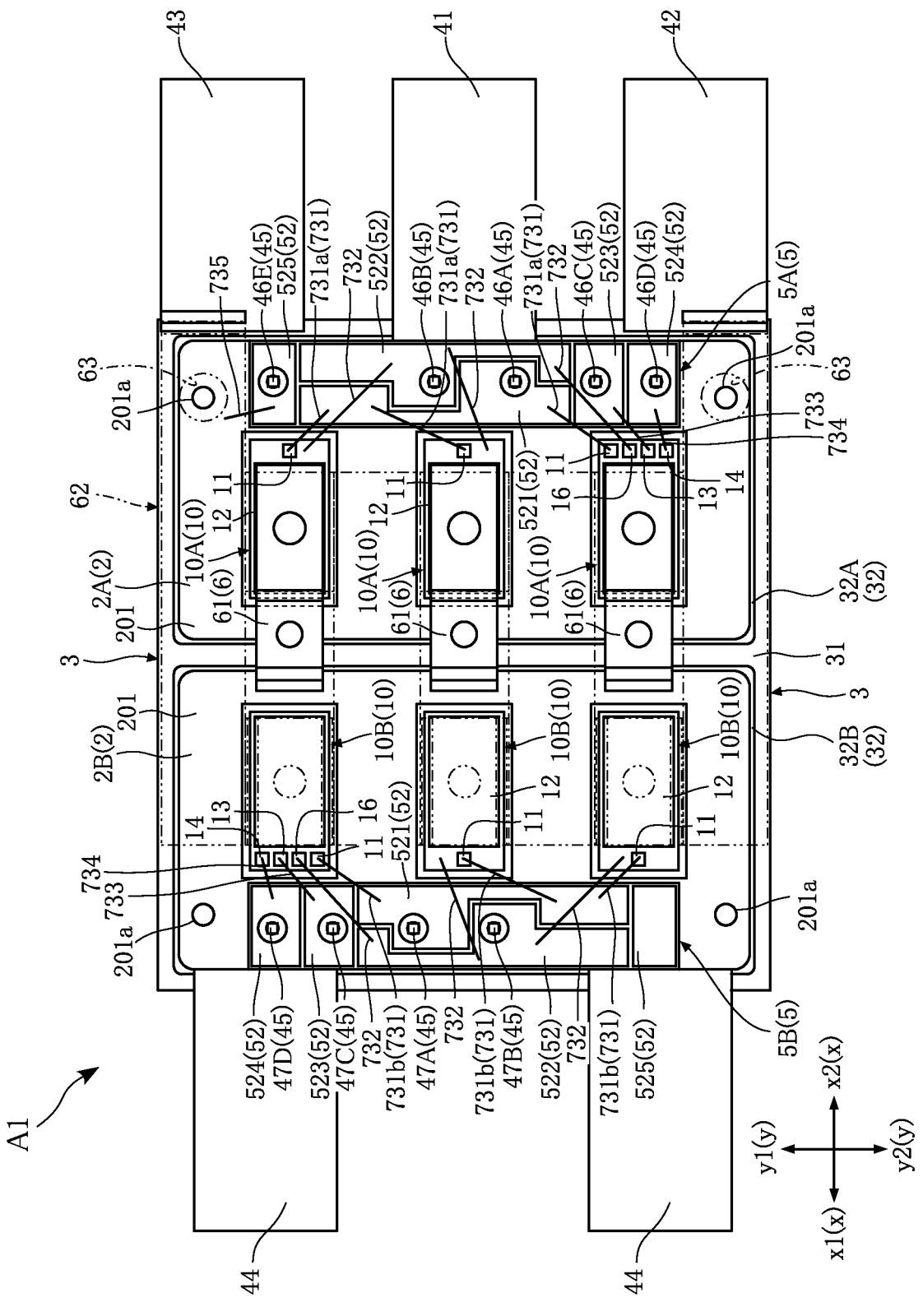
FIG. 10 is a plan view corresponding to FIG. 7, in which a part of the conductive member is indicated by imaginary lines.
Figure 11:
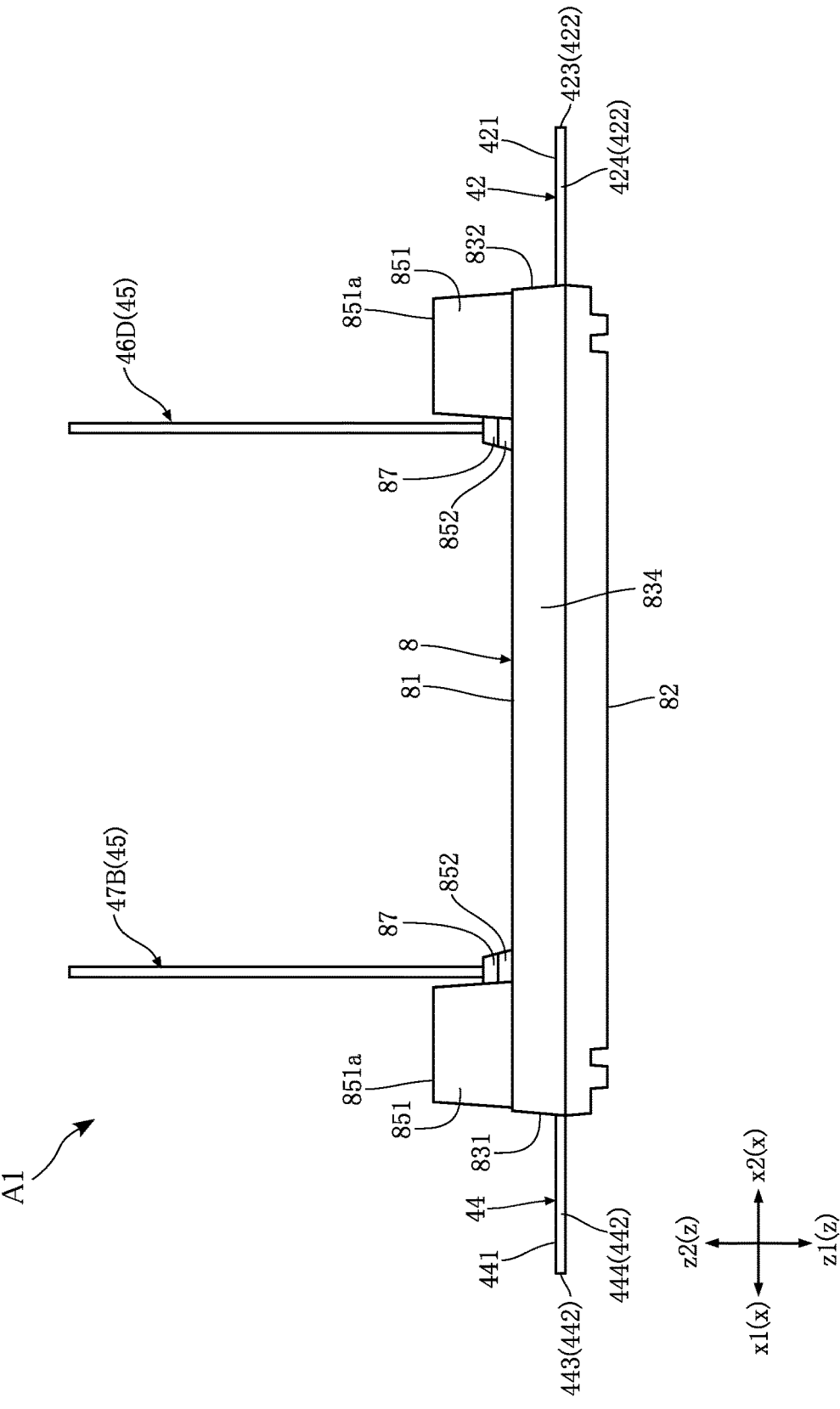
FIG. 11 is a front view of the semiconductor module according to the first embodiment.
Figure 12:
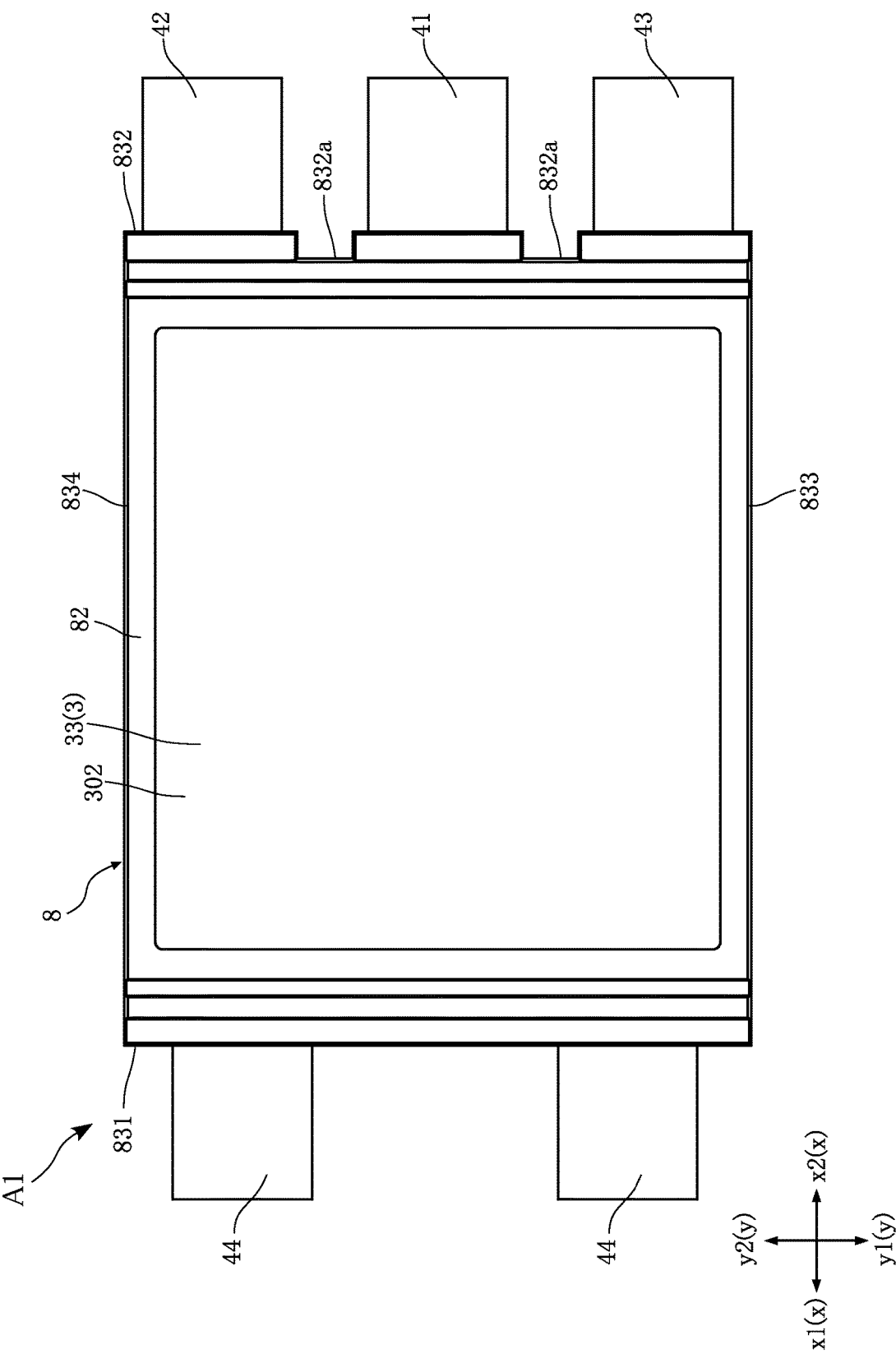
FIG. 12 is a bottom view of the semiconductor module according to the first embodiment.
Figure 13:
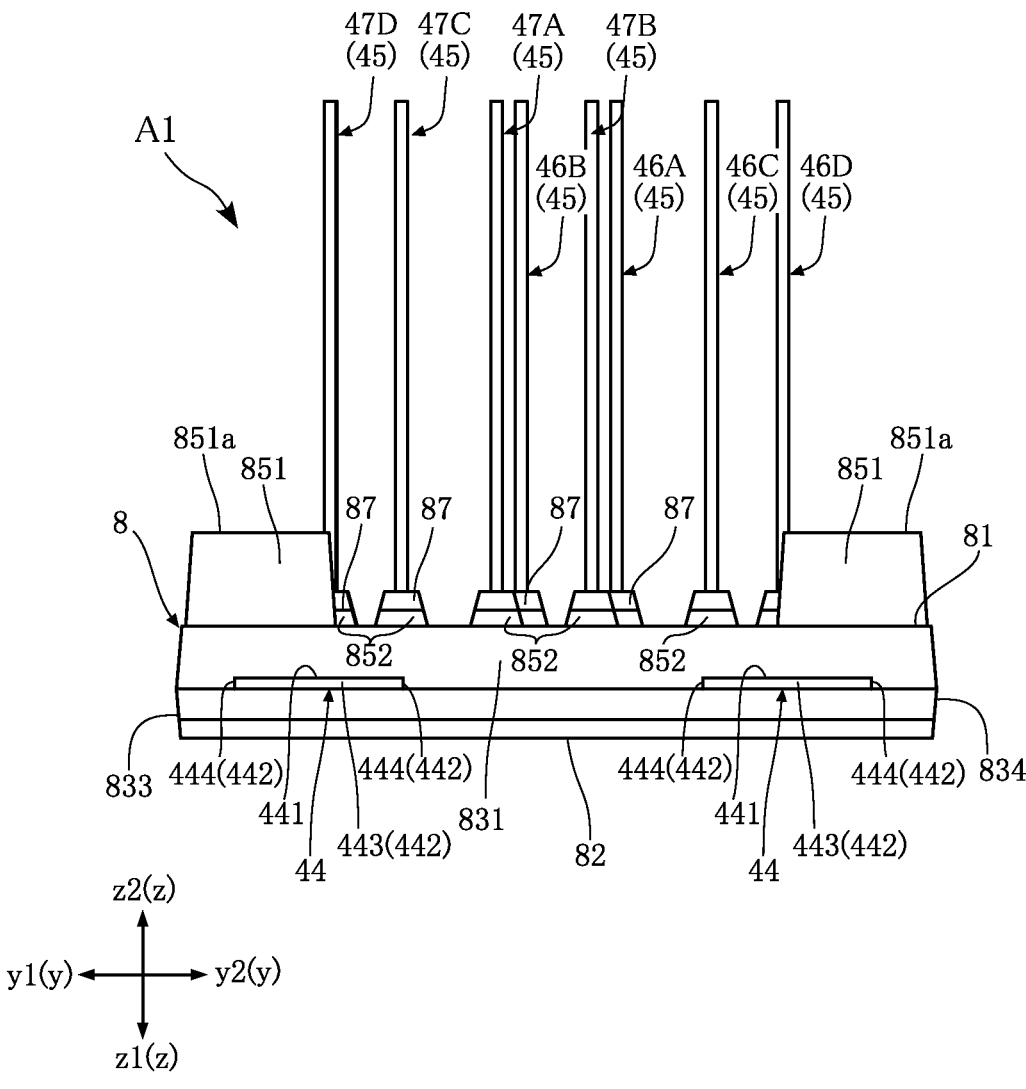
FIG. 13 is a left side view of the semiconductor module according to the first embodiment.
Figure 14:
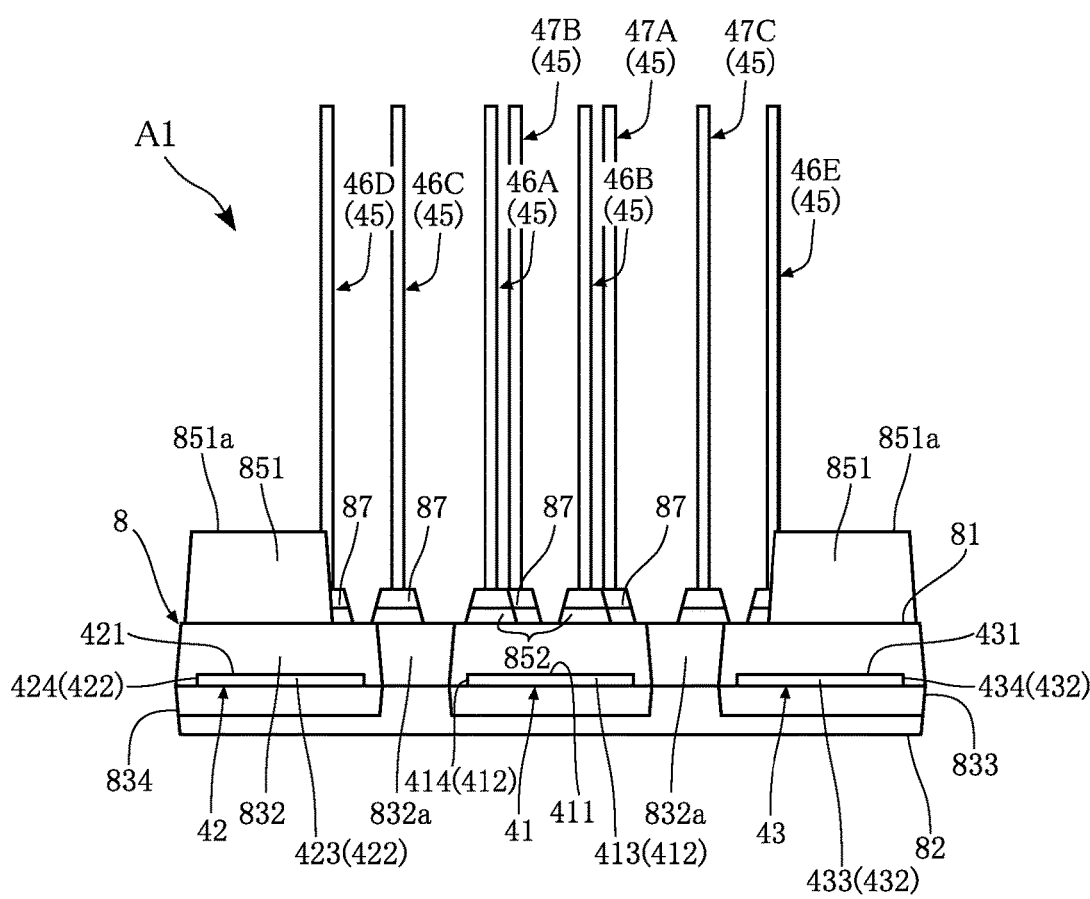
FIG. 14 is a right side view of the semiconductor module according to the first embodiment.
Figure 14:
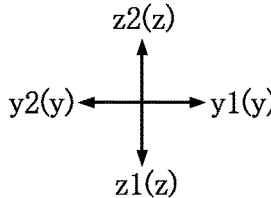
Figure 15:
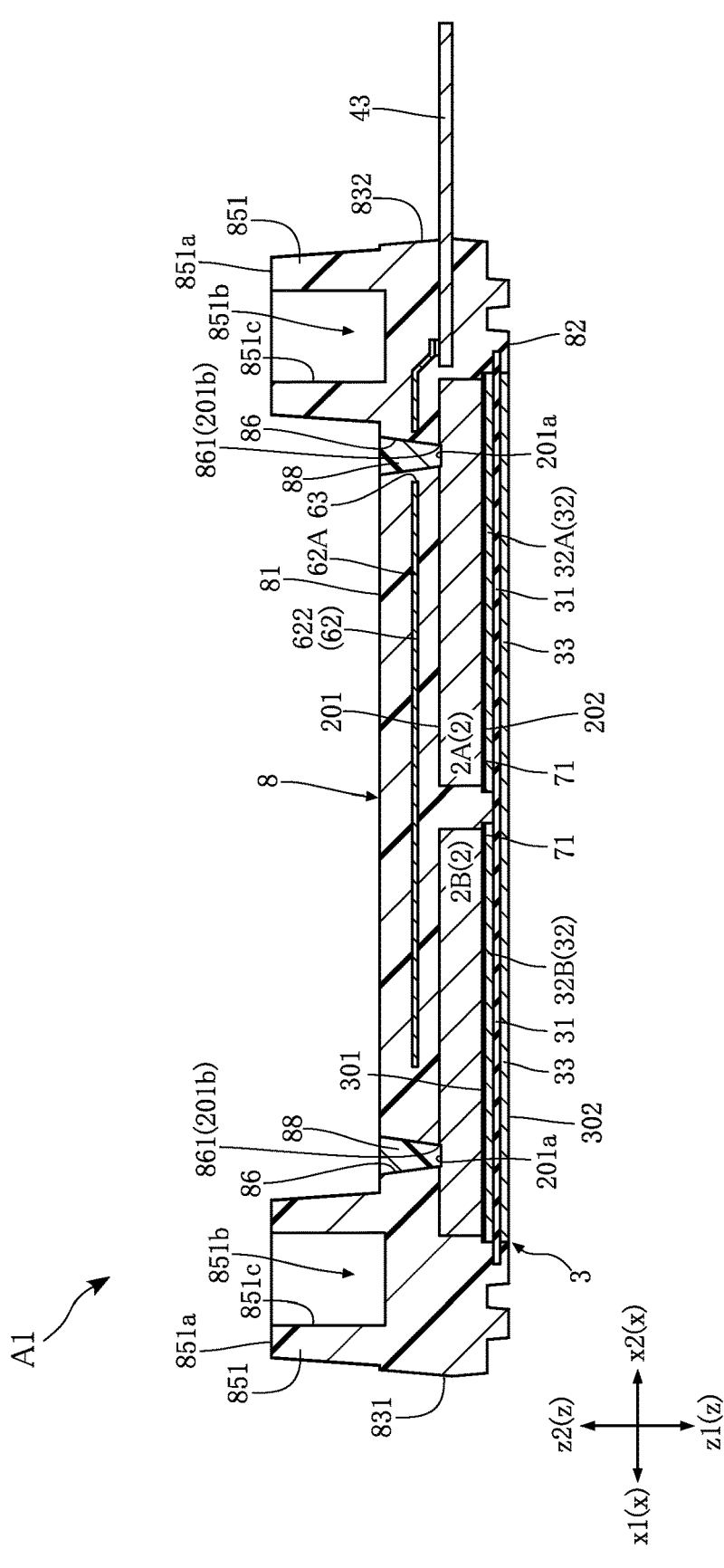
FIG. 15 is a sectional view taken along line XV-XV in FIG. 7.
Figure 16:
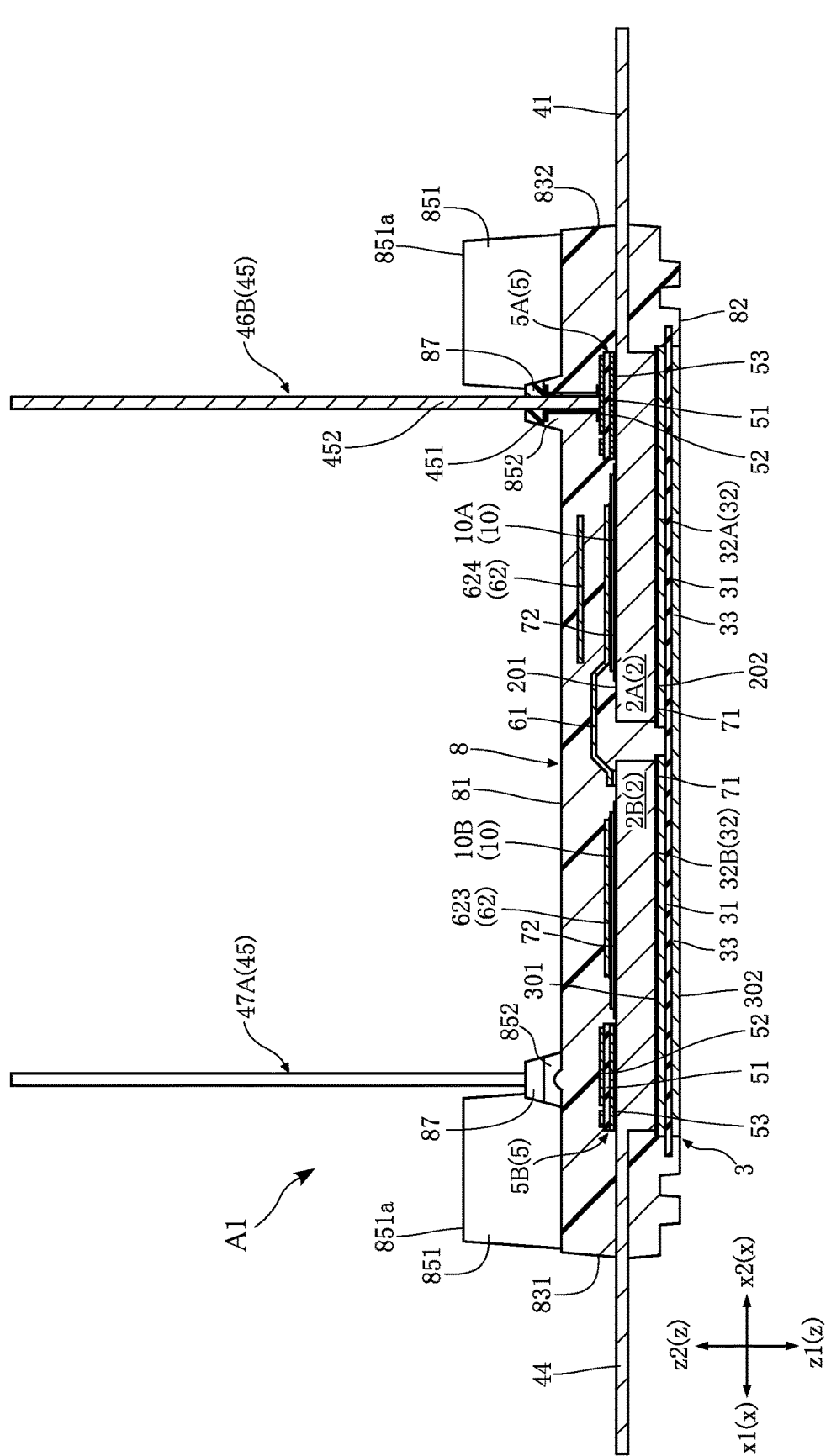
FIG. 16 is a sectional view taken along line XVI-XVI in FIG. 7.
Figure 17:
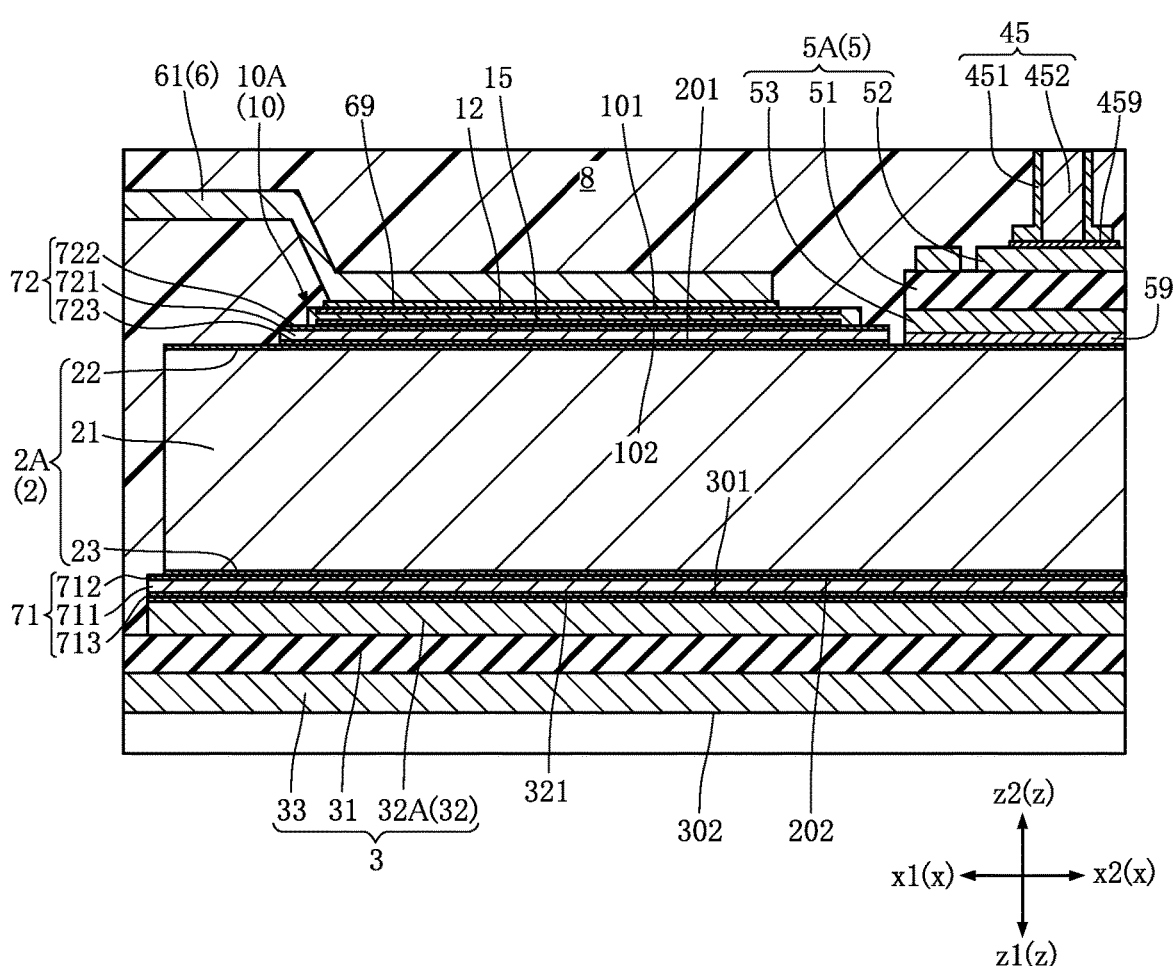
FIG. 17 is an enlarged view of a part of FIG. 16.
Figure 18:
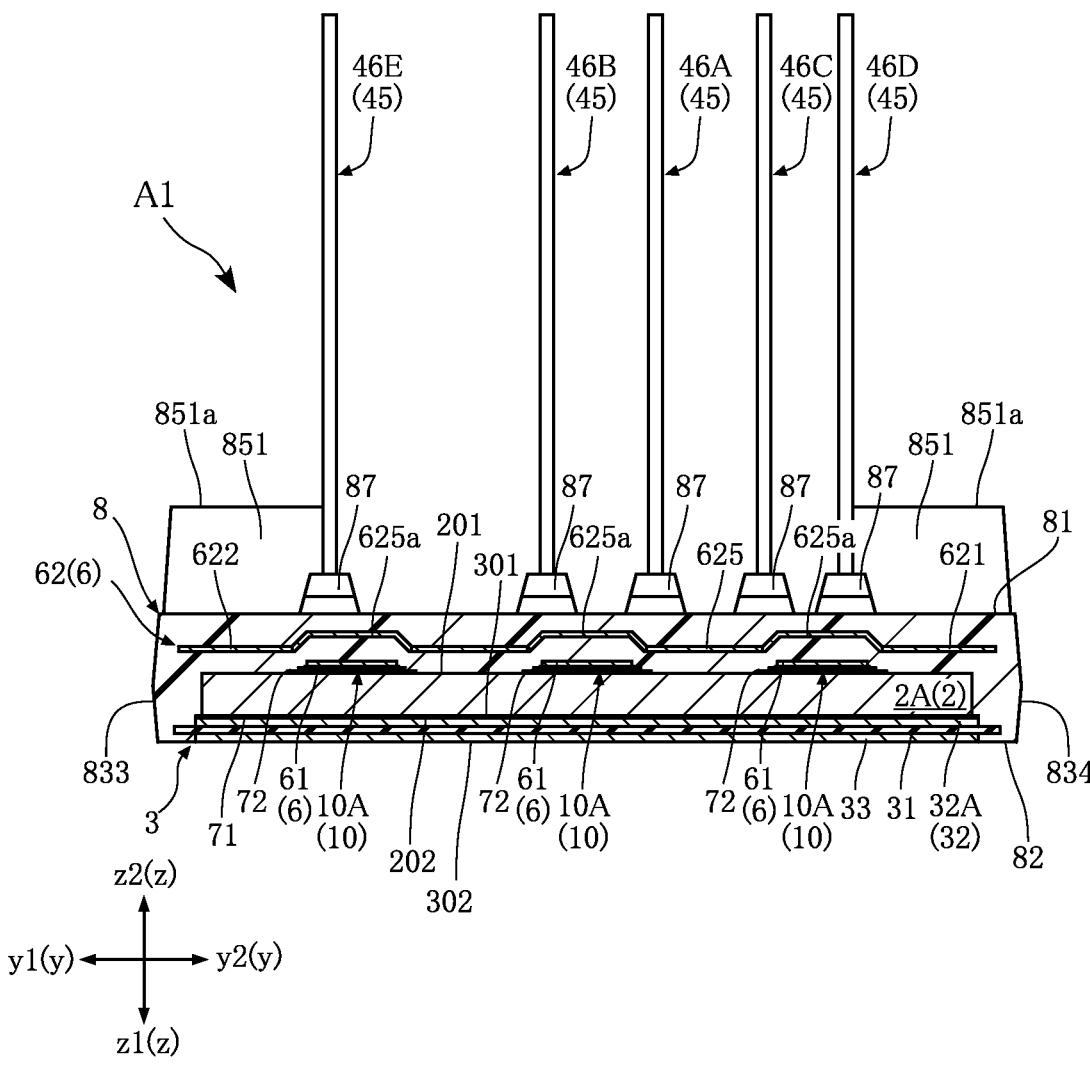
FIG. 18 is a sectional view taken along line XVIII-XVIII in FIG. 7.
Figure 19:
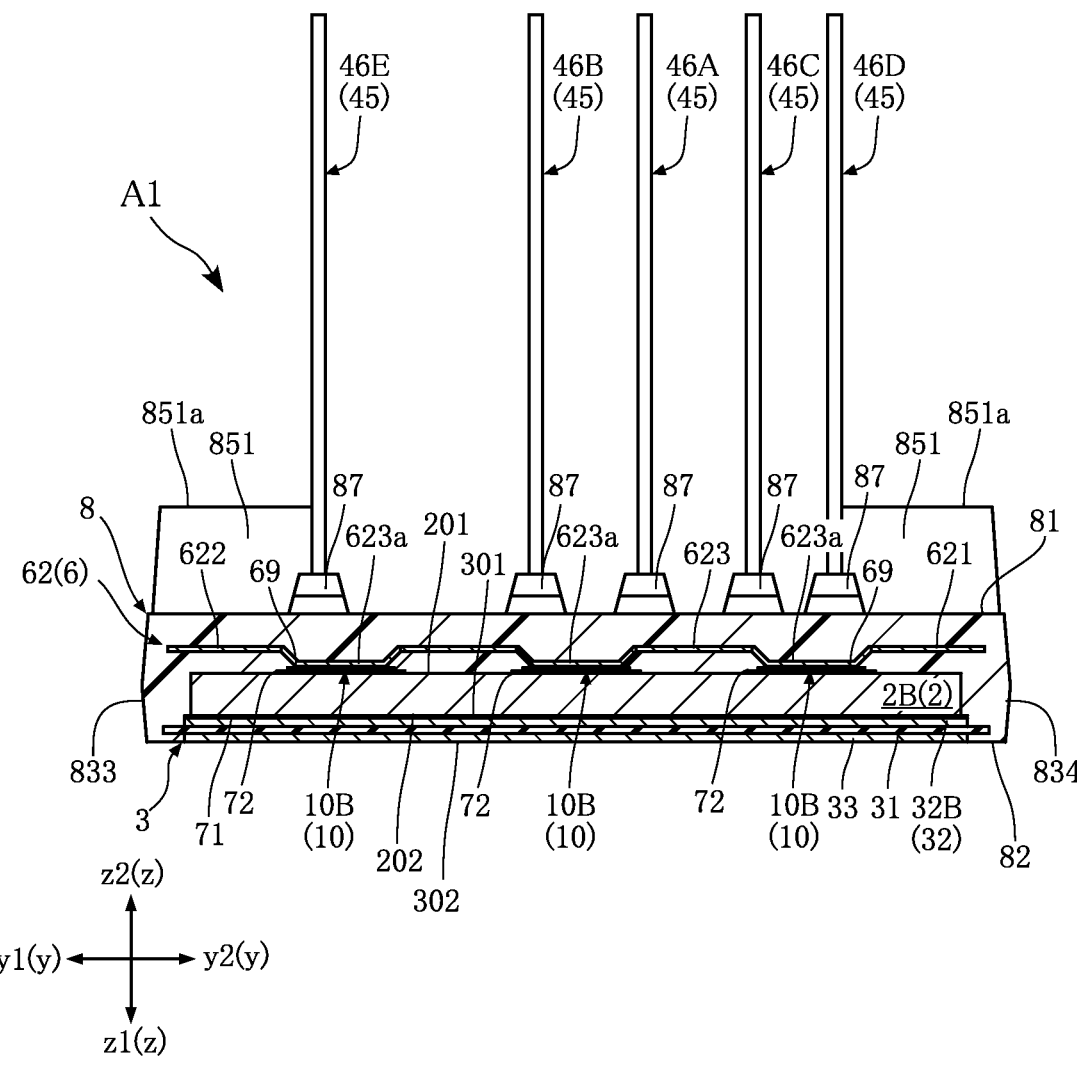
FIG. 19 is a sectional view taken along line XIX-XIX in FIG. 7.
Figure 20:
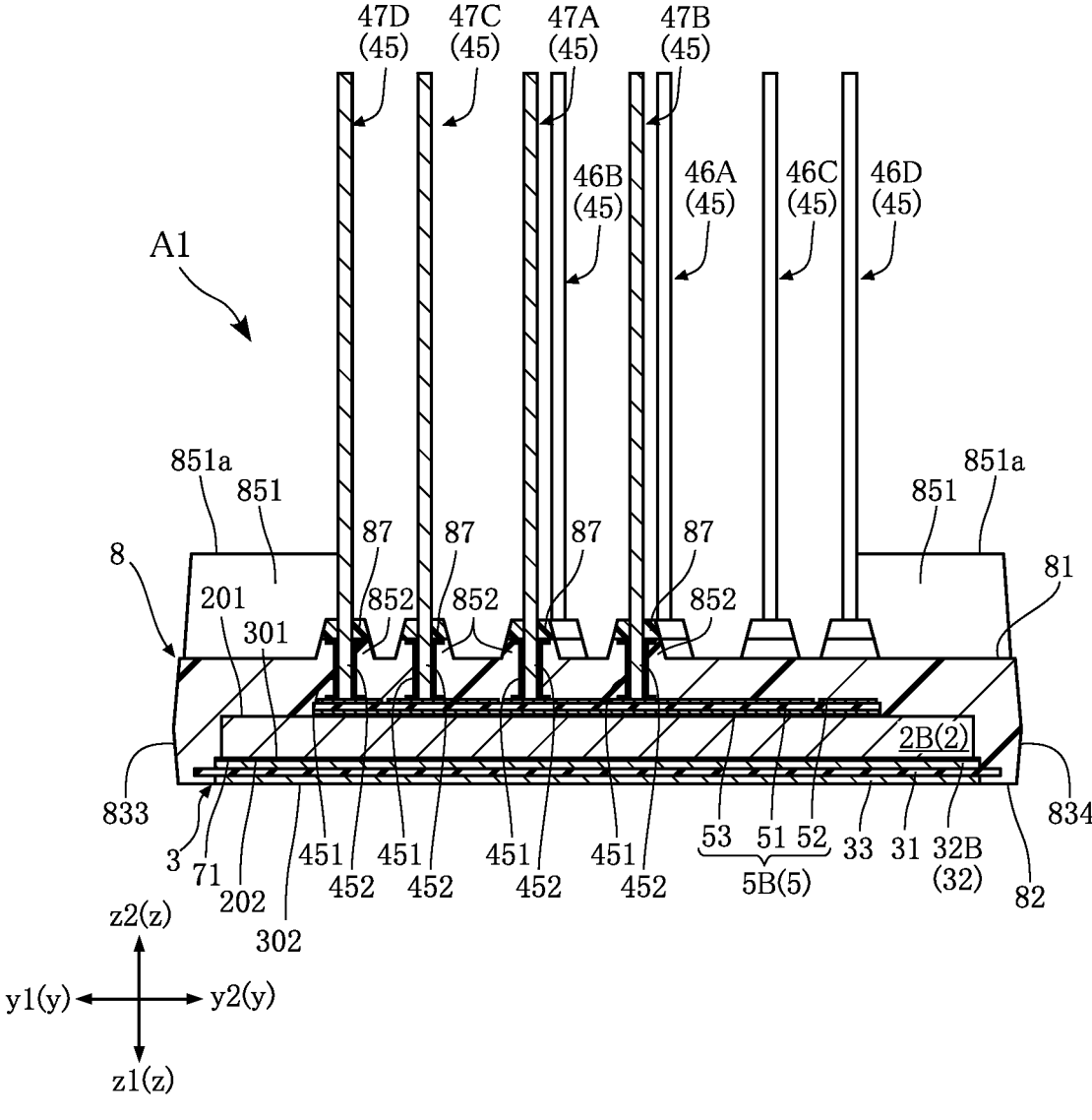
FIG. 20 is a sectional view taken along line XX-XX in FIG. 7.
Figure 21:
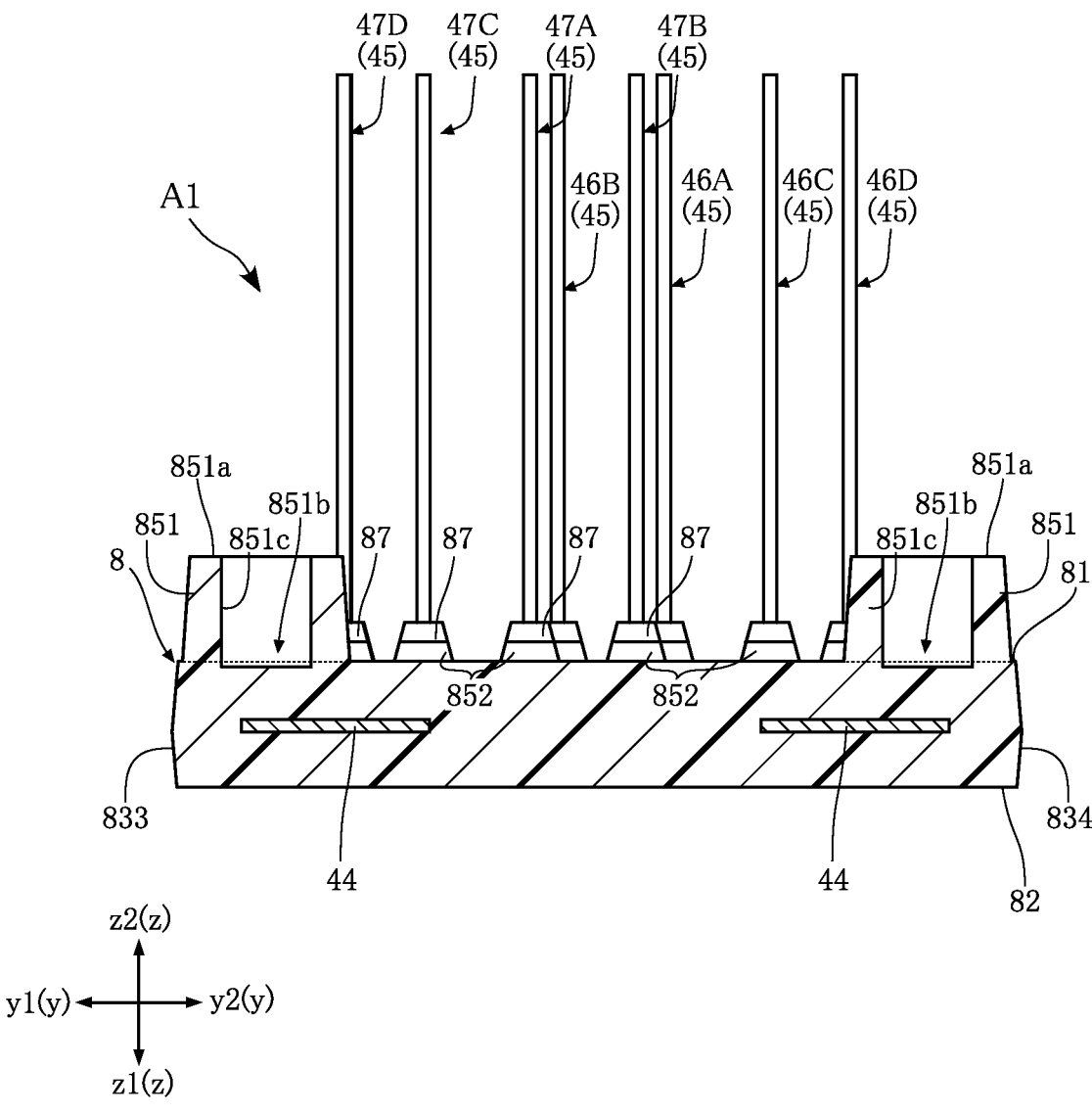
FIG. 21 is a sectional view taken along line XXI-XXI in FIG. 7.
Figure 22:
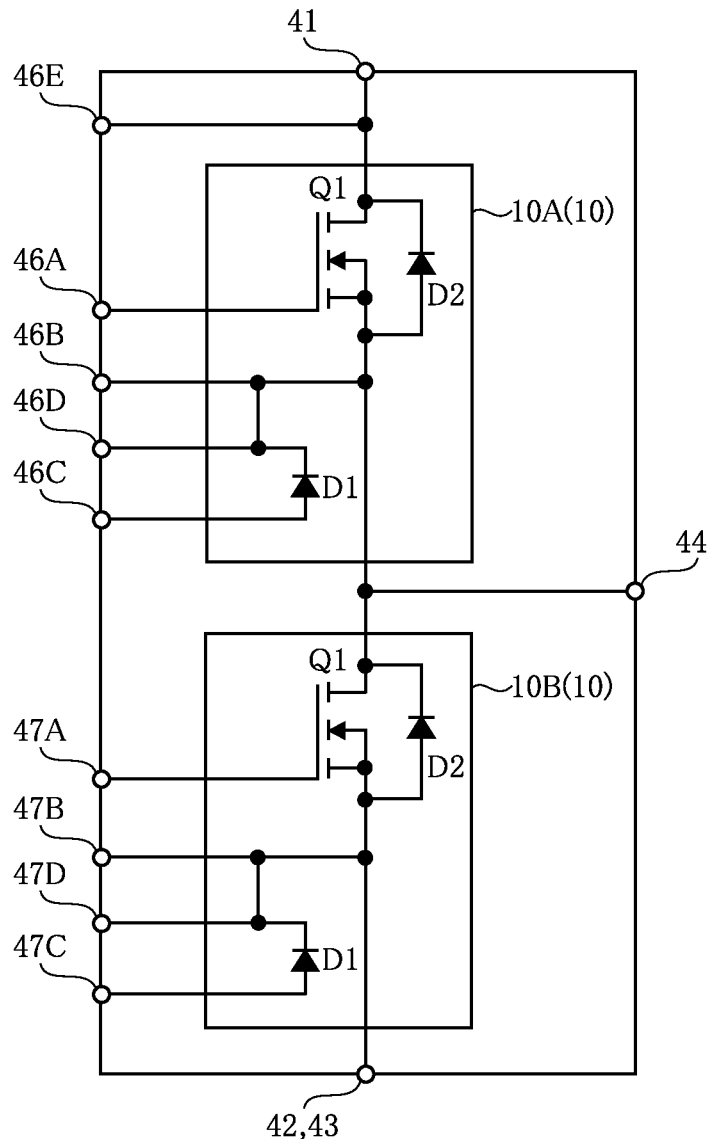
FIG. 22 shows an example of a circuit configuration of the semiconductor module according to the first embodiment.

FIG. 3 is a perspective view of the semiconductor module A1. FIG. 4 is a perspective view corresponding to FIG. 3, from which the sealing resin 8, the resin parts 87, and the resin fill portion 88 are omitted. FIG. 5 is a perspective view corresponding to FIG. 4, from which the conductive member 6 is omitted. FIG. 6 is a plan view of the semiconductor module A1. FIG. 7 is a plan view corresponding to FIG. 6, in which the sealing resin 8, the resin parts 87, and the resin fill portion 88 are indicated by imaginary lines. FIG. 8 is an enlarged view of a part of FIG. 7. In FIG. 8, the imaginary lines of the sealing resin 8, the resin parts 87, and the resin fill portion 88 are omitted. FIG. 9 is an enlarged view of a part of FIG. 8. FIG. 10 is a plan view corresponding to FIG. 7, in which a part of the conductive member 6 (the second conductive member 62, described later) is indicated by imaginary lines. FIG. 11 is a front view of the semiconductor module A1. FIG. 12 is a bottom view of the semiconductor module A1. FIG. 13 is a left side view of the semiconductor module A1. FIG. 14 is a right side view of the semiconductor module A1. FIG. 15 is a sectional view taken along line XV-XV in FIG. 7. FIG. 16 is a sectional view taken along line XVI-XVI in FIG. 7. FIG. 17 is an enlarged view of a part of FIG. 16. FIG. 18 is a sectional view taken along line XVIII-XVIII in FIG. 7. FIG. 19 is a sectional view taken along line XIX-XIX in FIG. 7. FIG. 20 is a sectional view taken along line XX-XX in FIG. 7. FIG. 21 is a sectional view taken along line XXI-XXI in FIG. 7. The wires 731 to 735 are omitted in FIGS. 4, 5, 9, 16 and 20. FIG. 22 shows an example of a circuit configuration of the semiconductor module A1. In the circuit diagram of FIG. 22, only one each of a plurality of first semiconductor elements 10A (described later) and a plurality of second semiconductor elements 10B (described later) are shown, and the remaining first semiconductor elements 10A and second semiconductor elements 10B are omitted.

For the convenience of description, three directions orthogonal to each other are defined as an x direction, a y direction, and a z direction. The z direction is the thickness direction of the semiconductor module A1. The x direction is the horizontal direction in plan view (see FIG. 6) of the semiconductor module A1. The y direction is the vertical direction in plan view (see FIG. 6) of the semiconductor module A1. One sense of the x direction is defined as an x1 direction, while another sense of the x direction is defined as an x2 direction. One sense of the y direction is defined as a y1 direction, while another sense of the y direction is defined as a y2 direction. One sense of the z direction is defined as a z1 direction, while another sense of the z direction is defined as a z2 direction. In the description given below, "in plan view" refers to when viewed in the z direction. The z1 direction may be referred to as "lower", while the z2 direction may be referred to as "upper". For the power conversion device B1, the x direction is defined as the direction along a "radial direction", while the y direction is defined as the direction along the "circumferential direction". The "direction along the circumferential direction" is considered to include the direction along a tangent to the circumference along the circumferential direction. The x direction is an example of the "first direction", and the y direction is an example of the "second direction". The x2 direction is an example of the "first side in the first direction", while the x1 direction is an example of the "second side in the first direction". The y2 direction is an example of the "first side in the second direction", while the y1 direction is an example of the "second side in the second direction". The z2 direction is an example of the "first side in the thickness direction", while the z1 direction is an example of the "second side in the thickness direction".

Each of the semiconductor elements 10 serves as a core for the function of the semiconductor module A1. The constituent material of each semiconductor element 10 is, for example, a semiconductor material mainly composed of SiC (silicon carbide). The semiconductor material is not limited to SiC and may be Si (silicon), GaAs (gallium arsenide) or GaN (gallium nitride), for example. Each semiconductor element 10 has a switching function section Q1 (see FIG. 2) provided by, for example, a MOSFET (Metal-Oxide-Semiconductor Field-Effect Transistor). The switching function section Q1 is not limited to a MOSFET and may be other transistors including field effect transistors such as MISFETs (Metal-Insulator-Semiconductor FET) and bipolar transistors such as IGBTs. The semiconductor elements 10 are identical with each other. Each semiconductor element 10 is, for example, an n-channel MOSFET, but may be a p-channel MOSFET.

As shown in FIG. 17, each semiconductor element 10 has an element obverse surface 101 and an element reverse surface 102. In each semiconductor element 10, the element obverse surface 101 and the element reverse surface 102 are spaced apart from each other in the z direction. The element obverse surface 101 faces in z2 direction, while the element reverse surface 102 faces in the z1 direction.

The plurality of semiconductor elements 10 include a plurality of first semiconductor elements 10A and a plurality of second semiconductor elements 10B. In the present embodiment, the semiconductor module A1 includes three first semiconductor elements 10A and three second semiconductor elements 10B. The number of first semiconductor elements 10A and the number of second semiconductor elements 10B are not limited to this, and may be changed as appropriate in accordance with the performance required of the semiconductor module A1. In the example shown in FIG. 10, three each of the first semiconductor elements 10A and the second semiconductor elements 10B are provided. The number of first semiconductor elements 10A and the number of second semiconductor elements 10B may be one, two, or four or more. The number of first semiconductor elements 10A and the number of second semiconductor elements 10B may be the same or may be different. The number of first semiconductor elements 10A and the number of second semiconductor elements 10B are determined based on the current capacity of the semiconductor module A1.

The semiconductor module A1 may be configured as a half-bridge type switching circuit, as shown in FIG. 22. In this case, in the semiconductor module A1, the first semiconductor elements 10A constitute the upper arm circuit, while the second semiconductor elements 10B constitute the lower arm circuit. The first semiconductor elements 10A are connected in parallel with each other in the upper arm circuit. The second semiconductor elements 10B are connected in parallel with each other in the lower arm circuit. Each first semiconductor element 10A and a relevant second semiconductor element 10B are connected in series to form a bridge layer.

As shown in FIGS. 10 and 18, each of the first semiconductor elements 10A is mounted on the conductive substrate 2. In the example shown in FIG. 10, the first semiconductor elements 10A may be arranged along the y direction and are spaced apart from each other. Each of the first semiconductor elements 10A is conductively bonded to the conductive substrate 2 (the first conductive portion 2A, described later) via a second conductive bonding material 72. With the first semiconductor elements 10A bonded to the first conductive portion 2A, the element reverse surfaces 102 face the first conductive portion 2A.

As shown in FIGS. 10 and 19, each of the second semiconductor elements 10B is mounted on the conductive substrate 2. In the example shown in FIG. 10, the second semiconductor elements 10B may be arranged along the y direction and are spaced apart from each other. Each of the second semiconductor elements 10B is conductively bonded to the conductive substrate 2 (the second conductive portion 2B, described later) via a second conductive bonding material 72. With the second semiconductor elements 10B bonded to the second conductive portion 2B, the element reverse surfaces 102 face the second conductive portion 2B. As will be understood from FIG. 10, the first semiconductor elements 10A and the second semiconductor elements 10B overlap with each other as viewed in the x direction, but may not overlap with each other.

Each of the semiconductor elements 10 (the first semiconductor elements 10A and the second semiconductor elements 10B) has a first obverse electrode 11, a second obverse electrode 12, and a reverse electrode 15. The configurations of the first obverse electrode 11, the second obverse electrode 12, and the reverse electrode 15 described below are common to all semiconductor elements 10. The first obverse electrode 11 and the second obverse electrode 12 are provided on the element obverse surface 101. The first obverse electrode 11 and the second obverse electrode 12 are insulated from each other by an insulating film, not shown. The reverse electrode 15 is provided on the element reverse surface 102.

The first obverse electrode 11 is, for example, a gate electrode, through which a drive signal (e.g., gate voltage) for driving the semiconductor element is input. In each semiconductor element 10, the second obverse electrode 12 is, for example, a source electrode, through which a source current flows. The reverse electrode 15 is, for example, a drain electrode, through which a drain current flows. The reverse electrode 15 covers the entire (or almost entire) element reverse surface 102. The reverse electrode 15 is formed by Ag plating, for example.

When a drive signal (gate voltage) is inputted from the switching function section Q1 to the first obverse electrode 11 (the gate electrode), the semiconductor element 10 switches between a conducting state and a disconnected state in accordance with the drive signal. This operation for switching between the conducting state and the disconnected state is referred to as a "switching operation". In the conducting state, a current flows from the reverse electrode 15 (the drain electrode) to the second obverse electrode 12 (the source electrode). In the disconnected state, this current does not flow. That is, each semiconductor element 10 performs the switching operation by the switching function section Q1. By the switching function sections Q1 of the semiconductor elements 10, the semiconductor module A1 converts the first power supply voltage (DC voltage) inputted between the single input terminal 41 and the two input terminals 42 and 43 into, for example, a second power supply voltage (AC voltage) and outputs the second power supply voltage from the output terminals 44. The input terminals 41 to 43 and the output terminals 44 are all power supply terminals that deal with a power supply voltage. The input terminals 41 to 43 are first power supply terminals through which the first power supply voltage is input. The output terminals 44 are second power supply terminals that output the second power supply voltage.

Some of the semiconductor elements 10 (two semiconductor elements in the example shown in FIG. 10) further include a diode function section D1 (see FIG. 22) in addition to the above-described switching function section Q1. In the semiconductor module A1, one of the first semiconductor elements 10A (the outermost one on the y2 side in FIG. 10) and one of the second semiconductor elements 10B (the outermost one on the y1 side in FIG. 10) include the diode function sections D1 in addition to the switching function sections Q1. The function or role of the diode function sections D1 is not limited, but may be temperature detection, for example. Diode D2 shown in FIG. 22 is, for example, a parasitic diode component of the switching function section Q1.

As shown in FIG. 10, the semiconductor element 10 having the diode function section D1 includes a third obverse electrode 13, a fourth obverse electrode 14 and a fifth obverse electrode 16, in addition to the first obverse electrode 11, the second obverse electrode 12 and the reverse electrode 15. The configurations of the third obverse electrode 13, the fourth obverse electrode 14, and the fifth obverse electrode 16 described below are common to all semiconductor elements 10 that have the diode function sections D1. The third obverse electrode 13, the fourth obverse electrode 14, and the fifth obverse electrode 16 are formed on the element obverse surface 101. In the semiconductor element 10 having the diode function section D1, the third obverse electrode 13 and the fourth obverse electrode 14 are electrically connected to the diode function section D1. The fifth obverse electrode 16 is, for example, a source sense electrode, through which the source current in the switching function section Q1 flows.

As shown in FIG. 9, each of the first semiconductor elements 10A has a first side 191, a second side 192, a third side 193, and a fourth side 194 in plan view. Of the plurality of first semiconductor elements 10A arranged along the y direction, only the first semiconductor element 10A disposed at the center in the y direction is shown in FIG. 9, but other first semiconductor elements 10A also have the first side 191, the second side 192, the third side 193 and the fourth side 194. Each of the first side 191 and the second side 192 extends in the y direction. The first side 191 is the end edge on the x2 side in plan view, while the second side 192 is the end edge on the x1 side in plan view. Each of the third side 193 and the fourth side 194 extends in the x direction. The third side 193 is the end edge on the y2 side in plan view, while fourth side 194 is the end edge on the y1 side in plan view. Each of the first semiconductor elements 10A is rectangular in plan view. Thus, the four corners formed by the first side 191, the second side 192, the third side 193 and the fourth side 194 are right angles (or approximately right angles) in plan view. As shown in FIG. 9, the four corners do not overlap with the conductive member 6 (the first conductive member 61 and the second conductive member 62, described later) in plan view. The length of the third side 193 and the fourth side 194 is longer than the length of the first side 191 and the second side 192.

The conductive substrate 2 is also called a lead frame. The conductive substrate 2 supports the semiconductor elements 10. The conductive substrate 2 is bonded to the support substrate 3 via the first conductive bonding materials 71. The conductive substrate 2 is, for example, rectangular in plan view. The conductive substrate 2, together with the conductive member 6, constitutes paths of the main circuit current switched by the semiconductor elements 10.

The conductive substrate 2 includes a first conductive portion 2A and a second conductive portion 2B. Each of the first conductive portion 2A and the second conductive portion 2B is a plate made of a metal. The metal may be Cu (copper) or a copper alloy, for example. The first conductive portion 2A and the second conductive portion 2B, together with the input terminals 41 to 43 and output terminals 44, constitute conduction paths to the semiconductor elements 10. As shown in FIGS. 15 to 20, each of the first conductive portion 2A and the second conductive portion 2B is bonded on the support substrate 3 via a conductive bonding material 71. Each of the first semiconductor elements 10A is bonded to the first conductive portion 2A via a second conductive bonding material 72. Each of the second semiconductor elements 10B is bonded to the second conductive portion 2B via a second conductive bonding material 72. As shown in FIGS. 5, 10, 15 and 16, the first conductive portion 2A and the second conductive portion 2B are spaced apart from each other in the x direction. In the example shown in these figures, the first conductive portion 2A is located in the x2 direction from the second conductive portion 2B. Each of the first conductive portion 2A and the second conductive portion 2B is, for example, rectangular in plan view. The first conductive portion 2A and the second conductive portion 2B overlap with each other as viewed in the x direction. Each of the first conductive portion 2A and the second conductive portion 2B has the dimensions of, for example, 15 mm to 25 mm (preferably about 20 mm) in the x direction, 30 mm to 40 mm (preferably about 35 mm) in the y direction, and 1.5 mm to 3.0 mm (preferably about 2.0 mm) in the z direction.

The conductive substrate 2 has an obverse surface 201 and a reverse surface 202. As shown in FIGS. 15, 16 and 18 to 20, the obverse surface 201 and the reverse surface 202 are spaced apart from each other in the z direction. The obverse surface 201 faces in z2 direction, while the reverse surface 202 faces in the z1 direction. The obverse surface 201 is constituted of the upper surface of the first conductive portion 2A and the upper surface of the second conductive portion 2B. The reverse surface 202 is constituted of the lower surface of the first conductive portion 2A and the lower surface of the second conductive portion 2B. The reverse surface 202 is bonded to the support substrate 3 such that it faces the support substrate 3. As shown in FIGS. 7, 10 and 15, the obverse surface 201 is formed with a plurality of recesses 201a. Each recess 201a is recessed from the obverse surface 201 in the z direction. The degree of recessing (depth) of each recess 201a is, for example, more than 0 μm and equal to or less than 100 μm. Each recess 201a may be formed during the molding, described later. The recesses 201a include those formed in the obverse surface 201 of the first conductive portion 2A and those formed in the obverse surface 201 of the second conductive portion 2B. The two recesses 201a formed in the obverse surface 201 of the first conductive portion 2A are spaced apart from each other in the y direction and overlap with each other as viewed in the y direction. The two recesses 201a formed in the obverse surface 201 of the second conductive portion 2B are spaced apart from each other in the y direction and overlap with each other as viewed in the y direction.

The conductive substrate 2 (each of the first conductive portion 2A and the second conductive portion 2B) includes a base 21, an obverse bonding layer 22 and a reverse bonding layer 23 laminated on top of each other. The base 21 is a plate made of a metal. The metal is Cu (copper) or a copper alloy. The obverse bonding layer 22 is formed on the upper surface of the base 21. The obverse bonding layer 22 is the surface layer on the z2 side of the conductive substrate 2. The upper surface of the obverse bonding layer 22 corresponds to the obverse surface 201 of the conductive substrate 2. The obverse bonding layer 22 is Ag plating, for example. The reverse bonding layer 23 is formed on the lower surface of the base 21. The reverse bonding layer 23 is the surface layer on the z1 side of the conductive substrate 2. The lower surface of the reverse bonding layer 23 corresponds to the reverse surface 202 of the conductive substrate 2. As with the obverse bonding layer 22, the reverse bonding layer 23 is Ag plating, for example.

The support substrate 3 supports the conductive substrate 2. The support substrate 3 is provided by DBC (Direct Bonded Copper) plate, for example. The support substrate 3 includes an insulating layer 31, a first metal layer 32, a first bonding layer 321, and a second metal layer 33.

The insulating layer 31 is, for example, a ceramic material having excellent thermal conductivity. Examples of such a ceramic material include AlN (aluminum nitride). The insulating layer 31 is not limited to a ceramic material and may be a sheet of insulating resin, for example. The insulating layer 31 is, for example, rectangular in plan view.

The first metal layer 32 is formed on the upper surface (the surface facing in the z2 direction) of the insulating layer 31. The constituent material of the first metal layer 32 includes Cu, for example. The constituent material may include Al rather than Cu. The first metal layer 32 includes a first portion 32A and a second portion 32B. The first portion 32A and the second portion 32B are spaced apart from each other in the x direction. The first portion 32A is located on the x2 side of the second portion 32B. The first conductive portion 2A is bonded to and supported by the first portion 32A. The second conductive portion 2B is bonded to and supported by the second portion 32B. Each of the first portion 32A and the second portion 32B is, for example, rectangular in plan view.

The first bonding layer 321 is formed on the upper surface of the first metal layer 32 (each of the first portion 32A and the second portion 32B). The first bonding layer 321 is Ag plating, for example. The first bonding layer 321 is provided to facilitate bonding by solid-phase diffusion with a first conductive bonding material 71.

The second metal layer 33 is formed on the lower surface (the surface facing in the z1 direction) of the insulating layer 31. The constituent material of the second metal layer 33 is the same as the constituent material of the first metal layer 32. In the example shown in FIG. 12, the lower surface (the bottom surface 302, described later) of the second metal layer 33 may be exposed from the sealing resin 8. The lower surface may not be exposed from the sealing resin 8 and may be covered with the sealing resin 8. The second metal layer 33 overlaps with both the first portion 32A and the second portion 32B in plan view.

As shown in FIGS. 15 to 20, the support substrate 3 has a support surface 301 and a bottom surface 302. The support surface 301 and the bottom surface 302 are spaced apart from each other in the z direction. The support surface 301 faces in the z2 direction, and the bottom surface 302 faces in the z1 direction. As shown in FIG. 12, the bottom surface 302 is exposed from the sealing resin 8. The support surface 301 is the upper surface of the first bonding layer 321 and constituted of the upper surface of the first portion 32A and the upper surface of the second portion 32B. The support surface 301 faces the conductive substrate 2, and the conductive substrate 2 is bonded to the support surface 301. The bottom surface 302 is the lower surface of the second metal layer 33. A heat dissipation member (e.g., a heat sink), not shown, can be attached to the bottom surface 302. The dimension of the support substrate 3 in the z direction (the distance from the support surface 301 to the bottom surface 302 in the z direction) is, for example, 0.7 mm to 2.0 mm.

Each of the input terminals 41 to 43 and output terminals 44 is provided by a plate made of a metal. The constituent material of the metal plate is, for example, Cu or a Cu alloy. In the example shown in FIGS. 3 to 7, 10, and 12, the semiconductor module A1 includes three input terminals 41 to 43 and two output terminals 44.

A power supply voltage is applied between the three input terminals 41 to 43. In the present embodiment, the input terminal 41 is a positive electrode (P terminal), while each of the two input terminals 42 and 43 is a negative electrode (N terminal). Alternatively, the input terminal 41 may be a negative electrode (N terminal), and each of the two input terminals 42 and 43 may be a positive electrode (P terminal). In such a case, the wiring inside the package may be changed as appropriate in accordance with the change of the polarity of terminals. Each of the three input terminals 41 to 43 and two output terminals 44 includes a portion covered with the sealing resin 8 and a portion exposed from the sealing resin 8.

As shown in FIG. 16, the input terminal 41 is formed integrally with the first conductive portion 2A. Unlike this configuration, the input terminal 41 may be provided separately from the first conductive portion 2A and conductively bonded to the first conductive portion 2A. As shown in FIG. 10, the input terminal 41 is located on the x2 side with respect to the first semiconductor elements 10A and the first conductive portion 2A (the conductive substrate 2). The input terminal 41 is electrically connected to the first conductive portion 2A and also electrically connected to the reverse electrode 15 (the drain electrode) of each first semiconductor element 10A via the first conductive portion 2A. The input terminal 41 is an example of the "first input terminal".

The input terminal 41 has an input-side bond surface 411 and an input-side side surface 412. The input-side bond surface 411 faces in the z2 direction and extends toward the x2 side. The input-side side surface 412 is located at the edge of the input-side bond surface 411 as viewed in the z direction and faces in a direction intersecting the input-side bond surface 411. In the present embodiment, the input-side side surface 412 includes an end surface 413 and a pair of side surfaces 414. The end surface 413 is located at the end on the x2 side of the input terminal 41 and faces in the x2 direction. The side surfaces 414 are located at opposite ends in the y direction of the input terminal 41 and face in the y1 direction and the y2 direction, respectively. At least one of the end surface 413 and the side surfaces 414 of the input-side side surface 412 has an input-side processing trace. The input-side processing trace is formed by the lead frame cutting process described later.

As shown in FIG. 10, the two input terminals 42 and 43 are spaced apart from the first conductive portion 2A. The second conductive member 62 is bonded to each of the two input terminals 42 and 43. As shown in FIG. 10, the two input terminals 42 and 43 are located on the x2 side with respect to the first semiconductor elements 10A and the first conductive portion 2A (the conductive substrate 2). The two input terminals 42 and 43 are electrically connected to the second conductive member 62 and also electrically connected to the second obverse electrode 12 (the source electrode) of each second semiconductor element 10B via the second conductive member 62. The input terminal 42 is an example of the "second input terminal", and the input terminal 43 is an example of the "third input terminal".

The input terminals 42 and 43 have input-side bond surfaces 421 and 431 and input-side side surfaces 422 and 432. The input-side bond surfaces 421 and 431 face in the z2 direction and extend toward the x2 side. The input-side side surfaces 422 and 432 are located at the edges of the input-side bond surfaces 421 and 431 as viewed in the z direction and face in respective directions intersecting the input-side bond surfaces 421 and 431. In the present embodiment, the input-side side surface 422 includes an end surface 423 and a pair of side surfaces 424. The end surface 423 is located at the end on the x2 side of the input terminal 42 and faces in the x2 direction. The side surfaces 424 are located at opposite ends in the y direction of the input terminal 42 and face in the y1 direction and the y2 direction, respectively. At least one of the end surface 423 and the side surfaces 424 of the input-side side surface 422 has an input-side processing trace. The input-side processing trace is formed by the lead frame cutting process described later. The input-side side surface 432 includes an end surface 433 and a pair of side surfaces 434. The end surface 433 is located at the end on the x2 side of the input terminal 43 and faces in the x2 direction. The side surfaces 434 are located at opposite ends in the y direction of the input terminal 43 and face in the y1 direction and the y2 direction, respectively. At least one of the end surface 433 and the side surfaces 434 of the input-side side surface 432 has an input-side processing trace.

As shown in FIGS. 3 to 7, 10 and 12, in the semiconductor module A1, the three input terminals 41 to 43 protrude from the sealing resin 8 in the x2 direction. The three input terminals 41 to 43 are spaced apart from each other. The two input terminals 42 and 43 are located opposite to each other with the input terminal 41 interposed therebetween in the y direction. The input terminal 42 is located on the y2 side of the input terminal 41, and the input terminal 43 is located on the y1 side of the input terminal 41. The three input terminals 41 to 43 overlap with each other as viewed in the y direction.

As will be understood from FIGS. 10 and 16, the two output terminals 44 are integrally formed with the second conductive portion 2B. Unlike this configuration, the output terminal 44 may be provided separately from the second conductive portion 2B and conductively bonded to the second conductive portion 2B. As shown in FIG. 10, the two output terminals 44 are located on the x1 side with respect to the second semiconductor elements 10B and the second conductive portion 2B (the conductive substrate 2). Each output terminal 44 is electrically connected to the second conductive portion 2B and also electrically connected to the reverse electrode 15 (the drain electrode) of each second semiconductor element 10B via the second conductive portion 2B. The two output terminals 44 are examples of the "first output terminal" and the "second output terminal".

Each output terminal 44 has an output-side bond surface 441 and an output-side side surface 442. The output-side bond surface 441 faces in the z2 direction and extends toward the x1 side. The output-side side surface 442 is located at the edge of the output-side bond surface 441 as viewed in the z direction and faces in a direction intersecting the output-side bond surface 441. In the present embodiment, the output-side side surface 442 includes an end surface 443 and a pair of side surfaces 444. The end surface 443 is located at the end on the x1 side of the output terminal 44 and faces in the x1 direction. The side surfaces 444 are located at opposite ends in the y direction of the output terminal 44 and face in the y1 direction and the y2 direction, respectively. At least one of the end surface 443 and the side surfaces 444 of the output-side side surface 442 has an output-side processing trace. The number of output terminals 44 is not limited to two, and may be one, or three or more. When only one output terminal 44 is provided, the output terminal is preferably connected to the middle part in the y direction of the second conductive portion 2B.

The control terminals 45 are pin-shaped terminals for controlling the semiconductor elements 10. The control terminals 45 include a plurality of first control terminals 46A to 46E and a plurality of second control terminals 47A to 47D. The first control terminals 46A to 46E are used to control the first semiconductor elements 10A. The second control terminals 47A to 47D are used to control the second semiconductor elements 10B.

The first control terminals 46A to 46E are disposed at intervals along the y direction. As shown in FIGS. 10 and 16, the first control terminals 46A to 46E are supported on the first conductive portion 2A via the control terminal support 5 (the first support portion 5A, described later). As shown in FIGS. 7 and 10, the first control terminals 46A to 46E are located between the first semiconductor elements 10A and the three input terminals 41 to 43 in the x direction.

The first control terminal 46A is a terminal (a gate terminal) for inputting a drive signal for the first semiconductor elements 10A. A drive signal for driving the first semiconductor elements 10A is inputted (e.g., a gate voltage is applied) to the first control terminal 46A.

The first control terminal 46B is a terminal (a source sense terminal) for detecting a source signal of the first semiconductor elements 10A. The voltage applied to the second obverse electrode 12 (the source electrode) of each first semiconductor element 10A (the voltage corresponding to the source current) is detected from the first control terminal 46B.

The first control terminal 46C and the first control terminal 46D are terminals electrically connected to the diode function section D1. The first control terminal 46C is electrically connected to the third obverse electrode 13 of the first semiconductor element 10A having the diode function section D1, and the first control terminal 46D is electrically connected to the fourth obverse electrode 14 of the first semiconductor element 10A having the diode function section D1.

The first control terminal 46E is a terminal (a drain sense terminal) for detecting a drain signal of the first semiconductor elements 10A. The voltage applied to the reverse electrode 15 (the drain electrode) of each first semiconductor element 10A (the voltage corresponding to the drain current) is detected from the first control terminal 46E.

The second control terminals 47A to 47D are disposed at intervals along the y direction. As shown in FIGS. 7 and 20, the second control terminals 47A to 47D are supported on the second conductive portion 2B via the control terminal support 5 (the second support portion 5B, described later). As shown in FIGS. 7 and 10, the second control terminals 47A to 47D are located between the second semiconductor elements 10B and two output terminals 44 in the x direction.

Each of the control terminals 45 (the first control terminals 46A to 46E and the second control terminals 47A to 47D) includes a holder 451 and a metal pin 452.

The holders 451 are made of an electrically conductive material. As shown in FIG. 17, the holders 451 are bonded to the control terminal support 5 (the first metal layer 52, described later) via a conductive bonding material 459. Each holder 451 includes a cylindrical portion, an upper flange portion, and a lower flange portion. The upper flange portion is connected to the top of the cylindrical portion, and the lower flange portion is connected to the bottom of the cylindrical portion. A metal pin 452 is inserted in at least the upper flange portion and the cylindrical portion of each holder 451. The upper surface of the upper flange portion is exposed from the sealing resin 8 (the second protrusion 852, described later) and covered with a resin part 87.

The metal pins 452 are bar-shaped members extending in the z direction. The metal pins 452 are supported by being press-fitted into the holders 451. The metal pins 452 are electrically connected to the control terminal support 5 (the first metal layer 52, described below) at least via the holders 451. When the lower ends (the ends on the z1 side) of the metal pins 452 are in contact with the conductive bonding material 459 within the through-holes of the holders 451 as in the example shown in FIG. 17, the metal pins 452 are electrically connected to the control terminal support 5 via the conductive bonding material 459.

The control terminal support 5 supports the plurality of control terminals 45. The control terminal support 5 is interposed between the obverse surface 201 (the conductive substrate 2) and the control terminals 45.

The control terminal support 5 includes a first support portion 5A and a second support portion 5B. The first support portion 5A is disposed on the first conductive portion 2A of the conductive substrate 2 and supports the first control terminals 46A to 46E of the control terminals 45. As shown in FIG. 17, the first support portion 5A is bonded to the first conductive portion 2A via a bonding material 59. The bonding material 59 may be electrically conductive or insulating, and solder may be used, for example. The second support portion 5B is disposed on the second conductive portion 2B of the conductive substrate 2 and supports the second control terminals 47A to 47D of the control terminals 45. The second support portion 5B is bonded to the second conductive portion 2B via a bonding material 59.

The control terminal support 5 (each of the first support portion 5A and the second support portion 5B) is provided by a DBC substrate, for example. The control terminal support 5 has an insulating layer 51, a first metal layer 52 and a second metal layer 53 laminated on top of each other. The insulating layer 51 is made of a ceramic material, for example. The insulating layer 51 is, for example, rectangular in plan view.

As shown in FIG. 17, the first metal layer 52 is formed on the upper surface of the insulating layer 51. Each control terminal 45 stands on the first metal layer 52. The first metal layer 52 is Cu or a Cu alloy, for example. As shown in FIG. 10, the first metal layer 52 includes a first portion 521, a second portion 522, a third portion 523, a fourth portion 524, and a fifth portion 525. The first portion 521, the second portion 522, the third portion 523, the fourth portion 524 and the fifth portion 525 are spaced apart and insulated from each other.

The first portion 521, to which a plurality of wires 731 are bonded, is electrically connected to the first obverse electrodes 11 (gate electrodes) of the semiconductor elements 10 via the wires 731. As shown in FIG. 10, the first control terminal 46A is bonded to the first portion 521 of the first support portion 5A, and the second control terminal 47A is bonded to the first portion 521 of the second support portion 5B.

The second portion 522, to which a plurality of wires 732 are bonded, is electrically connected to the second obverse electrodes 12 (source electrodes) of the semiconductor elements 10 via the wires 732. As shown in FIG. 10, the first control terminal 46B is bonded to the second portion 522 of the first support portion 5A, and the second control terminal 47B is bonded to the second portion 522 of the second support portion 5B.

The third portion 523, to which a wire 733 is bonded, is electrically connected to the third obverse electrode 13 of the semiconductor element 10 having the diode function section D1 via the wire 733. As shown in FIG. 10, the first control terminal 46C is bonded to the third portion 523 of the first support portion 5A, and the second control terminal 47C is bonded to the third portion 523 of the second support portion 5B.

The fourth portion 524, to which a wire 734 is bonded, is electrically connected to the fourth obverse electrode 14 of the semiconductor element 10 having the diode function section D1 via the wire 734. As shown in FIG. 10, the first control terminal 46D is bonded to the fourth portion 524 of the first support portion 5A, and the second control terminal 47D is bonded to the fourth portion 524 of the second support portion 5B.

The fifth portion 525 of the first support portion 5A, to which a wire 735 is bonded, is electrically connected to the first conductive portion 2A via the wire 735. The fifth portion 525 of the second support portion 5B is not electrically connected to other constituent parts. As shown in FIG. 10, the first control terminal 46E is bonded to the fifth portion 525 of the first support portion 5A.

As shown in FIG. 17, the second metal layer 53 is formed on the lower surface of the insulating layer 51. As shown in FIG. 17, the second metal layer 53 of the first support portion 5A is bonded to the first conductive portion 2A via a bonding material 59. The second metal layer 53 of the second support portion 5B is bonded to the second conductive portion 2B via a bonding material 59.

The conductive member 6, together with the conductive substrate 2, constitutes paths of the main circuit current switched by the semiconductor elements 10. The conductive member 6 is spaced apart from the obverse surface 201 (the conductive substrate 2) in the z2 direction and overlaps with the obverse surface 201 in plan view. In the present embodiment, the conductive member 6 is provided by a plate made of a metal. The metal may be Cu or a copper alloy, for example. Specifically, the conductive member 6 is a bent metal plate. The conductive member 6 is not limited to this and may be formed of metal foil. In the present embodiment, the conductive member 6 includes a plurality of first conductive members 61 and a second conductive member 62. The main circuit current includes a first main circuit current and a second main circuit current. The first main circuit current is a current that flows between the input terminal 41 and the output terminals 44. The second main circuit current is a current that flows between the output terminals 44 and the input terminals 42 and 43.

Each of the first conductive members 61 is connected to the second obverse electrode 12 (the source electrode) of a first semiconductor element 10A and the second conductive portion 2B to electrically connect the second obverse electrode 12 of the first semiconductor element 10A and the second conductive portion 2B to each other. The bonding between each first conductive member 61 and the second obverse electrode 12 (see FIG. 10) of a first semiconductor element 10A and the bonding between each first conductive member 61 and the second conductive portion 2B are both performed via a conductive bonding material 69. The conductive bonding material 69 may be solder, metal paste, or sintered metal, for example. As shown in FIG. 10, each of the first conductive member 61 has the shape of a strip extending in the x direction in plan view.

In the present embodiment, as shown in FIG. 8, each of the first conductive members 61 is formed with an opening 61h at a rectangular portion that connects a first semiconductor element 10A and the second conductive portion 2B. The opening 61h is preferably formed at the center of the rectangle and may be a through-hole penetrating in the z direction. The opening 61h is formed to facilitate the flow of the resin material between the upper side (z2 side) and the lower side (z1 side) at or near each first conductive member 61 when the flowable resin material is injected to form the sealing resin 8. The shape of the opening 61h in plan view may be a perfect circle or may be other shapes such as an oval or a rectangle. The configuration of the first conductive member 61 is not limited to this. For example, the first conductive member 61 may not be formed with the opening 61h.

In the present embodiment, three first conductive members 61 are formed correspondingly to the number of first semiconductor elements 10A. As a variation, the number of first conductive members 61 may not depend on the number of first semiconductor elements 10A, and a single common first conductive member 61 may be used for the plurality of first semiconductor elements 10A.

The second conductive member 62 electrically connects the second obverse electrodes 12 of the second semiconductor elements 10B and the input terminals 42 and 43 to each other. The second conductive member 62 has a maximum dimension in the x direction of 25 mm to 40 mm (preferably about 32 mm), for example, and a maximum dimension in the y direction of 30 mm to 45 mm (preferably about 38 mm), for example. As shown in FIG. 8, the second conductive member 62 includes a first wiring portion 621, a second wiring portion 622, a third wiring portion 623, and a fourth wiring portion 624.

The first wiring portion 621 is connected to the input terminal 42. The first wiring portion 621 and the input terminal 42 are bonded to each other with a conductive bonding material 69. The first wiring portion 621 has the shape of a strip extending in the x direction in plan view.

The second wiring portion 622 is connected to the input terminal 43. The second wiring portion 622 and the input terminal 43 are bonded to each other with a conductive bonding material 69. The second wiring portion 622 has the shape of a strip extending in the x direction in plan view. The first wiring portion 621 and the second wiring portion 622 are spaced apart from each other in the y direction and disposed in parallel (or generally parallel) to each other. The second wiring portion 622 is located in the y1 direction with respect to the first wiring portion 621.

The third wiring portion 623 is connected to both the first wiring portion 621 and the second wiring portion 622. The third wiring portion 623 has the shape of a strip extending in the y direction in plan view. As will be understood from FIG. 8, the third wiring portion 623 overlaps with the second semiconductor elements 10B in plan view. The third wiring portion 623 is connected to each of the second semiconductor elements 10B as shown in FIG. 19. The third wiring portion 623 has a plurality of dented regions 623a. As shown in FIG. 19, each of the dented regions 623a protrudes in the z1 direction relative to other portions of the third wiring portion 623. The dented regions 623a of the third wiring portion 623 are bonded to the second semiconductor elements 10B, respectively. Each dented region 623a of the third wiring portion 623 and the second obverse electrode 12 (see FIG. 10) of a relevant second semiconductor element 10B are bonded to each other via a conductive bonding material 69.

The fourth wiring portion 624 is connected to both the first wiring portion 621 and the second wiring portion 622. Also, the fourth wiring portion 624 is connected to the third wiring portion 623. The fourth wiring portion 624 is located in the x2 direction from the third wiring portion 623. As will be understood from FIG. 8, the fourth wiring portion 624 overlaps with the first semiconductor elements 10A in plan view. The fourth wiring portion 624 has a first strip portion 625 and a plurality of second strip portions 626.

The first strip portion 625, which is a portion of the fourth wiring portion 624 that has the shape of a strip in plan view, is spaced apart from the third wiring portion 623 in the x direction. The first strip portion 625 is connected to both the first wiring portion 621 and the second wiring portion 622. The first strip portion 625 overlaps with the first semiconductor elements 10A in plan view. The first strip portion 625 has a plurality of raised regions 625a. As shown in FIG. 18, each raised region 625a protrudes in the z2 direction relative to other portions of the first strip portion 625. As shown in FIG. 8, each raised region 625a overlaps with a first semiconductor element 10A in plan view. Because the first strip portion 625 has the raised regions 625a, space for bonding a first conductive member 61 is provided above each of the first semiconductor elements 10A. Thus, the first strip portion 625 is prevented from coming into contact with the first conductive members 61.

Each of the second strip portions 626 is connected to the first strip portion 625 and the third wiring portion 623. Each second strip portion 626 has the shape of a strip extending in the x direction in plan view. The second strip portions 626 are spaced apart from each other in the y direction and disposed in parallel (or generally parallel) to each other. In plan view, each of the second strip portions 626 has one end connected to the first strip portion 625 between two first semiconductor elements 10A adjacent to each other in the y direction, and another end connected to the third wiring portion 623 between two second semiconductor elements 10B adjacent to each other in the y direction.

The first strip portion 625 has a first edge 627 and a second edge 628. As shown in FIG. 9, the first edge 627 is located in the x1 direction from the first side 191 in plan view and extends at least from the third side 193 to the fourth side 194 in the y direction. With such a configuration, the two corners 171 and 172 on the x2 side of each first semiconductor element 10A do not overlap with the second conductive member 62 in plan view. The two corners are the corner 171 formed by the first side 191 and the third side 193 and the corner 172 formed by the first side 191 and the fourth side 194. Thus, in each first semiconductor element 10A, respective two sides forming the corner 171 and the corner 172 are partially visible in plan view (specifically, when viewed as shown in FIG. 9; the same applies hereinafter). As shown in FIG. 9, the second edge 628 is located in the x2 direction from the second side 192 in plan view and extends at least from the third side 193 to the fourth side 194 in the y direction. With such a configuration, the two corners 173 and 174 on the x1 side of each first semiconductor element 10A do not overlap with the second conductive member 62 in plan view. The two corners are the corner 173 formed by the second side 192 and the third side 193 and the corner 174 formed by the second side 192 and the fourth side 194. Thus, in each first semiconductor element 10A, respective two sides forming the corner 173 and the corner 174 are partially visible in plan view.

The two sides forming each corner 171, 172, 173, 174 should be visible in plan view with a length greater than 0 μm and equal to or less than 200 μm. The length of the visible portion of each of the two sides forming each corner 171, 172, 173, 174 in plan view is preferably 5 μm or greater and 150 μm or less. When the length of the visible portion of each of the two sides forming each corner 171, 172, 173, 174 is 2 μm or greater, the corners of the first semiconductor element 10A can be detected. When the length of the visible portion of each of these two sides is 5 μm or greater, the corners of the first semiconductor element 10A can be reliably detected. When the length of the visible portion of the above-described two sides exceeds 200 μm, the bonding area between the first conductive member 61 and the first semiconductor element 10A is smaller than necessary, which is not desirable. When the length of the visible portion of the above-described two sides is not greater than the upper limit of 150 μm, the bonding area between the first conductive member 61 and the first semiconductor element 10A are prevented from becoming too small, which is desirable.

As shown in FIG. 8, the conductive member 6 (the first conductive members 61 and the second conductive member 62) include first portions 601. Each first portion 601 is a region that overlaps with a semiconductor element 10 (one of the first semiconductor elements 10A and second semiconductor elements 10B) in plan view. In the second conductive member 62, portions of the fourth wiring portion 624 (the regions overlapping with the first semiconductor elements 10A in plan view) and portions of the third wiring portion 623 (the regions overlapping with the second semiconductor elements 10B in plan view) constitute the first portions 601.

As shown in FIGS. 8 and 10, the obverse electrodes 11, 13, 14 and 16 of the first semiconductor element 10A (the first semiconductor element 10A having the diode function section D1) are arranged along the y direction at the end on the x2 side of the first semiconductor element 10A. In plan view, the first conductive member 61 and the second conductive member 62 overlap with none of the obverse electrodes 11, 13, 14, 16 and corners 171 and 172 on the x2 side of the first semiconductor element 10A. Additionally, in plan view, the first conductive member 61 and the second conductive member 62 do not overlap with at least one of the corners 173 and 174 on the x1 side (opposite to the side on which obverse electrodes are disposed) of the first semiconductor element 10A. Thus, in plan view, at least three of the four corners 171, 172, 173 and 174 of the first semiconductor element 10A are visible. Therefore, when the first semiconductor element 10A, the first conductive member 61 and the second conductive member 62 are mounted on the conductive substrate 2, whether or not the semiconductor element 10A is properly mounted can be checked by automatic visual inspection. All the four corners 171, 172, 173 and 174 of the first semiconductor element 10A may be visible in plan view. The obverse electrodes 11, 13, 14 and 16 of the above-described first semiconductor element 10A is an example of a "first-side obverse electrode".

As shown in FIG. 8, as with the first semiconductor elements 10A, each of the second semiconductor elements 10B is rectangular in plan view and has four corners 181, 182, 183 and 184 corresponding to the four corners 171, 172, 173 and 174 of the first semiconductor elements 10A.

The relationship between the four corners 181, 182, 183 and 184 of each second semiconductor element 10B and the second conductive member 62 in plan view is the same as the relationship between the four corners 171, 172, 173 and 174 of each first semiconductor element 10A and the first and the second conductive members 61 and 62 in plan view.

As shown in FIG. 7, the second conductive member 62 includes first portions 62A and second portions 62B. Each first portion 62A overlaps with the obverse surface 201 of the conductive substrate 2 (the obverse surface 201 of the first conductive portion 2A or the second conductive portion 2B) in plan view but does not overlap with any of the semiconductor elements 10 in plan view. Each second portion 62B overlaps with the obverse surface 201 in plan view and also overlaps with one of the semiconductor elements 10 in in plan view. In FIG. 7, the first portions 62A are hatched with diagonal lines extending to the top right, and the second portions 62B are hatched with diagonal lines extending to the bottom right. The first portions 62A have openings 63. As shown in FIGS. 7 and 15, in plan view, the openings 63 correspond to locations where the material is locally removed. In the present embodiment, the openings 63 are at locations that overlap with the obverse surface 201 of the first conductive portion 2A (the conductive substrate 2) in plan view but do not overlap with the semiconductor elements 10 in plan view. The openings 63 are, for example, through-holes penetrating in the z direction. The openings 63 include one formed in the first wiring portion 621 and one formed in the second wiring portion 622. In plan view, the openings 63 are provided near at least two of the four corners of the conductive substrate 2 and provided, for example, in the first wiring portion 621 and the second wiring portion 622 at locations offset in the x2 direction. The configuration of the openings 63 in plan view is not limited, and may be a hole as in the present embodiment or may be a notch unlike the present embodiment. The openings 63 may be formed by electroforming, for example. In this case, the second conductive member 62 includes openings 63 corresponding to the locations where the metal is not deposited, not the openings 63 corresponding to the locations where the material is removed.

The second conductive member 62 has openings 625h formed at the rectangular portions overlapping with the first semiconductor elements 10A in plan view. In the present embodiment, each opening 625h is preferably formed to overlap with the center of a first semiconductor element 10A in plan view. The openings 625h are, for example, through-holes formed in the raised regions 625a of the first strip portion 625 (the fourth wiring portion 624) (see FIG. 8). The openings 625h are used to optically check the state of the bonding from above in bonding the first conductive member 61 and the first semiconductor elements 10A.

The second conductive member 62 has openings 623h formed at the rectangular portions overlapping with the second semiconductor elements 10B in plan view. In the present embodiment, each opening 623h is preferably formed to overlap with the center of a second semiconductor element 10B in plan view. The openings 623h are, for example, through-holes formed in the dented regions 623a of the third wiring portion 623. The openings 623h are used to position the second conductive member 62 with respect to the conductive substrate 2. The shape of the two types of openings 623h and 625h in plan view may be a perfect circle or may be other shapes such as an oval or a rectangle.

The configuration of the second conductive member 62 is not limited to the above. For example, the second conductive member may not include the fourth wiring portion 624.

However, to reduce the inductance due to the current flowing in the second conductive member 62, it is preferable that the second conductive member 62 includes the fourth wiring portion 624.

The first conductive bonding materials 71 are interposed between the conductive substrate 2 and the support substrate 3 to electrically bond the conductive substrate 2 and the support substrate 3 to each other. The first conductive bonding materials 71 include one that conductively bonds the first conductive portion 2A to the first portion 32A and one that conductively bonds the second conductive portion 2B to the second portion 32B. As shown in FIG. 17, each of the first conductive bonding materials 71 includes a first base layer 711, a first layer 712, and a second layer 713.

As shown in FIG. 17, it is most desirable that the side surface of each first conductive bonding material 71 and the side surface of the first metal layer 32, which is the top layer of the support substrate 3, are flush with each other. It is preferable that the side surface of the first metal layer 32 is located slightly inward from the side surface of the first conductive bonding material 71 in plan view. That is, the bonding is performed such that the side surface of the first metal layer 32 does not protrude from the side surface of the first conductive bonding material 71 in plan view. When the side surface of the first metal layer 32 protrudes from the first conductive bonding material 71 in plan view, the creepage distance between the first metal layer 32 and the second metal layer 33 decreases, which is not desirable. Incidentally, the side surface of the first metal layer 32 is located outside the side surface of the base 21 of the conductive substrate 2 in plan view.

The first base layer 711 is made of a metal, which may be Al or an Al alloy, for example. The first base layer 711 is a sheet material. The Young's modulus of Al (aluminum), which is the constituent material of the first base layer 711, is 70.3 GPa.

The first layer 712 is formed on the upper surface of the first base layer 711. The first layer 712 is interposed between the first base layer 711 and the conductive substrate 2 (each of the first conductive portion 2A and the second conductive portion 2B). The first layer 712 is Ag plating, for example. The first layer 712 is bonded to the reverse bonding layer 23 of each of the first conductive portion 2A and the second conductive portion 2B by solid-phase diffusion of a metal, for example. That is, the first layer 712 and the reverse bonding layer 23 of each of the first conductive portion 2A and the second conductive portion 2B are bonded by solid-phase diffusion bonding. Thus, the first layer 712 and each reverse bonding layer 23 are bonded in direct contact with each other at the bonding interface. In the present disclosure, "A and B are bonded by solid-phase diffusion bonding" means that A and B are bonded in direct contact with each other at the bonding interface as a result of solid-phase diffusion bonding and that a solid-phase diffusion bonding layer is formed by A and B. If solid-phase diffusion bonding is performed under ideal conditions, the bonding interface may not be distinct due to diffusion of metallic elements. On the other hand, if inclusions, such as an oxide film, exist on the surface layers of A and B or voids exist between A and B, these inclusions or voids may be present at the bonding interface.

The second layer 713 is formed on the lower surface of the first base layer 711. The second layer 713 is interposed between the first base layer 711 and the support substrate 3 (each of the first portion 32A and the second portion 32B). The second layer 713 is Ag plating, for example. The second layer 713 is bonded, by e.g. solid-phase diffusion of a metal, to the first bonding layer 321 formed on each of the first portion 32A and the second portion 32B That is, the second layer 713 and the first bonding layer 321 are bonded by solid-phase diffusion bonding and bonded in direct contact with each other at the bonding interface. The Young's modulus of Ag (silver), which is the constituent material of the first layer 712 and the second layer 713, is 82.7 GPa.

In each first conductive bonding material 71, because the constituent material of the first base layer 711 and the constituent material of the first layer 712 and the second layer 713 are as described above, the Young's modulus of the first base layer 711 is smaller than the Young's modulus of the first layer 712 and the second layer 713. The thickness (the dimension in the z direction) of the first base layer 711 is larger than the thicknesses of the first layer 712 and the second layer 713.

In each first conductive bonding material 71, the end surface of the first base layer 711, which is Al or an Al alloy, is not plated with Ag, and the end surface of the first base layer 711 is exposed. However, the end surface of the first base layer 711 may be plated with Ag. From the viewpoint of reducing the manufacturing cost of the first conductive bonding material 71, it is preferable to fabricate the first conductive bonding material 71 by plating both sides of a large-area sheet material with Ag and then cutting the Ag-plated sheet material. From this point of view, it is preferable that the end surface of the first base layer 711 is not formed with Ag-plating.

The second conductive bonding materials 72 are interposed between the conductive substrate 2 and the semiconductor elements 10 to electrically bond the conductive substrate 2 and the semiconductor elements 10 to each other. The second conductive bonding materials 72 include one that conductively bonds each of the first semiconductor elements 10A to the first conductive portion 2A and one that conductively bonds each of the second semiconductor elements 10B to the second conductive portion 2B. As shown in FIG. 17, each of the second conductive bonding materials 72 includes a second base layer 721, a third layer 722, and a fourth layer 723.

The second base layer 721 is made of a metal, which may be Al or an Al alloy, for example. The second base layer 721 is a sheet material.

The third layer 722 is formed on the upper surface of the second base layer 721. The third layer 722 is interposed between the second base layer 721 and each semiconductor element 10. The third layer 722 is Ag plating, for example. The third layer 722 is bonded to the reverse electrode 15 of each semiconductor element 10 by solid-phase diffusion of a metal, for example. That is, the third layer 722 and the reverse electrode 15 are bonded by solid-phase diffusion bonding and bonded in direct contact with each other at the bonding interface.

The fourth layer 723 is formed on the lower surface of the second base layer 721. The fourth layer 723 is interposed between the second base layer 721 and the conductive substrate 2 (each of the first conductive portion 2A and the second conductive portion 2B). The fourth layer 723 is Ag plating, for example. The fourth layer 723 is bonded to the obverse bonding layer 22 of each of the first conductive portion 2A and the second conductive portion 2B by solid-phase diffusion of a metal, for example. That is, the fourth layer 723 and each obverse bonding layer 22 are bonded by solid-phase diffusion bonding and bonded in direct contact with each other at the bonding interface.

In the second conductive bonding material 72, because the constituent material of the second base layer 721 and the constituent material of the third layer 722 and the fourth layer 733 are as described above, the Young's modulus of the second base layer 721 is smaller than the Young's modulus of the third layer 722 and the fourth layer 723. The thickness (the dimension in the z direction) of the second base layer 721 is larger than the thicknesses of the third layer 722 and the fourth layer 723.

In each second conductive bonding material 72, the end surface of the second base layer 721, which is Al or an Al alloy, is not plated with Ag, and the end surface of the second base layer 721 is exposed. However, the end surface of the second base layer 721 may plated with Ag. From the viewpoint of reducing the manufacturing cost of the second conductive bonding material 72, it is preferable to fabricate the second conductive bonding material 72 by plating both sides of a large-area sheet material with Ag and then cutting the Ag-plated sheet material. From this point of view, it is preferable that the end surface of the second base layer 721 is not formed with Ag plating.

Each of the wires 731 to 735 electrically connects two portions that are separated from each other. The wires 731 to 735 are, for example, bonding wires. The constituent material of each wire 731 to 735 includes one of Au (gold), Al and Cu, for example.

As shown in FIG. 10, each of the wires 731 is bonded to the first obverse electrode 11 (the gate electrode) of a semiconductor element 10 and the first portion 521 (the first metal layer 52) of each control terminal support 5 to electrically connect these. As shown in FIG. 10, the wires 731 include a plurality of first wires 731a and a plurality of second wires 731b. Each of the first wires 731a is connected to the first obverse electrode 11 (the gate electrode) of a first semiconductor element 10A and the first portion 521 (the first metal layer 52) of the first support portion 5A. Thus, the first control terminal 46A is electrically connected to the first obverse electrode 11 (the gate electrode) of each first semiconductor element 10A via a first wire 731a. Each of the second wires 731b is connected to the first obverse electrode 11 (the gate electrode) of a second semiconductor element 10B and the first portion 521 (the first metal layer 52) of the second support portion 5B. Thus, the second control terminal 47A is electrically connected to the first obverse electrode 11 (the gate electrode) of each second semiconductor element 10B via a second wire 731b.

As shown in FIG. 10, each of the wires 732 is bonded to the second obverse electrode 12 (the source electrode) of a semiconductor element 10 and the second portion 522 (the first metal layer 52) of each control terminal support 5 to electrically connect these. However, in each semiconductor element 10 having the diode function section D1, each wire 732 is bonded to the fifth obverse electrode 16 (the source sense electrode) instead of the second obverse electrode 12 (the source electrode).

As shown in FIG. 10, each of the wires 733 is bonded to the third obverse electrode 13 of a semiconductor element 10 having the diode function section D1 and the third portion 523 (the first metal layer 52) of each control terminal support 5 to electrically connect these.

As shown in FIG. 10, each of the wires 734 is bonded to the fourth obverse electrode 14 of a semiconductor element 10 having the diode function section D1 and the fourth portion 524 (the first metal layer 52) of each control terminal support 5 to electrically connect these.

As shown in FIG. 10, the wire 735 is bonded to the obverse surface 201 of the first conductive portion 2A (the conductive substrate 2) and the fifth portion 525 (the first metal layer 52) of the first support portion 5A (the control terminal support 5) to electrically connect these.

The sealing resin 8 covers the semiconductor elements 10, the conductive substrate 2, the support substrate 3 (except the bottom surface 302), a part of each input terminal 41 to 43, a part of each output terminal 44, a part of each control terminal 45, the control terminal support 5, the conductive member 6 and the wires 731 to 735. The sealing resin 8 is made of black epoxy resin, for example. The sealing resin 8 is formed by molding, which will be described later. The sealing resin 8 has the dimensions of, for example, about 35 mm to 60 mm in the x direction, about 35 mm to 50 mm in the y direction, and about 4 mm to 15 mm in the z direction. These dimensions are the size of the largest portion along each direction. The sealing resin 8 has a resin obverse surface 81, a resin reverse surface 82, and a plurality of resin side surfaces 831 to 834.

As shown in FIGS. 11, 13 and 14, the resin obverse surface 81 and the resin reverse surface 82 are spaced apart from each other in the z direction. The resin obverse surface 81 faces in the z2 direction, and the resin reverse surface 82 faces in the z1 direction. The control terminals 45 (the first control terminals 46A to 46E and the second control terminals 47A to 47D) protrude from the resin obverse surface 81. As shown in FIG. 12, the resin reverse surface 82 has a frame shape surrounding the bottom surface 302 of the support substrate 3 (the lower surface of the second metal layer 33) in plan view. The bottom surface 302 of the support substrate 3 is exposed at the resin reverse surface 82 and may be flush with the resin reverse surface 82. Each of the resin side surfaces 831 to 834 is connected to both the resin obverse surface 81 and the resin reverse surface 82 and sandwiched between these surfaces in the z direction. As shown in FIG. 6, the resin side surface 831 and the resin side surface 832 are spaced apart from each other in the x direction. The resin side surface 831 faces in the x1 direction, and the resin side surface 832 faces in the x2 direction. The two output terminals 44 protrude from the resin side surface 831, and three input terminals 41 to 43 protrude from the resin side surface 832. As shown in FIG. 6, the resin side surface 833 and the resin side surface 834 are spaced apart from each other in the y direction. The resin side surface 833 faces in the y1 direction, and the resin side surface 834 faces in the y2 direction.

As shown in FIGS. 6, the resin side surface 832 is formed with a plurality of recesses 832a. Each recess 832a is a portion recessed in the x direction in plan view. One of the recesses 832a is formed between the input terminal 41 and the input terminal 42 in plan view, and another one of the recesses 832a is formed between the input terminal 41 and the input terminal 43 in plan view. The recesses 832a are provided to increase the distance along the resin side surface 832, or creepage distance between the input terminal 41 and the input terminal 42 and the distance along the resin side surface 832, or creepage distance between the input terminal 41 and the input terminal 43.

As shown in FIGS. 15 and 16, the sealing resin 8 has a plurality of first protrusions 851, a plurality of second protrusions 852, and resin void portions 86.

The first protrusions 851 protrude from the resin obverse surface 81 in the z direction. In plan view, the first protrusions 851 are disposed at four corners of the sealing resin 8. Each of the first protrusions 851 has a first-protrusion end surface 851a at its extremity (the end in the z2 direction). The first-protrusion end surfaces 851a of the first protrusions 851 are parallel (or generally parallel) with the resin obverse surface 81 and located on the same plane (x-y plane). Each first protrusion 851 may have the shape of a hollow conical frustum with a bottom, for example. The first protrusions 851 are used as spacers when the semiconductor module A1 is mounted on a control circuit board or the like of a device configured to use the power produced by the semiconductor module A1. Each of the first protrusions 851 has a recess 851b and an inner wall surface 851c formed around the recess 851b. The shape of each first protrusion 851 may be columnar, and preferably cylindrical. The shape of the recess 851b may be cylindrical. Preferably, the inner wall surface 851c may be a single perfect circle in plan view. Each first protrusion 851 is an example of a "protrusion", and each first-protrusion end surface 851a is an example of a "protrusion end surface".

The semiconductor module A1 may be mechanically fixed to a control circuit board or the like by screwing, for example. In such a case, female threads can be formed on the inner wall surfaces 851c of the recesses 851b of the first protrusions 851. Insert nuts may be embedded in the recesses 851b of the first protrusions 851.

As shown in FIG. 16, the second protrusions 852 protrude from the resin obverse surface 81 in the z direction. The second protrusions 852 overlap with the control terminals 45 in plan view. The metal pins 452 of the control terminals 45 protrude from the second protrusions 852, respectively. A part of a holder 451 (the upper surface of the upper flange portion) is exposed from the upper end surface of each second protrusion 852. Each second protrusion 852 has the shape of a conical frustum. A resin part 87 is disposed on each of the second protrusions 852.

As shown in FIG. 15, the resin void portions 86 extend from the resin obverse surface 81 to recesses 201a formed on the obverse surface 201 of the conductive substrate 2. Each resin void portion 86 is tapered, with its sectional area decreasing as proceeding from the resin obverse surface 81 toward the recess 201a in the z direction. The resin void portion end edge 861 of the resin void portion 86, which abuts the obverse surface 201, and the recess end edge 201b of the recess 201a, which abuts the obverse surface 201, correspond to each other. The resin void portions 86 are formed during the molding of the sealing resin 8 and correspond to the area where the sealing resin 8 is not formed during the molding process.

The resin parts 87 are provided on the second protrusions 852 of the sealing resin 8. In each control terminal 45, the resin part 87 covers a part of the holder 451 (the upper surface of upper flange portion) that is exposed from the sealing resin 8 and a part of the metal pin 452. The resin parts 87 may be made of epoxy resin as with the sealing resin 8, but may be made of a material different from the sealing resin 8.

The resin fill portions 88 are loaded into the resin void portions 86 to fill the resin void portions 86. The resin fill portions 88 may be made of epoxy resin as with the sealing resin 8, but may be made of a material different from the sealing resin 8.

The semiconductor module A1 is mounted on a control circuit board or the like. At that time, each metal pin 452 is inserted into a pin hole of the circuit board on which the semiconductor module A1 is mounted and connected to a terminal near the pin hole. The input terminals 41, 42, and 43 have input-side bond surfaces 411, 421, and 431, respectively, that face one side in the z direction (the z2 direction). Each output terminal 44 has an output-side bond surface 441 that faces the one side in the z direction (the z2 side). The input-side bond surfaces 411, 421 and 431 and the output-side bond surface 441 are bonded with e.g. solder to the terminals of the circuit board on which the semiconductor module A1 is mounted.

The following describes the current path from the input terminal 41 to the output terminals 44 in the semiconductor module A1 of the present embodiment. The first main circuit current flows in the order of the input terminal 41, the first conductive portion 2A, each first semiconductor element 10A, the first conductive members 61, the second conductive portion 2B and each output terminal 44. Specifically, the first main circuit current flows between the second obverse electrode 12 of each first semiconductor element 10A and the second conductive portion 2B through a first conductive member 61 along the x direction. In the second conductive portion 2B, the first main circuit current flows between the portions to which the first conductive members 61 are bonded and the output terminals 44 along the x direction and in a direction slightly inclined with respect to the x direction.

The following describes the current path from the output terminals 44 to the input terminal 42 and the input terminal 43. The second main circuit current flows in the order of the output terminals 44, the second conductive portion 2B, each second semiconductor element 10B, the second conductive member 62, the input terminals 42 and 43. The second conductive member 62 constitutes the path of the second main circuit current, and the second main circuit current flows through the third wiring portion 623 extending in the y direction and both the first wiring portion 621 and the second wiring portion 622 that are connected to opposite ends of the third wiring portion 623 and extend in the x2 direction. Also, the second main circuit current flows in the first wiring portion 621 and the second wiring portion 622 through the two second strip portions 626 disposed between the first wiring portion 621 and the second wiring portion and extending in the x direction, and through the first strip portion 625 disposed between the first wiring portion 621 and the second wiring portion 622 and extending in the y direction.

The second main circuit current flows between the input terminals 42 and 43 and the second obverse electrodes 12 of the second semiconductor elements 10B through the first wiring portion 621, the second wiring portion 622, the third wiring portion 623, two second strip portions 626 and the first strip portion 625 of the second conductive member 62. In the first wiring portion 621, the second wiring portion 622, and two second strip portions 626, the second main circuit current flows along the x direction. The first main circuit current and the second main circuit current flow in opposite directions.

The direction in which the first main circuit current flows through the first conductive members 61 and the direction in which the second main circuit current flows through the first wiring portion 621, the second wiring portion 622 and the two second strip portions 626 of the second conductive member 62 are both the x direction.

The following describes the operation and effects of the power conversion device B1.

In the power conversion device B1, the center lines OL1, OL2 and OL3 intersect the capacitor body 90 as viewed in the z direction. The first angle α1 and the second angle α2 are the same angle, and the length Lb1 and the length Lb2 are equal to each other. With such a configuration, the distances of the first semiconductor module A11, the second semiconductor module A12 and the third semiconductor module A13 from the capacitor body 90 are made more uniform. In addition, the positional relationship of the conduction paths between the first semiconductor module A11, the second semiconductor module A12 and the third semiconductor module A13, which are adjacent to each other, and the capacitor module C1 is made more uniform, and unintended effects from one of the conduction paths to another conduction path can be suppressed. According to the power conversion device B1, therefore, the inductances between the capacitor module C1 and the first semiconductor module A11, the second semiconductor module A12 and the third semiconductor module A13 can be made more uniform. Additionally, the power conversion device B1 can be arranged more compactly.

The center line OL1 and the center line OL2 intersect with each other at an intersection Cp inside the capacitor body 90 as viewed in the z direction. Such a configuration can further suppress variations in, for example, the distance from the first semiconductor module A11, the second semiconductor module A12 and the third semiconductor module A13 to the capacitor body 90.

The intersection Cp coincides with the center point Oz as viewed in the z direction. Thus, the first semiconductor module A11, second semiconductor module A12, and third semiconductor module A13 and the capacitor body 90 are arranged compactly in a well-balanced positional relationship.

The configuration in which the first angle α1 and the second angle α2 are 45° is suitable for arranging the first semiconductor module A11, the second semiconductor module A12, and the third semiconductor module A13 at uniform intervals while arranging the first semiconductor module A11, the second semiconductor module A12, and the third semiconductor module A13 collectively in a biased manner respect to the capacitor body 90.

The semiconductor module A1 includes the conductive substrate 2, the input terminals 41 to 43, the output terminal 44 and the conductive member 6. The conductive substrate 2 includes the first conductive portion 2A on which the first semiconductor elements 10A are bonded and the second conductive portion 2B on which the second semiconductor elements 10B are bonded. The input terminal 41 is connected to the first conductive portion 2A and electrically connected to the first semiconductor elements 10A via the first conductive portion 2A. The input terminal 42 and the input terminal 43 are electrically connected to the second semiconductor elements 10B via the second conductive member 62 (the conductive member 6). The output terminals 44 are connected to the second conductive portion 2B and electrically connected to the second semiconductor elements 10B via the second conductive portion 2B. The conductive member 6 includes the first conductive members 61 electrically connecting the first semiconductor elements 10A and the second conductive portion 2B and the second conductive member 62 electrically connecting the second semiconductor elements 10B and the input terminals 42 and 43. The input terminals 41 to 43 are disposed on the x2 side with respect to the conductive substrate 2, and the output terminals 44 are disposed on the x1 side with respect to the conductive substrate 2. The two input terminals 42 and 43 are disposed opposite to each other with the input terminal 41 interposed therebetween in the y direction. In a semiconductor module with a different configuration from the semiconductor module A1, when the input terminal 43 is not provided and the input terminal 41 and the input terminal 42 are arranged along the y direction, variations can occur in the paths of the current flowing from the input terminal 41 to the output terminals 44 via each first semiconductor element 10A, and variations can also occur in the paths of the current flowing from the output terminals 44 to each input terminal 42 via each second semiconductor element 10B. In the semiconductor module A1, on the other hand, by providing two input terminals 42 and 43 and sandwiching the input terminal 41 between the two input terminals 42 and 43, it is possible to reduce variations in the paths of the current flowing from the input terminal 41 to the output terminals 44 via each first semiconductor element 10A and to reduce variations in the paths of the current flowing from the output terminals 44 to each input terminal 42 and 43 via each second semiconductor element 10B. This reduces the parasitic inductance component of the semiconductor module A1. In other words, the semiconductor module A1 has a package structure favorable for reducing the parasitic inductance component.

In the semiconductor module A1, the upper arm current path and the lower arm current path overlap with each other in plan view. The upper arm current path is the path of the current flowing from the input terminal 41 to each output terminal 44 via the first conductive portion 2A, each first semiconductor element 10A, each first conductive member 61 and the second conductive portion 2B, and is along the direction from the x2 side to the x1 side in the present embodiment, as understood from FIG. 7. The lower arm current path is the path of the current flowing from the output terminals 44 to the input terminal 42 via each second semiconductor element 10B and the second conductive member 62, and is along the direction from the x1 side to the x2 side in the present embodiment, as understood from FIG. 7. With such a configuration, the magnetic field generated by the current along the upper arm current path and the magnetic field generated by the current along the lower arm current path cancel each other out, thereby reducing the parasitic inductance component. In particular, in the semiconductor module A1, the conductive member 6 (each of the first conductive members 61 and second conductive member 62) is provided by a plate made of a metal, so that the upper arm current path and the lower arm current path overlap with each other in plan view over a sufficient area. Thus, the semiconductor module A1 has a package structure favorable for reducing the parasitic inductance component.

In the semiconductor module A1, the second conductive member 62, which constitutes the lower arm current path, includes the first wiring portion 621, the second wiring portion 622, the third wiring portion 623 and the fourth wiring portion 624. The first wiring portion 621 and the second wiring portion 622 extend in the x direction and are connected to the input terminal 42 and the input terminal 43, respectively, that are disposed opposite to each other in the y direction with the input terminal 41 therebetween. The third wiring portion 623, which extends in the y direction, is connected to both the first wiring portion 621 and the second wiring portion 622 and connected to each of the second semiconductor elements 10B. The fourth wiring portion 624 is connected to both the first wiring portion 621 and the second wiring portion 622 and overlaps with each of the first semiconductor elements 10A in plan view. The second conductive member 62, which includes the first wiring portion 621, the second wiring portion 622, the third wiring portion 623 and the fourth wiring portion 624 described above, is spaced apart from the obverse surface 201 (the conductive substrate 2) in the z direction and overlaps with a wide area of the obverse surface 201 in plan view. With such a configuration, variations in the paths of the current flowing from the output terminal 44 through each second semiconductor element 10B to each of the input terminals 42 and 43 is appropriately reduced, which is suitable for reducing parasitic inductance components.

The first semiconductor elements 10A and the second semiconductor elements 10B overlap with each other as viewed in the x direction. According to this configuration, it is possible to suppress the increase in the dimension in the y direction of the conductive substrate 2 (the first conductive portion 2A and the second conductive portion 2B) on which the first semiconductor elements 10A and the second semiconductor elements 10B are disposed, and to thereby downsize the semiconductor module A1.

The fourth wiring portion 624 of the second conductive member 62 has the first strip portion 625 and the second strip portions 626. The first strip portion 625, which extends in the y direction, is connected to both the first wiring portion 621 and the second wiring portion 622 and overlaps with the first semiconductor elements 10A in plan view. Each of the second strip portions 626 is connected to the first strip portion 625 and the third wiring portion 623 and has the shape of a strip extending in the x direction in plan view. The second strip portions 626 are spaced apart from each other in the y direction and disposed parallel (or generally parallel) to each other. In plan view, each of the second strip portions 626 has one end connected to the first strip portion 625 between two first semiconductor elements 10A adjacent to each other in the y direction, and another end connected to the third wiring portion 623 between two second semiconductor elements 10B adjacent to each other in the y direction. With such a configuration, the size of the fourth wiring portion 624 (the second conductive member 62) in plan view can be made larger. This is more favorable for reducing parasitic inductance components.

The first strip portion 625 includes raised regions 625*a* protruding in the z2 direction relative to other portions. Each raised region 625*a* overlaps with a first semiconductor element 10A in plan view. With the configuration in which the first strip portion 625 has the raised regions 625*a*, it is possible to prevent the first strip portion 625 from unduly coming into contact with the first conductive members 61 bonded to the first semiconductor elements 10A.

The third wiring portion 623 has dented regions 623*a* protruding in the z1 direction relative to other portions. Each dented region 623*a* is bonded to one of the second semiconductor elements 10B. With such a configuration, it is possible to make large the size of the third wiring portion 623 (the second conductive member 62) in plan view while appropriately providing electrical connection between the third wiring portion 623 (the second conductive member 62) and the second semiconductor elements 10B.

The semiconductor module A1 includes the first control terminals 46A to 46E and the second control terminals 47A to 47D for controlling the first semiconductor elements 10A and the second semiconductor elements 10B, in addition to the above-described conductive member 6 (the first conductive member 61 and the second conductive member 62). Each of the first control terminals 46A to 46E and the second control terminals 47A to 47D is disposed on the obverse surface 201 of the conductive substrate 2 so as to extend along the z direction. Such a configuration makes it possible to reduce the size of the semiconductor module in plan view. Thus, the semiconductor module A1 is suitable for achieving reduction of size in plan view while reducing parasitic inductance components.

The first control terminals 46A to 46E are supported on the first conductive portion 2A and disposed in the x2 direction from the first semiconductor elements 10A. The second control terminals 47A to 47D are supported on the second conductive portion 2B and disposed in the x1 direction from the second semiconductor elements 10B. The first control terminals 46A to 46E are disposed at intervals along the y direction, so are the second control terminals 47A to 47D. Thus, the first control terminals 46A to 46E and the second control terminals 47A to 47D are disposed in the region corresponding to the first semiconductor elements 10A constituting the upper arm circuit and the region corresponding to the second semiconductor elements 10B constituting the lower arm circuit, respectively. The semiconductor module A1 having such a configuration is more favorable for achieving reduction of size in plan view while reducing parasitic inductance components.

Each of the first semiconductor elements 10A and the second semiconductor elements 10B has a first obverse electrode 11 (gate electrode) facing in the z2 direction. The first control terminal 46A is connected to the first obverse electrode 11 (gate electrode) of each first semiconductor element 10A via a first wire 731a. The second control terminal 47A is connected to the first obverse electrode 11 (gate electrode) of each second semiconductor element 10B via a second wire 731b. Thus, drive signals to drive the first semiconductor elements 10A (the second semiconductor elements 10B) having a switching function can be appropriately input to the first obverse electrodes 11 via the first control terminal 46A (the second control terminal 47A) and the first wires 731a (the second wires 731b).

When the semiconductor module A1 is mounted on a circuit board, each metal pin 452 is inserted into a pin hole of the circuit board on which the semiconductor module A1 is mounted and connected to a terminal near the pin hole. The input terminals 41, 42, and 43 have input-side bond surfaces 411, 421, and 431, respectively, that face one side in the z direction (the z2 direction). Each output terminal 44 has an output-side bond surface 441 that faces the one side in the z direction (the z2 side). The input-side bond surfaces 411, 421 and 431 and the output-side bond surface 441 are bonded with e.g. solder to the terminals of the circuit board on which the semiconductor module A1 is mounted. With the above-described configuration, the power system circuit board to which the input terminals 41 to 43 and the output terminals 44 are connected and the control system circuit board to which each metal pin 452 is connected can be disposed to be spaced apart from each other in the z direction. These firstly increase the degree of freedom regarding the arrangement of the signal terminals of the semiconductor module A1. Second, the degree of freedom is improved regarding the routing and length of the signal wiring in the semiconductor module A1. Third, when using the semiconductor module A1, the degree of freedom regarding the placement of the circuit board by the user is improved.

In the semiconductor module A1, each control terminal 45 protrudes from the resin obverse surface 81 and extends along the z direction. In a configuration different from the semiconductor module A1, each control terminal 45 may be disposed to extend along a plane (x-y plane) orthogonal to the z direction. Such a configuration limits reduction of size in plan view. By arranging each control terminal 45 to extend along the z direction, as in the semiconductor module A1, it is possible to reduce the size of semiconductor module A1 in plan view. Thus, the semiconductor module A1 has a package structure favorable for achieving reduction of size in plan view.

In the semiconductor module A1 according to the present embodiment, the control terminal support 5 is interposed between the control terminals 45 and the obverse surface 201 (the conductive substrate 2). The control terminal support 5 has the insulating layer 51, and each control terminal 45 is supported on the conductive substrate 2 via the control terminal support 5. Such a configuration with the control terminal support 5 makes it possible to properly support the control terminal 45 on the conductive substrate 2 while providing insulation between it and the conductive substrate 2.

The control terminal support 5 is a laminated structure having the insulating layer 51, the first metal layer 52 and the second metal layer 53 stacked on top of each other. The control terminals 45 are bonded, via the conductive bonding material 459, to the first metal layer 52 formed on the upper surface of the control terminal support 5. With such a configuration, it is possible to conductively bond the control terminals 45 to the control terminal support 5 (the first metal layer 52) while utilizing an existing laminated structure (such as a DBC substrate) as the control terminal support 5.

Each semiconductor element 10 has an element obverse surface 101 facing in the z2 direction and an element reverse surface 102 facing in the z1 direction. A first obverse electrode 11 (the gate electrode) is disposed on the element obverse surface 101. The first obverse electrode 11 of each semiconductor element 10 and the first metal layer 52 (the first portion 521) are connected to each other via a conductive wire 731. Thus, drive signals to drive the semiconductor elements 10 having switching function can be appropriately inputted to the first obverse electrodes 11 via the control terminals 45, the first metal layer 52 and the wires 731.

Each control terminal 45 includes a holder 451 and a metal pin 452. The holder 451 is made of an electrically conductive material and includes a cylindrical portion. The metal pin 452 is a bar-shaped member extending in the z direction and press-fitted into the holder 451. A part of the holder 451 (the upper surface of the upper flange portion) is exposed from the sealing resin 8. With such a configuration, the holder 451 is covered with the sealing resin 8 except a part thereof (the top end surface) when the sealing resin 8 is formed (molding), and the top end face of the holder 451 is exposed from the sealing resin 8. This allows the metal pin 452 to be inserted into the holder 451 after the sealing resin 8 is formed. Therefore, according to the configuration in which the control terminal 45 includes the holder 451 and metal pin 452 described above, it is possible to prevent the mold 91 for the molding process from becoming complicated, which is favorable for efficiently manufacturing the semiconductor module A1.

The semiconductor module A1 of the present embodiment includes the resin parts 87 bonded to the sealing resin 8. Each resin part 87 covers a part of a holder 451 (the upper surface of the upper flange portion) exposed from the sealing resin 8 and a part of the metal pin 452. With such a configuration, it is possible to prevent foreign matter from entering the connection portion between the holder 451 and the metal pin 452. The semiconductor module A1 having the above configuration is favorable for improving durability and reliability.

The sealing resin 8 has second protrusions 852 protruding from the resin obverse surface 81. The second protrusions 852 surround the control terminals 45 in plan view. The metal pin 452 of each control terminal 45 protrudes from a second protrusion 852. A resin part 87 is disposed on each second protrusion 852. Such a configuration can increase the creepage distance along the resin obverse surface 81 between adjacent control terminals 45. This is favorable for increasing the withstand voltage between adjacent control terminals 45.

The conductive substrate 2 includes the first conductive portion 2A and the second conductive portion 2B spaced apart from each other in the x direction. The first conductive portion 2A is located in the x2 direction from the second conductive portion 2B. The semiconductor elements 10 include the first semiconductor elements 10A bonded to the first conductive portion 2A and the second semiconductor elements 10B bonded to the second conductive portion 2B. The control terminals 45 include the first control terminals 46A to 46E and the second control terminals 47A to 47D. The first control terminals 46A to 46E are supported on the first conductive portion 2A and located between the first semiconductor elements 10A and the input terminals 41 and 42 in the x direction. The second control terminals 47A to 47D are located between the second semiconductor elements 10B and the output terminal 44 in the x direction. With such a configuration, the control terminals 45 (the first control terminals 46A to 46E and the second control terminals 47A to 47D) are properly disposed at respective regions corresponding to the first semiconductor elements 10A, which form the upper arm circuit, or the second semiconductor elements 10B, which form the lower arm circuit. Such a configuration is more favorable for achieving reduction of size in plan view of the semiconductor module A1.

The sealing resin 8 has first protrusions 851 protruding from the resin obverse surface 81. Each of the first protrusions 851 has a first-protrusion end surface 851a at its extremity. The first-protrusion end surfaces 851a of the first protrusions 851 are parallel (or generally parallel) with the resin obverse surface 81 and located on the same plane (x-y plane). With such a configuration, in a device that uses the power produced by the semiconductor module A1, a certain space can be provided between the surface of a control circuit board on which the semiconductor module A1 is mounted and the resin obverse surface 81. Thus, even when various functional components are mounted on the surface of the control circuit board that faces the semiconductor module A1, the functional components are prevented from unduly coming into contact with the sealing resin 8.

The semiconductor module A1 includes the conductive substrate 2 to which the semiconductor elements 10 are bonded. With such a configuration, heat generated by energization of each semiconductor element 10 is transferred to the conductive substrate 2, and the heat transferred from each semiconductor element 10 is diffused by the conductive substrate 2. Thus, the semiconductor module A1 has a package structure favorable for improving the heat dissipation of each semiconductor element 10.

In the semiconductor module A1, the conductive substrate 2 and the support substrate 3 are bonded to each other via the first conductive bonding materials 71. Each first conductive bonding material 71 includes the first layer 712 and the second layer 713. The first layer 712 is bonded to the conductive substrate 2 by solid-phase diffusion of metal while being in direct contact with each other at the bonding interface. The second layer 713 is bonded to the support substrate 3 by solid-phase diffusion of metal while being in direct contact with each other at the bonding interface. Such a configuration provides a higher bonding strength between the conductive substrate 2 and the support substrate 3 than when the conductive substrate 2 and the support substrate 3 are bonded using a bonding material such as solder, for example. Thus, the semiconductor module A1 has a package structure favorable for preventing separation of the conductive substrate 2 and the support substrate 3.

In the semiconductor module A1, each semiconductor element 10 and the conductive substrate 2 are bonded to each other via a second conductive bonding material 72. The second conductive bonding material 72 includes the third layer 722 and the fourth layer 723. The third layer 722 is bonded to the semiconductor element 10 (the reverse electrode 15) by solid-phase diffusion of metal while being in direct contact with each other at the bonding interface. The fourth layer 723 is bonded to the conductive substrate 2 by solid-phase diffusion of metal while being in direct contact with each other at the bonding interface. Such a configuration provides a higher bonding strength between each semiconductor element 10 and the conductive substrate 2 than when each semiconductor element 10 and the conductive substrate 2 are bonded using a bonding material such as solder, for example. Thus, the semiconductor module A1 has a package structure favorable for preventing separation of each semiconductor element 10 and the conductive substrate 2.

In the semiconductor module A1 of the present embodiment, the Young's modulus of the first base layer 711 of the first conductive bonding material 71 is smaller than the Young's modulus of the constituent material of each of the first layer 712 and the second layer 713. With such a configuration, when the first conductive bonding material 71 is bonded to the conductive substrate 2 and the support substrate 3 by solid phase diffusion, stress is relieved by the relatively soft first base layer 711, whereby the bonding boundary is smoothed. Thus, the first layer 712 and the conductive substrate 2, and the second layer 713 and the support substrate 3 are more strongly bonded by solid-phase diffusion.

In the present embodiment, the thickness of the first base layer 711 is larger than the thickness of each of the first layer 712 and the second layer 713. This results in a more uniform pressing force acting on the boundary between the first layer 712 and the conductive substrate 2 (the reverse bonding layer 23) and the boundary between the second layer 713 and the support substrate 3 (the first bonding layer 321) during bonding by solid phase diffusion. Therefore, the first layer 712 and the conductive substrate 2, and the second layer 713 and the support substrate 3 can be held in a stronger conductive bonding state.

The constituent material of each of the first layer 712 and the second layer 713 includes silver. With such a configuration, during bonding by solid phase diffusion using the first conductive bonding material 71, oxidation of the first layer 712 and second layer 713 is suppressed, and good solid phase diffusion bonding is possible. In addition, each of the reverse bonding layer 23 and the first bonding layer 321, which are bonded to the first layer 712 and the second layer 713, also contains silver, which enables better solid-phase diffusion bonding.

In the present embodiment, the Young's modulus of the second base layer 721 of the second conductive bonding material 72 is smaller than the Young's modulus of the constituent material of each of the third layer 722 and the fourth layer 723. With such a configuration, when the second conductive bonding material 72 is bonded to the semiconductor element 10 (reverse electrode 15) and the conductive substrate 2 by solid phase diffusion, stress is relieved by the relatively soft second base layer 721, whereby the bonding boundary is smoothed. Thus, the third layer 722 and the semiconductor element 10 (the reverse electrode 15), and the fourth layer 723 and the conductive substrate 2 are more strongly bonded by solid-phase diffusion.

In the present embodiment, the thickness of the second base layer 721 is larger than the thickness of each of the third layer 722 and the fourth layer 723. This results in a more uniform pressing force acting on the boundary between the third layer 722 and the semiconductor element 10 (the reverse electrode 15) and the boundary between the fourth layer 723 and the conductive substrate 2 (the obverse bonding layer 22) during bonding by solid phase diffusion. Therefore, the third layer 722 and the semiconductor element 10 (the reverse electrode 15), and the fourth layer 723 and the conductive substrate 2 can be held in a stronger conductive bonding state.

The constituent material of each of the third layer 722 and the fourth layer 723 includes silver. With such a configuration, during bonding by solid phase diffusion using the second conductive bonding material 72, oxidation of the third layer 722 and fourth layer 723 is suppressed, and good solid phase diffusion bonding is possible. In addition, each of the reverse electrode 15 and the obverse bonding layer 22, which are bonded to the third layer 722 and the fourth layer 723, also contains silver, which enables better solid-phase diffusion bonding.

The first conductive bonding material 71 has a structure in which the first layer 712 and the second layer 713, which are Ag plating layers, are layered on the surfaces (both sides) of the first base layer 711 made of a sheet material containing A1. Also, the second conductive bonding material 72 has a structure in which the third layer 722 and the fourth layer 723, which are Ag plating layers, are layered on the surfaces (both sides) of the second base layer 721 made of a sheet material containing A1. With such a configuration, the first conductive bonding material 71 and the second conductive bonding material 72 can be easily prepared.

In the present embodiment, the conductive member 6 (the first conductive member 61 and the second conductive member 62) is provided by a plate made of a metal. This makes it easy to form openings 63 in the second conductive member 62. Regarding the conductive member 6 (the first conductive member 61 and the second conductive member 62) made of a metal plate, it is easy to accommodate various shapes and sizes, and the reliability of the joints with other parts can be improved by securing sufficient joint area with other parts.

The sealing resin 8 is formed with resin void portions 86 extending from the resin obverse surface 81 to the recesses 201a. The resin void portions 86 are tapered, with its sectional area decreasing as proceeding from the resin obverse surface 81 toward the recesses 201a. These resin void portions 86 are formed during the molding process (during formation of the sealing resin 8). After the molding, the surfaces of the recesses 201a in the obverse surface 201 of the conductive substrate 2 are exposed from the sealing resin 8. In the present embodiment, the resin fill portions 88 are loaded into the resin void portions 86 to fill the resin void portions 86. Such a configuration prevents foreign matter (including moisture) from entering the recesses 201a exposed from the sealing resin 8. The semiconductor module A1 having such a configuration is favorable for improving durability and reliability.

In the present embodiment, each opening 63 formed in the second conductive member 62 (the conductive member 6) is a through-hole penetrating in the z direction. With such a configuration, deviation of current paths due to the formation of the openings 63 is suppressed in the second conductive member 62 (the conductive member 6), which constitutes paths of the main circuit current.

The semiconductor module A1 includes the conductive member 6. The conductive member 6 constitutes paths of the main circuit current switched by the semiconductor elements 10. The conductive member 6 includes the first conductive members 61 connected to the first semiconductor elements 10A, and the second conductive member 62 connected to the second semiconductor elements 10B. The conductive member 6 (each of the first conductive member 61 and the second conductive member 62) is provided by a plate made of a metal. The main circuit current may have a relatively large value. In such a case, suppressing the parasitic resistance component in the conductive member 6, which constitutes paths of the main circuit current, is favorable for reducing the power consumption of the semiconductor module A1. In the semiconductor module A1, therefore, the parasitic resistance component in the conductive member 6 is suppressed by using a metal plate, not a bonding wire, to provide the conductive member 6. That is, the semiconductor module A1 has a favorable package structure for reducing the parasitic resistance component.

In the semiconductor module A1, each of the first semiconductor elements 10A is rectangular in plan view, and the four corners in plan view of each first semiconductor element 10A do not overlap with the second conductive member 62. Such a configuration allows conducting visual inspection to check whether or not each first semiconductor element 10A is properly bonded before the step of forming the sealing resin 8 during the process for manufacturing the semiconductor module A1. In other words, the semiconductor module A1 can be visually inspected for the bonding state of each first semiconductor element 10A during the manufacturing process, so that whether or not each first semiconductor element 10A is properly bonded can be determined. For example, the distances at the four corners of a first semiconductor element 10A may be measured by the laser ranging method, and when the difference in the measured distances at the four corners is small, it can be determined that the first semiconductor element 10A is properly bonded. In this way, visual inspection during the manufacturing process is possible, and the semiconductor module A1 has a package structure favorable for improving reliability. Visual inspection is possible when at least three of the four corners in plan view of a first semiconductor element 10A can be checked. Thus, it is only required that such three corners are configured so as not to overlap with the second conductive member 62. Also, the four corners in plan view of each second semiconductor element 10B as well do not overlap with the second conductive member 62, as shown in FIG. 7. Such a configuration allows conducting visual inspection to check whether or not each second semiconductor element 10B is properly bonded before the step of forming the sealing resin 8 during the process for manufacturing the semiconductor module A1. The visual inspection may be automated visual inspection using imaging and image processing.

The second conductive member 62 includes the first wiring portion 621, the second wiring portion 622, the third wiring portion 623, and the fourth wiring portion 624. The first wiring portion 621 and the second wiring portion 622 extend in the x direction and are connected to the input terminal 42 and the input terminal 43, respectively, that are disposed opposite to each other in the y direction with the input terminal 41 therebetween. The third wiring portion 623, which extends in the y direction, is connected to both the first wiring portion 621 and the second wiring portion 622 and connected to each of the second semiconductor elements 10B. The fourth wiring portion 624 is connected to both the first wiring portion 621 and the second wiring portion 622. The fourth wiring portion 624 is located in the x2 direction with respect to the third wiring portion 623 and overlaps with the first semiconductor elements 10A in plan view. The second conductive member 62, which includes the first wiring portion 621, the second wiring portion 622, the third wiring portion 623 and the fourth wiring portion 624, overlaps with a large area of the obverse surface 201 in in plan view, and its size in plan view is relatively large. Increasing the size of the second conductive member 62 in plan view in this way is more favorable for suppressing the parasitic resistance component of the second conductive member 62 (the conductive member 6) that constitutes paths of the main circuit current.

Each of the first semiconductor elements 10A has a first side 191, a second side 192, a third side 193, and a fourth side 194 in plan view. Each of the first side 191 and the second side 192 extends in the y direction. The first side 191 is the end edge on the x2 side in plan view, while the second side 192 is the end edge on the x1 side in plan view. Each of the third side 193 and the fourth side 194 extends in the x direction. The third side 193 is the end edge on the y2 side in plan view, while the fourth side 194 is the end edge on the y1 side in plan view. Because each of the first semiconductor elements 10A is rectangular in plan view, the four corners formed by the first side 191, the second side 192, the third side 193 and the fourth side 194 are right angles (or approximately right angles). Meanwhile, the fourth wiring portion 624 (the first strip portion 625) of the second conductive member 62 has a first edge 627 and a second edge 628. The first edge 627 is the end edge on the x2 side of the fourth wiring portion 624 and is located in the x1 direction from the first side 191 in plan view. In addition, the first edge 627 extends at least from the third side 193 to the fourth side 194 in the y direction. With such a configuration, the two corners 171 and 172 on the x2 side of each first semiconductor element 10A do not overlap with the second conductive member 62 in plan view. The second edge 628 is the end edge on the x1 side of the fourth wiring portion 624 (the first strip portion 625) and is located in the x2 direction from the second side 192 in plan view. In addition, the second edge 628 extends at least from the third side 193 to the fourth side 194 in the y direction. With such a configuration, the two corners 173 and 174 on the x1 side of each first semiconductor element 10A do not overlap with the second conductive member 62 in plan view. With such a configuration, the size of the second conductive member 62 in plan view is increased by securing, in the fourth wiring portion 624, the area that overlaps with each first semiconductor element 10A in plan view, while the four corners of the first semiconductor element 10A do not overlap with the second conduction member 62 in plan view. Thus, the parasitic resistance component of the second conductive member 62 (the conductive member 6) is effectively suppressed, while the bonding state of each first semiconductor element 10A can be visually inspected during the manufacturing of the semiconductor module A1.

The fourth wiring portion 624 (the first strip portion 625) includes raised regions 625a protruding in the z2 direction relative to other portions. Each raised region 625a overlaps with a first semiconductor element 10A in plan view. With the configuration in which the fourth wiring portion 624 has the raised regions 625a, it is possible to prevent the fourth wiring portion 624 from unduly coming into contact with the first conductive members 61 bonded to the first semiconductor elements 10A.

The third wiring portion 623 has dented regions 623a protruding in the z1 direction relative to other portions. Each dented region 623a is bonded to one of the second semiconductor elements 10B. With such a configuration, it is possible to make large the size of the third wiring portion 623 (the second conductive member 62) in plan view while appropriately providing electrical connection between the third wiring portion 623 (the second conductive member 62) and the second semiconductor elements 10B.

The first semiconductor elements 10A and the second semiconductor elements 10B overlap with each other as viewed in the x direction. According to this configuration, it is possible to suppress the increase in the dimension in the y direction of the conductive substrate 2 (the first conductive portion 2A and the second conductive portion 2B) on which the first semiconductor elements 10A and the second semiconductor elements 10B are disposed, and to thereby downsize the semiconductor module A1.

The semiconductor module A1 has the conductive substrate 2, two input terminals 41 and 42 (or two input terminals 41 and 43), the output terminal 44, and the conductive member 6. The conductive substrate 2 includes the first conductive portion 2A and the second conductive portion 2B arranged along the x direction in plan view. The first semiconductor elements 10A are electrically bonded to the first conductive portion 2A. The second semiconductor elements 10B are electrically bonded to the second conductive portion 2B. The first semiconductor elements 10A are disposed at intervals along the y direction, so are the second semiconductor elements 10B. The two input terminals 41 and 42 (or the two input terminals 41 and 43) are located in the x2 direction with respect to the first conductive portion 2A. The input terminal 41 is a positive electrode and connected to the first conductive portion 2A. The input terminal 42 (or the input terminal 43) is a negative electrode. The output terminals 44 are located in the x1 direction with respect to the second conductive portion 2B. The conductive member 6 includes the first conductive members 61 connected to the first semiconductor elements 10A and the second conductive portion 2B, and the second conductive member 62 connected to the second semiconductor elements 10B and the input terminal 42 (or the input terminal 43). With such a configuration, the paths of the main circuit current switched by the semiconductor elements 10 (the first semiconductor elements 10A and the second semiconductor elements 10B) are configured to extend along the x direction in plan view, while the axis of symmetry in the planar structure of the semiconductor module A1 (see the auxiliary line L1 in FIG. 7) is configured to extend along the y direction in plan view. That is, the above-mentioned axis of symmetry and the above-mentioned paths of the main circuit current are orthogonal to each other. This reduces differences in the current paths to the first semiconductor elements 10A and the second semiconductor elements 10B for the main circuit current inputted from the two input terminals 41, 42 (or two input terminals 41, 43) and outputted from the output terminal 44. That is, variations in the parasitic inductance components and variations in the current in the semiconductor module A1 can be suppressed. Thus, the semiconductor module A1 has a package structure favorable for equalizing the parasitic inductance components in the paths of the main circuit current and equalizing the amount of current to the semiconductor elements 10.

The first semiconductor elements 10A and the second semiconductor elements 10B are spaced apart from each other in the x direction. The first semiconductor elements 10A are aligned along the y direction, so are the second semiconductor elements 10B. Thus, the direction in which the semiconductor elements 10 are aligned and the direction in which the first main circuit current or the second main circuit current flows are orthogonal to each other. When using a plurality of switching elements connected in parallel as in the present embodiment, the above configuration suppresses a difference in the length of the current path of the first main circuit current among three first semiconductor elements 10A. Thus, parasitic resistance components in the conductive member 6, which is a path of the main circuit current, can be suppressed.

The area where the first main circuit current flows and the area where the second main circuit current flows are configured to overlap with each other in plan view. That is, the second conductive member 62, which connects the output terminal 44 and the input terminals 42 and 43 that are negative electrode terminals in order to pass the second main circuit current, is disposed above the area where the first main circuit current flows (the first conductive portion 2A, the first conductive member 61 and the second conductive portion 2B). The direction in which the first main circuit current flows is opposite to the direction in which the second main circuit current flows. The above arrangement allows the magnetic field generated by the first main circuit current and the magnetic field generated by the second main circuit current to cancel each other out, thereby reducing inductance.

The semiconductor module A1 of the present embodiment includes two input terminals 42 and 43. These input terminals 42 and 43 are both negative electrodes and flanks the input terminal 41 in the y direction. The second conductive member 62 is connected to the two input terminals 42 and 43. Such a configuration can further reduce variations in the paths of the current flowing from the output terminal 44 through each second semiconductor element 10B and the second conductive member 62 to each of the input terminals 42 and 43.

In the semiconductor module A1, the second conductive member 62 includes the first wiring portion 621, the second wiring portion 622, the third wiring portion 623, and the fourth wiring portion 624. The first wiring portion 621 and the second wiring portion 622 extend in the x direction and are connected to the input terminal 42 and the input terminal 43, respectively, that are disposed opposite to each other in the y direction with the input terminal 41 therebetween. The third wiring portion 623 is connected to both the first wiring portion 621 and the second wiring portion 622 by extending in the y direction, and connected to each of the second semiconductor elements 10B. The fourth wiring portion 624 is located in the x2 direction from the third wiring portion 623 and connected to all of the first wiring portion 621, the second wiring portion 622 and the third wiring portion 623. The second conductive member 62, which includes the first wiring portion 621, the second wiring portion 622, the third wiring portion 623 and the fourth wiring portion 624, overlaps with a large area of the obverse surface 201 in in plan view, and its size in plan view is relatively large. Such a configuration appropriately reduces variations in the paths of the current flowing from the output terminal 44 through each second semiconductor element 10B and the second conductive member 62 to each of the input terminals 42 and 43. Therefore, the semiconductor module A1 of the present embodiment is more favorable for equalizing the parasitic inductance components in the paths of the main circuit current (the second conductive member 62) and equalizing the amount of current to the second semiconductor elements 10B.

The fourth wiring portion 624 is connected to both the first wiring portion 621 and the second wiring portion 622 and overlaps with the first semiconductor elements 10A in in plan view. The fourth wiring portion 624 (the first strip portion 625) includes raised regions 625a protruding in the z2 direction relative to other portions. Each raised region 625a overlaps with a first semiconductor element 10A in plan view. With such a configuration, it is possible to prevent the fourth wiring portion 624 from unduly coming into contact with the first conductive member 61 bonded to the first semiconductor elements 10A while securing a large size in plan view of the fourth wiring portion 624 (the second conductive member 62).

The first semiconductor elements 10A and the second semiconductor elements 10B overlap with each other as viewed in the x direction. According to this configuration, it is possible to suppress the increase in the dimension in the y direction of the conductive substrate 2 (the first conductive portion 2A and the second conductive portion 2B) on which the first semiconductor elements 10A and the second semiconductor elements 10B are disposed, and to thereby downsize the semiconductor module A1.

FIGS. 23 to 26 show other embodiments of the present invention. In these figures, the same or similar elements as those of the above embodiment are denoted by the same reference signs. The configurations of various parts in the variations and embodiments may be selectively used in an any appropriate combination as long as such combination is technically compatible.

First Embodiment, First Variation

Figure 23:
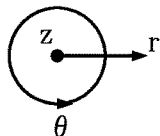
FIG. 23 is a plan view of a first variation of the power conversion device according to the first embodiment.

FIG. 23 shows a first variation of the power conversion device B1. The power conversion device B11 of the present variation differs from the semiconductor module A1 in positional relationship between the above-mentioned intersection Cp and the center point Oz.

The intersection Cp of the present variation is away from the center point Oz as viewed in the z direction. However, the intersection Cp is inside the capacitor body 90 as viewed in the z direction.

According to such a variation again, the inductances between the capacitor module C11 and the first semiconductor module A11, the second semiconductor module A12 and the third semiconductor module A13 can be made more uniform. As will be understood from the present variation, the power conversion device of the present disclosure is not limited to the configuration in which the center point Oz and the intersection Cp coincide with each other.

First Embodiment, Second Variation

Figure 24:
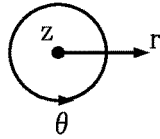
FIG. 24 is a plan view of a second variation of the power conversion device according to the first embodiment.

FIG. 24 shows a second variation of the power conversion device B1. In the power converter B12 of the present variation, the center lines OL1, OL2, and OL3 do not intersect at one point, such as the intersection Cp described above.

In the present variation, as viewed in the z direction, the center line OL1 and the center line OL2 intersect at the intersection Cp1, the center line OL2 and the center line OL3 intersect at the intersection Cp2, and the center line OL3 and the center line OL1 intersect at the intersection Cp3. The intersection Cp1, the intersection Cp2, and the intersection Cp3 are spaced apart from each other as viewed in the z direction. However, all of the intersection Cp1, the intersection Cp2 and the intersection Cp3 overlap with the capacitor body 90 as viewed in the z direction.

According to such a variation again, the inductances between the capacitor module C12 and the first semiconductor module A11, the second semiconductor module A12 and the third semiconductor module A13 can be made more uniform. As will be understood from the present variation, the power conversion device of the present disclosure is not limited to the configuration in which the center lines OL1, OL2, and OL3 intersect at one point.

Second Embodiment

Figure 25:
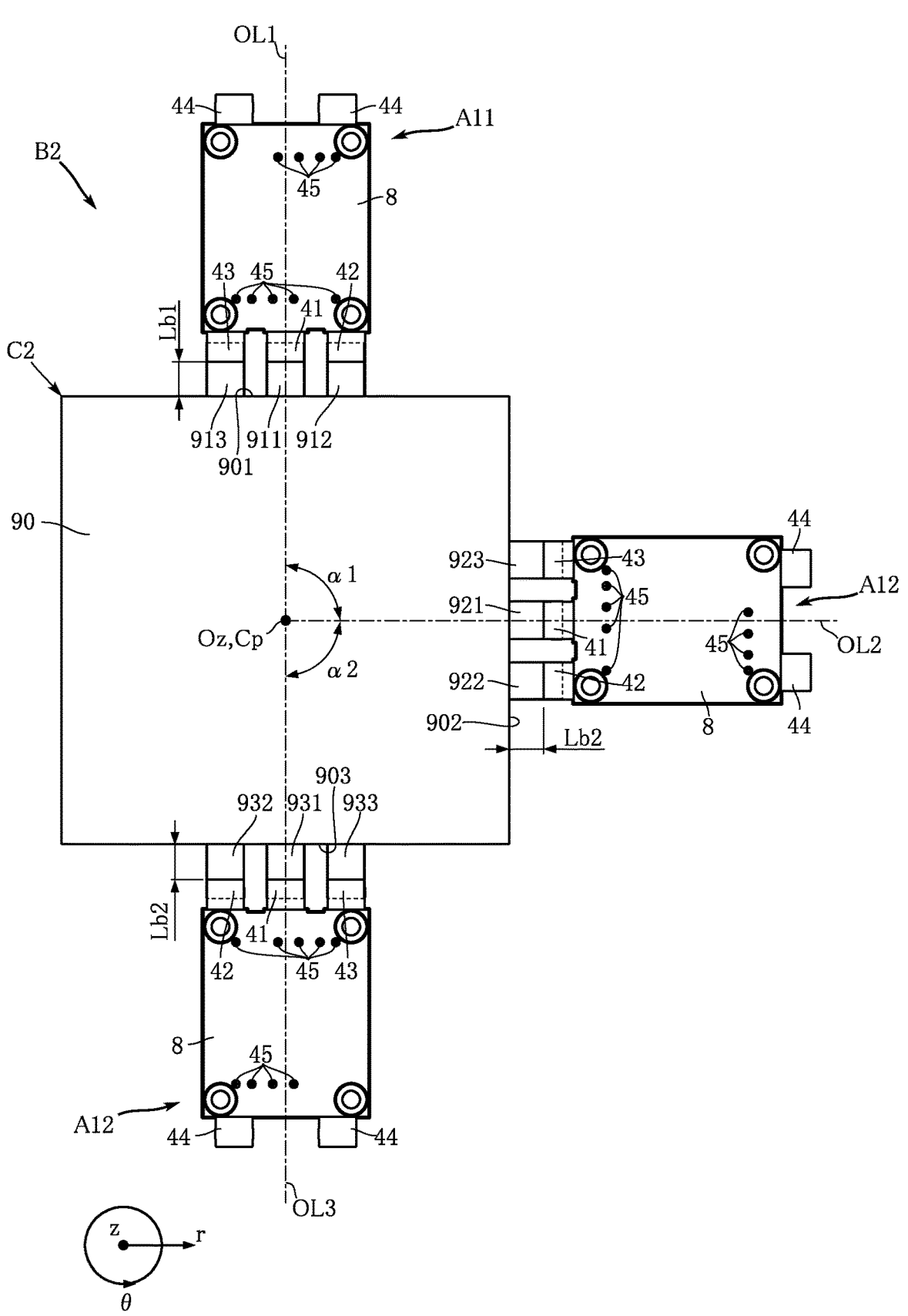
FIG. 25 is a plan view of a power conversion device according to a second embodiment.

FIG. 25 shows a power conversion device according to a second embodiment. The power conversion device B2 according to the present embodiment is shown. The power conversion device B2 of the present embodiment differs from the above-described embodiment in magnitude of the first angle α1 and the second angle α2.

In the present embodiment, the first angle α1 and the second angle α2 are set to 90°. That is, in the capacitor module C2 included in the power conversion device B2, the relative angles of the first surface 901, the second surface 902 and the third surface 903 are different, and the angle formed by adjacent ones of these surfaces is set to 90°. As a result, a 90° angle is defined between the first busbars 911, 912 and 913 and the second busbars 921, 922 and 923 and between the second busbars 921, 922 and 923 and the third busbars 931, 932 and 933.

With such first angle α1 and the second angle α2 as well, the first semiconductor module A11, the second semiconductor module A12 and the third semiconductor module A13 are arranged in a biased manner (arrangement that is not line symmetrical or point symmetrical as viewed in the z direction) with respect to the capacitor body 90.

According to such a variation again, the inductances between the capacitor module C2 and the first, the second and the third semiconductor modules A11, A12 and A13 can be made more uniform. As will be understood from the present embodiment, the magnitude of the first angle α1 and the second angle α2 is not limited in any way, and any angles other than 450 and 90° can be selected.

Third Embodiment

Figure 26:
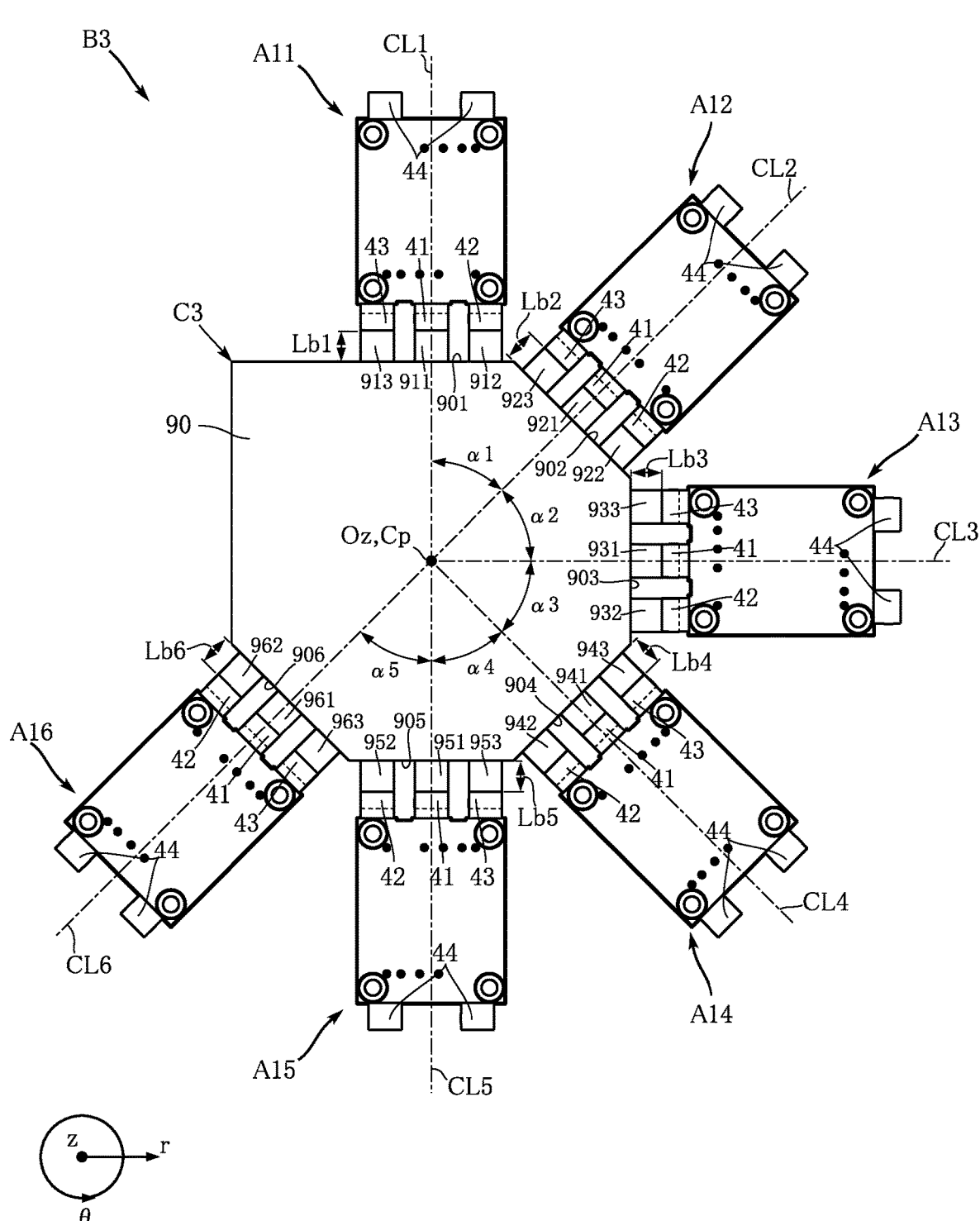
FIG. 26 is a plan view of a power conversion device according to a third embodiment.

FIG. 26 shows a power conversion device according to a third embodiment. The power conversion device B3 of the present embodiment includes a first semiconductor module A11, a second semiconductor module A12, a third semiconductor module A13, a fourth semiconductor module A14, a fifth semiconductor module A15, a sixth semiconductor module A16, and a capacitor module C3.

Each of the first semiconductor module A11, the second semiconductor module A12, the third semiconductor module A13, the fourth semiconductor module A14, the fifth semiconductor module A15, and the sixth semiconductor module A16 may employ the configuration described above as the semiconductor module A1. However, the first semiconductor module A11, the second semiconductor module A12, the third semiconductor module A13, the fourth semiconductor module A14, the fifth semiconductor module A15, and the sixth semiconductor module A16 may have a configuration different from the semiconductor module A1. Also, some or all of the first semiconductor module A11, the second semiconductor module A12, the third semiconductor module A13, the fourth semiconductor module A14, the fifth semiconductor module A15, and the sixth semiconductor module A16 may have different configurations from each other.

The capacitor body 90 of the capacitor module C3 has a first surface 901, a second surface 902, a third surface 903, a fourth surface 904, a fifth surface 905, and a sixth surface 906. The first surface 901 is a surface orthogonal to the center line OL1. The second surface 902 is a surface orthogonal to the center line OL2. The third surface 903 is a surface orthogonal to the center line OL3. The fourth surface 904 is a surface orthogonal to the center line OL4. The fifth surface 905 is a surface orthogonal to the center line OL5. The sixth surface 906 is a surface orthogonal to the center line OL6.

The angles formed by the first surface 901, the second surface 902, the third surface 903, the fourth surface 904, the fifth surface 905 and the sixth surface 906 are not limited. In the illustrated example, the angle formed by the first surface 901 and the second surface 902 is 45°. The angle formed by the second surface 902 and the third surface 903 is 45°. The angle formed by the third surface 903 and the fourth surface 904 is 45°. The angle formed by the fourth surface 904 and the fifth surface 905 is 45°. The angle formed by the fifth surface 905 and the sixth surface 906 is 45°.

In the illustrated example, the first surface 901, the second surface 902, the third surface 903, the fourth surface 904, the fifth surface 905 and the sixth surface 906 are orthogonal to a radial line passing through the center point Oz and extending in an r direction. The first surface 901, the second surface 902, the third surface 903, the fourth surface 904, the fifth surface 905 and the sixth surface 906 are located next to each other.

First busbars 911, 912 and 913 protrude from the first surface 901. Second busbars 921, 922 and 923 protrude from the second surface 902. Third busbars 931, 933 and 933 protrude from the third surface 903. Fourth busbars 941, 942 and 943 protrude from the fourth surface 904. Fifth busbars 951, 952 and 953 protrude from the fifth surface 905. Sixth busbars 961, 962 and 963 protrude from the sixth surface 906.

In the first semiconductor module A11, the input terminal 41 is connected to the first busbar 911, the input terminal 42 is connected to the first busbar 912, and the input terminal 43 is connected to the first busbar 913. In the second semiconductor module A12, the input terminal 41 is connected to the second busbar 921, the input terminal 42 is connected to the second busbar 922, and the input terminal 43 is connected to the second busbar 923. In the third semiconductor module A13, the input terminal 41 is connected to the third busbar 931, the input terminal 42 is connected to the third busbar 932, and the input terminal 43 is connected to the third busbar 933. In the fourth semiconductor module A14, the input terminal 41 is connected to the fourth busbar 941, the input terminal 42 is connected to the fourth busbar 942, and the input terminal 43 is connected to the fourth busbar 943. In the fifth semiconductor module A15, the input terminal 41 is connected to the fifth busbar 951, the input terminal 42 is connected to the fifth busbar 952, and the input terminal 43 is connected to the fifth busbar 953. In the sixth semiconductor module A16, the input terminal 41 is connected to the sixth busbar 961, the input terminal 42 is connected to the sixth busbar 962, and the input terminal 43 is connected to the sixth busbar 963.

Center lines OL4, OL5 and OL6 are the center lines of the fourth semiconductor module A14, the fifth semiconductor module A15, and the sixth semiconductor module A16, respectively, and defined in the same manner as the center lines OL1, OL2 and OL3 of the first semiconductor module A11, the second semiconductor module A12, and the third semiconductor module A13.

In the illustrated example, the center lines OL1 to OL6 intersect with each other at the intersection Cp. In the illustrated example, the intersection Cp coincides with the center point Oz of the capacitor body 90. However, as mentioned before, the present disclosure is not limited to the configuration in which the intersection Cp and the center point Oz coincide with each other, nor is it limited to a configuration in which the center lines OL1 to OL6 intersect at one point.

The length Lb4 of the fourth busbars 941, 942 and 943, the length Lb5 of the fifth busbars 951, 952 and 953, and the length Lb6 of the sixth busbars 961, 962 and 963 are defined in the same manner as the lengths Lb1, Lb2 and Lb3. The lengths Lb1 to Lb6 are the same as each other.

According to the present embodiment again, the inductances between the capacitor module C3 and the first semiconductor module A11, the second semiconductor module A12, the third semiconductor module A13, the fourth semiconductor module A14, the fifth semiconductor module A15 and the sixth semiconductor module A16 can be made more uniform. As will be understood from the present embodiment, the number of semiconductor modules included in the power conversion device of the present disclosure is not limited.

The power conversion device according to the present invention is not limited to the above-described embodiments. Various modifications in design may be made freely in the specific structure of each part of the power conversion device according to the present invention.

The present disclosure includes embodiments described in the following clauses.

Clause B1.

A power conversion device comprising:
a first semiconductor module, a second semiconductor module, and a third semiconductor module each including a semiconductor element having a switching function and an input terminal; and
a capacitor module connected to the input terminals of the first semiconductor module, the second semiconductor module and the third semiconductor module, wherein
the capacitor module includes a capacitor body, and a first busbar, a second busbar and a third busbar protruding from the capacitor body,
the input terminal of the first semiconductor module is connected to the first busbar,
the input terminal of the second semiconductor module is connected to the second busbar,
the input terminal of the third semiconductor module is connected to the third busbar,
as viewed in an axial direction of a cylindrical coordinate system about a central axis intersecting the capacitor body, a first center line of the first semiconductor module, a second center line of the second semiconductor module, and a third center line of the third semiconductor module intersect the capacitor body,
a first angle formed by the first center line and the second center line and a second angle formed by the second center line and the third center line are equal to each other, and
lengths of the first busbar, the second busbar and the third busbar are equal to each other.

Clause B2.

The power conversion device according to clause B1, wherein the first center line, the second center line and the third center line are parallel to a radial direction of the cylindrical coordinate system.

Clause B3.

The power conversion device according to clause B2, wherein the input terminal of the first semiconductor module extends along the first center line,
the input terminal of the second semiconductor module extends along the second center line, and the input terminal of the third semiconductor module extends along the third center line.

Clause B4.

The power conversion device according to clause B2 or B3, wherein the first center line, the second center line and the third center line intersect with each other at an intersection inside the capacitor body as viewed in the axial direction.

Clause B5.

The power conversion device according to clause B4, wherein the intersection overlaps with a center point of the capacitor body as viewed in the axial direction.

Clause B6.

The power conversion device according to any one of clauses B2 to B5, wherein the capacitor body includes a first surface which is orthogonal to the first center line and from which the first busbar protrudes, a second surface which is orthogonal to the second center line and from which the second busbar protrudes, and a third surface which is orthogonal to the third center line and from which the third busbar protrudes.

Clause B7.

The power conversion device according to any one of clauses B2 to B6, wherein each of the first semiconductor module, the second semiconductor module and the third semiconductor module includes a first input terminal, a second input terminal and a third input terminal protruding toward a same side in the radial direction and arranged along a circumferential direction of the cylindrical coordinate system as viewed in the axial direction,
the second input terminal and the third input terminal are disposed on one side and on another side in the circumferential direction across the first input terminal,
the first input terminal is one of positive and negative poles, and
the second input terminal is another one of positive and negative poles.

Clause B8.

The power conversion device according to any one of clauses B2 to B7, wherein each of the first semiconductor module, the second semiconductor module and the third semiconductor module includes an output terminal protruding toward an opposite side from the input terminal.

Clause B9.

The power conversion device according to any one of clauses B2 to B8, configured as an inverter that combines the switching functions of the first semiconductor module, the second semiconductor module and the third semiconductor module.

Clause B10.

The power conversion device according to any one of clauses B2 to B9, wherein the first angle and the second angle are 45°.

Clause B11.

The power conversion device according to any one of clauses B2 to B10, wherein the first angle and the second angle are 90°.

Clause B12.

The power conversion device according to any one of clauses B2 to B9, further comprising a fourth semiconductor module, a fifth semiconductor module and a sixth semiconductor module each including a semiconductor element having a switching function and an input terminal,
wherein the capacitor module includes a fourth busbar, a fifth busbar and a sixth busbar protruding from the capacitor body, the input terminal of the fourth semiconductor module is connected to the fourth busbar, the input terminal of the fifth semiconductor module is connected to the fifth busbar, the input terminal of the sixth semiconductor module is connected to the sixth busbar, as viewed in the axial direction, a fourth center line of the fourth semiconductor module, a fifth center line of the fifth semiconductor module, and a sixth center line of the sixth semiconductor module intersect the capacitor body, a third angle formed by the third center line and the fourth center line, a fourth angle formed by the fourth center line and the fifth center line, and a fifth angle formed by the fifth center line and the sixth center line are equal to the first angle and the second angle, and lengths of the first busbar, the second busbar, the third busbar, the fourth busbar, the fifth busbar and the sixth busbar are equal to each other.

Clause B13.

The power conversion device according to clause B12, wherein the first center line, the second center line, the third center line, the fourth center line, the fifth center line and the sixth center line intersect with each other at an intersection inside the capacitor body as viewed in the axial direction.

Clause B14.

The power conversion device according to clause B13, wherein the intersection overlaps with the center point of the capacitor body as viewed in the axial direction.

Clause B15.

The power conversion device according to clause B14, wherein the first angle, the second angle are, the third angle, the fourth angle and the fifth angle are 45°.

Clause B16.

The power conversion device according to any one of clauses B12 to B15, wherein each of the fourth semiconductor module, the fifth semiconductor module and the sixth semiconductor module includes a first input terminal, a second input terminal and a third input terminal protruding toward a same side in the radial direction and arranged along a circumferential direction of the cylindrical coordinate system as viewed in the axial direction, the second input terminal and the third input terminal are disposed on one side and on another side in the circumferential direction across the first input terminal, the first input terminal is one of positive and negative poles, and the second input terminal is another one of positive and negative poles.

Clause B17.

The power conversion device according to any one of clauses B12 to B16, configured as an inverter that combines the switching functions of the fourth semiconductor module, the fifth semiconductor module and the sixth semiconductor module.

Clause A1.

A semiconductor module comprising:

a conductive substrate including an obverse surface facing a first side in a thickness direction and a reverse surface facing an opposite side from the obverse surface;

a semiconductor element electrically bonded to the obverse surface and having a switching function;

a conductive member constituting a path for a main circuit current switched by the semiconductor element;

a first input terminal, a second input terminal and a third input terminal disposed on a first side in a first direction orthogonal to the thickness direction with respect to the conductive substrate; and an output terminal disposed on a second side in the first direction with respect to the conductive substrate, wherein the conductive substrate includes a first conductive portion and a second conductive portion, the semiconductor element includes a first semiconductor element electrically bonded to the first conductive portion and a second semiconductor element electrically bonded to the second conductive portion, the second input terminal and the third input terminal are disposed on a first side and on a second side in a second direction orthogonal to both the thickness direction and the first direction across the first input terminal, the first input terminal is one of positive and negative poles and electrically connected to the first conductive portion, and the second input terminal and the third input terminal each are another one of positive and negative poles.

Clause A2.

The semiconductor module according to clause A1, wherein the first input terminal is electrically connected to the first conductive portion, the output terminal is electrically connected to the second conductive portion, and the conductive member includes a first conductive member connected to the first semiconductor element and the second conductive portion, and a second conductive member connected to the second semiconductor element and the second and the third input terminals and overlapping with the first semiconductor element as viewed in the thickness direction.

Clause A3.

The semiconductor module according to clause A2, wherein the first conductive portion and the second conductive portion are disposed on the first side in the first direction and on the second side in the first direction, respectively, and the second conductive member includes: a first wiring portion connected to the second input terminal and extending in the first direction; a second wiring portion connected to the third input terminal and extending in the first direction; a third wiring portion connected to both the first wiring portion and the second wiring portion, extending in the second direction, and connected to the second semiconductor element; and a fourth wiring portion connected to both the first wiring portion and the second wiring portion, located on the first side in the first direction with respect to the third wiring portion, and overlapping with the first semiconductor element as viewed in the thickness direction.

Clause A4.

The semiconductor module according to clause A3, wherein each of the first semiconductor element and the second semiconductor element includes a source electrode facing the first side in the thickness direction and a drain electrode facing a second side in the thickness direction, the first conductive member is connected to the source electrode of the first semiconductor element, the first conductive portion is connected to the drain electrode of the first semiconductor element, the third wiring portion is connected to the source electrode of the second semiconductor element, and the second conductive portion is connected to the drain electrode of the second semiconductor element.

Clause A5.

The semiconductor module according to clause A4, wherein the first semiconductor element and the second semiconductor element overlap with each other as viewed in the first direction.

Clause A6.

The semiconductor module according to clause A5, wherein the fourth wiring portion includes a first strip portion and a second strip portion, the first strip portion is spaced apart from the third wiring portion in the first direction, connected to both the first wiring portion and the second wiring portion by extending in the second direction, and overlaps with the first semiconductor element as viewed in the thickness direction, and as viewed in the thickness direction, the second strip portion has one end connected to the first strip portion between the first semiconductor elements adjacent to each other, and another end connected to the third wiring portion between the second semiconductor elements adjacent to each other.

Clause A7.

The semiconductor module according to clause A6, wherein the first strip portion includes a raised region overlapping with the first semiconductor element as viewed in the thickness direction and protruding toward the first side in the thickness direction relative to other portions.

Clause A8.

The semiconductor module according to any one of clauses A3 to A7, wherein the third wiring portion includes a dented region protruding toward the second side in the thickness direction relative to other portions, and the dented region is bonded to the second semiconductor element.

Clause A9.

The semiconductor module according to any one of clauses A3 to A8, comprising a first control terminal and a second control terminal for controlling the first semiconductor element and the second semiconductor element, wherein each of the first control terminal and the second control terminal is disposed on the obverse surface and extends along the thickness direction.

Clause A10.

The semiconductor module according to clause A9, wherein the first control terminal is supported on the first conductive portion and disposed on the first side in the first direction with respect to the first semiconductor element, and the second control terminal is supported on the second conductive portion and disposed on the second side in the first direction with respect to the second semiconductor element.

Clause A11.

The semiconductor module according to clause A10, wherein each of the first semiconductor element and the second semiconductor element includes a gate electrode facing the first side in the thickness direction, the first control terminal is connected to the gate electrode of the first semiconductor element via a conductive first wire, and the second control terminal is connected to the gate electrode of the second semiconductor element via a conductive second wire.

Clause A12.

The semiconductor module according to any one of clauses A1 to A11, wherein the first input terminal, the second input terminal and the third input terminal overlap with each other as viewed in the second direction.

Clause A13.

The semiconductor module according to any one of clauses A1 to A12, wherein the conductive member comprises a metal plate.

Clause A14.

The semiconductor module according to any one of clauses A1 to A13, wherein each of the first input terminal, the second input terminal and the third input terminal includes an input-side bond surface extending toward the first side in the first direction and facing the first side in the thickness direction, and the output terminal includes an output-side bond surface extending toward the second side in the first direction and facing the first side in the thickness direction.

Clause A15.

The semiconductor module according to any one of clauses A1 to A14, wherein each of the first input terminal, the second input terminal and the third input terminal includes an input-side side surface located at an edge of the input-side bond surface as viewed in the thickness direction and facing in a direction intersecting the input-side bond surface, and an input-side processing trace formed at the input-side side surface, and the output terminal includes an output-side side surface located at an edge of the output-side bond surface as viewed in the thickness direction and facing in a direction intersecting the output-side bond surface, and an output-side processing trace formed at the output-side side surface.

Clause A16.

The semiconductor module according to any one of clauses A1 to A15, further comprising a sealing resin covering at least a part of the conductive substrate, the semiconductor element, and the conductive member.

Clause A17.

The semiconductor module according to any one of clauses A3 to A12, comprising:

a plurality of the first semiconductor elements disposed at intervals along the second direction, and a plurality of the second semiconductor elements disposed at intervals along the second direction.

Clause A18.

A semiconductor module comprising:

a conductive substrate including an obverse surface facing a first side in a thickness direction and a reverse surface facing an opposite side from the obverse surface;

a semiconductor element electrically bonded to the obverse surface and having a switching function;

a conductive member constituting a path for a main circuit current switched by the semiconductor element and spaced apart from the obverse surface toward the first side in the thickness direction;

a first input terminal, a second input terminal and a third input terminal disposed on a first side in a first direction orthogonal to the thickness direction with respect to the conductive substrate; and an output terminal disposed on a second side in the first direction with respect to the conductive substrate, wherein the conductive substrate includes a first conductive portion and a second conductive portion spaced apart from each other as viewed in the thickness direction, the semiconductor element includes a plurality of first semiconductor elements electrically bonded to the first conductive portion and a plurality of second semiconductor elements electrically bonded to the second conductive portion, the second input terminal and the third input terminal are disposed on a first side and on a second side in a second direction orthogonal to both the thickness direction and the first direction across the first input terminal, the first input terminal is connected to the first conductive portion, the output terminal is connected to the second conductive portion, and the conductive member includes a first conductive member connected to the plurality of first semiconductor elements and the second conductive portion, and a second conductive member connected to the plurality of second semiconductor elements and the second and the third input terminals and overlapping with the first semiconductor elements as viewed in the thickness direction.

Clause A19.

The semiconductor module according to clause A18, wherein the first conductive portion and the second conductive portion are disposed on the first side in the first direction and on the second side in the first direction, respectively, the plurality of first semiconductor elements are disposed at intervals along the second direction, while the plurality of second semiconductor elements are disposed at intervals along the second direction, and the second conductive member includes: a first wiring portion connected to the second input terminal and extending in the first direction; a second wiring portion connected to the third input terminal and extending in the first direction; a third wiring portion connected to both the first wiring portion and the second wiring portion, extending in the second direction, and connected to each of the plurality of second semiconductor elements; and a fourth wiring portion connected to both the first wiring portion and the second wiring portion, located on the first side in the first direction with respect to the third wiring portion, and overlapping with the plurality of first semiconductor elements as viewed in the thickness direction.

Clause A20.

The semiconductor module according to clause A19, wherein each of the first semiconductor element and the second semiconductor element includes a source electrode facing the first side in the thickness direction and a drain electrode facing a second side in the thickness direction, the first conductive member is connected to the source electrode of the first semiconductor element, the first conductive portion is connected to the drain electrode of the first semiconductor element, the third wiring portion is connected to the source electrode of the second semiconductor element, and the second conductive portion is connected to the drain electrode of the second semiconductor element.

Clause A21.

The semiconductor module according to clause A20, wherein the plurality of first semiconductor elements and the plurality of second semiconductor elements overlap with each other as viewed in the first direction.

Clause A22.

The semiconductor module according to clause A21, wherein the fourth wiring portion includes a first strip portion and a second strip portion, the first strip portion is spaced apart from the third wiring portion in the first direction, connected to both the first wiring portion and the second wiring portion by extending in the second direction, and overlaps with the plurality of first semiconductor elements as viewed in the thickness direction, and as viewed in the thickness direction, the second strip portion has one end connected to the first strip portion between the first semiconductor elements adjacent to each other, and another end connected to the third wiring portion between the second semiconductor elements adjacent to each other.

Clause A23.

The semiconductor module according to clause A22, wherein the first strip portion includes a plurality of raised regions overlapping with the first semiconductor elements, respectively, as viewed in the thickness direction and protruding toward the first side in the thickness direction relative to other portions.

Clause A24.

The semiconductor module according to any one of clauses A19 to A23, wherein the third wiring portion includes a plurality of dented regions protruding toward the second side in the thickness direction relative to other portions, and each of the dented regions is bonded to one of the plurality of second semiconductor elements.

Clause A25.

The semiconductor module according to any one of clauses A19 to A24, comprising a plurality of first control terminals and a plurality of second control terminals for controlling the plurality of first semiconductor elements and the plurality of second semiconductor elements, wherein each of the first control terminals and the second control terminals is disposed on the obverse surface and extends along the thickness direction.

Clause A26.

The semiconductor module according to clause A25, wherein the plurality of first control terminals are supported on the first conductive portion and disposed at intervals along the second direction on the first side in the first direction with respect to the plurality of first semiconductor elements, and the plurality of second control terminals are supported on the second conductive portion and disposed at intervals along the second direction on the second side in the first direction with respect to the plurality of second semiconductor elements.

Clause A27.

The semiconductor module according to clause A26, wherein each of the first semiconductor element and the second semiconductor element includes a gate electrode facing the first side in the thickness direction, the first control terminal is connected to the gate electrode of the first semiconductor element via a conductive first wire, and the second control terminal is connected to the gate electrode of the second semiconductor element via a conductive second wire.

Clause A28.

The semiconductor module according to any one of clauses A18 to A27, wherein the first input terminal, the second input terminal and the third input terminal overlap with each other as viewed in the second direction.

Clause A29.

The semiconductor module according to any one of clauses A18 to A28, wherein the first conductive member and the second conductive member comprise metal plates.

REFERENCE NUMERALS

A1, A11, A12, A13, A14, A15, A16: Semiconductor module
B1, B11, B12, B2, B3: Power conversion device
C1, C2, C3: Capacitor module
2: Conductive substrate 2A: First conductive portion
2B: Second conductive portion 3: Support substrate
5: Control terminal support 5A: First support portion
5B: Second support portion 6: Conductive member
8: Sealing resin 10: Semiconductor element
10A: Semiconductor element (First semiconductor element)
10B: Second semiconductor element
11: Obverse electrode (First obverse electrode)
12: Second obverse electrode
13: Obverse electrode (Third obverse electrode)
14: Obverse electrode (Fourth obverse electrode)
15: Reverse electrode
16: Obverse electrode (Fifth obverse electrode)
21: Base 22: Obverse bonding layer
23: Reverse bonding layer 31: Insulating layer
32: First metal layer 32A: First portion
32B: Second portion 33: Second metal layer
41: Input terminal (First input terminal)
42: Input terminal (Second input terminal)
43: Input terminal (Third input terminal)
44: Output terminal 45: Control terminal
46A, 46B, 46C, 46D, 46E: First control terminal
47A, 47B, 47C, 47D: Second control terminal
51: Insulating layer 52: First metal layer
53: Second metal layer 59: Bonding material
61: First conductive member 61h: Opening
62: Second conductive member 62A: First portion
62B: Second portion 63: Opening
69: Conductive bonding material
71: First conductive bonding material
72: Second conductive bonding material
81: Resin obverse surface 82: Resin reverse surface
86: Resin void portion 87: Resin part
88: Resin fill portion 90: Capacitor body
91: Mold 101: Element obverse surface
102: Element reverse surface
171, 172, 173, 174, 181, 182, 183, 184: Corner
191: First side 192: Second side
193: Third side 194: Fourth side
201: Obverse surface 201a: Recess
201b: Recess end edge 202: Reverse surface
301: Support surface 302: Bottom surface
321: First bonding layer 411: Input-side bond surface
412: Input-side side surface 413: End surface
414: Side surface 421: Input-side bond surface
422: Input-side side surface 423: End surface
424: Side surface 431: Input-side bond surface
432: Input-side side surface 433: End surface
434: Side surface 441: Output-side bond surface
442: Output-side side surface 443: End surface
444: Side surface 451: Holder
452: Metal pin 459: Conductive bonding material
521: First portion 522: Second portion
523: Third portion 524: Fourth portion
525: Fifth portion 601: First portion
621: First wiring portion 622: Second wiring portion
623: Third wiring portion 623a: Dented region
623h: Opening 624: Fourth wiring portion
625: First strip portion 625a: Raised region
625h: Opening 626: Second strip portion 627: First edge 628: Second edge
711: First base layer 712: First layer
713: Second layer 721: Second base layer
722: Third layer 723: Fourth layer
731, 732, 733, 734, 735: Wire
731a: First wire 731b: Second wire
831: Resin side surface 832: Resin side surface
832a: Recess 833: Resin side surface
834: Resin side surface 851: First protrusion
851a: First-protrusion end surface 851b: Recess
851c: Inner wall surface 852: Second protrusion
861: Resin void portion end edge 901: First surface
902: Second surface 903: Third surface
904: Fourth surface 905: Fifth surface
906: Sixth surface
911, 912, 913: First busbar
921, 922, 923: Second busbar
931, 932, 933: Third busbar
941, 942, 943: Fourth busbar
951, 952, 953: Fifth busbar
961, 962, 963: Sixth busbar
Cp, Cp1, Cp2, Cp3: Intersection
D1: Diode function section D2: Diode
L1: Auxiliary line
OL1, OL2, OL3, OL4, OL5, OL6: Center line
Oz: Center point Q1: Switching function section
α1: First angle α2: Second angle

The invention claimed is:

1. A power conversion device comprising:
a first semiconductor module, a second semiconductor module, and a third semiconductor module each including a semiconductor element having a switching function and an input terminal; and
a capacitor module connected to the input terminals of the first semiconductor module, the second semiconductor module and the third semiconductor module, wherein
the capacitor module includes a capacitor body, and a first busbar, a second busbar and a third busbar protruding from the capacitor body,
the input terminal of the first semiconductor module is connected to the first busbar,
the input terminal of the second semiconductor module is connected to the second busbar,
the input terminal of the third semiconductor module is connected to the third busbar,
as viewed in an axial direction of a cylindrical coordinate system about a central axis intersecting the capacitor body, a first center line of the first semiconductor module, a second center line of the second semiconductor module, and a third center line of the third semiconductor module intersect the capacitor body,
a first angle formed by the first center line and the second center line and a second angle formed by the second center line and the third center line are equal to each other, and
lengths of the first busbar, the second busbar and the third busbar are equal to each other.

2. The power conversion device according to claim 1, wherein the first center line, the second center line and the third center line are parallel to a radial direction of the cylindrical coordinate system.

3. The power conversion device according to claim 2, wherein the input terminal of the first semiconductor module extends along the first center line,
the input terminal of the second semiconductor module extends along the second center line, and the input terminal of the third semiconductor module extends along the third center line.

4. The power conversion device according to claim 2, wherein the first center line, the second center line and the third center line intersect with each other at an intersection inside the capacitor body as viewed in the axial direction.

5. The power conversion device according to claim 4, wherein the intersection overlaps with a center point of the capacitor body as viewed in the axial direction.

6. The power conversion device according to claim 2, wherein the capacitor body includes a first surface which is orthogonal to the first center line and from which the first busbar protrudes, a second surface which is orthogonal to the second center line and from which the second busbar protrudes, and a third surface which is orthogonal to the third center line and from which the third busbar protrudes.

7. The power conversion device according to claim 2, wherein each of the first semiconductor module, the second semiconductor module and the third semiconductor module includes a first input terminal, a second input terminal and a third input terminal protruding toward a same side in the radial direction and arranged along a circumferential direction of the cylindrical coordinate system as viewed in the axial direction, the second input terminal and the third input terminal are disposed on one side and on another side in the circumferential direction across the first input terminal, the first input terminal is one of positive and negative poles, and the second input terminal is another one of positive and negative poles.

8. The power conversion device according to claim 2, wherein each of the first semiconductor module, the second semiconductor module and the third semiconductor module includes an output terminal protruding toward an opposite side from the input terminal.

9. The power conversion device according to claim 2, configured as an inverter that combines the switching functions of the first semiconductor module, the second semiconductor module and the third semiconductor module.

10. The power conversion device according to claim 2, wherein the first angle and the second angle are 45°.

11. The power conversion device according to claim 2, wherein the first angle and the second angle are 90°.

12. The power conversion device according to claim 2, further comprising a fourth semiconductor module, a fifth semiconductor module and a sixth semiconductor module each including a semiconductor element having a switching function and an input terminal, wherein the capacitor module includes a fourth busbar, a fifth busbar and a sixth busbar protruding from the capacitor body, the input terminal of the fourth semiconductor module is connected to the fourth busbar, the input terminal of the fifth semiconductor module is connected to the fifth busbar, the input terminal of the sixth semiconductor module is connected to the sixth busbar, as viewed in the axial direction, a fourth center line of the fourth semiconductor module, a fifth center line of the fifth semiconductor module, and a sixth center line of the sixth semiconductor module intersect the capacitor body, a third angle formed by the third center line and the fourth center line, a fourth angle formed by the fourth center line and the fifth center line, and a fifth angle formed by the fifth center line and the sixth center line are equal to the first angle and the second angle, and lengths of the first busbar, the second busbar, the third busbar, the fourth busbar, the fifth busbar and the sixth busbar are equal to each other.

13. The power conversion device according to claim 12, wherein the first center line, the second center line, the third center line, the fourth center line, the fifth center line and the sixth center line intersect with each other at an intersection inside the capacitor body as viewed in the axial direction.

14. The power conversion device according to claim 13, wherein the intersection overlaps with the center point of the capacitor body as viewed in the axial direction.

15. The power conversion device according to claim 14, wherein the first angle, the second angle are, the third angle, the fourth angle and the fifth angle are 45°.

16. The power conversion device according to claim 12, wherein each of the fourth semiconductor module, the fifth semiconductor module and the sixth semiconductor module includes a first input terminal, a second input terminal and a third input terminal protruding toward a same side in the radial direction and arranged along a circumferential direction of the cylindrical coordinate system as viewed in the axial direction, the second input terminal and the third input terminal are disposed on one side and on another side in the circumferential direction across the first input terminal, the first input terminal is one of positive and negative poles, and the second input terminal is another one of positive and negative poles.

17. The power conversion device according to claim 12, configured as an inverter that combines the switching functions of the fourth semiconductor module, the fifth semiconductor module and the sixth semiconductor module.

* * * * *